(12) United States Patent
Maegawa et al.

(10) Patent No.: US 7,112,854 B1
(45) Date of Patent: *Sep. 26, 2006

(54) THIN-FILM TRANSISTOR AND METHOD OF FABRICATING THE SAME

(75) Inventors: Shigeto Maegawa, Tokyo (JP); Takashi Ipposhi, Tokyo (JP); Toshiaki Iwamatsu, Tokyo (JP); Shigenobu Maeda, Tokyo (JP); Il-Jung Kim, Tokyo (JP); Kazuhito Tsutsumi, Tokyo (JP); Hirotada Kuriyama, Tokyo (JP); Yoshiyuki Ishigaki, Tokyo (JP); Motomu Ukita, Tokyo (JP); Toshiaki Tsutsumi, Tokyo (JP)

(73) Assignee: Renesas Technology Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1277 days.

(21) Appl. No.: 08/850,631

(22) Filed: May 2, 1997

(30) Foreign Application Priority Data

Nov. 18, 1996 (JP) ............................................ 8-306626

(51) Int. Cl.
*H01L 29/78* (2006.01)

(52) U.S. Cl. ........................................ 257/382; 257/755
(58) Field of Classification Search .................... 257/66, 257/67, 369, 351, 903, 756, 755, 751, 740, 257/750, 913, 754

See application file for complete search history.

(56) References Cited

U.S. PATENT DOCUMENTS

| | | | | |
|---|---|---|---|---|
| 4,897,704 A | * | 1/1990 | Sakurai | 257/756 |
| 5,245,210 A | * | 9/1993 | Nishigoori | 257/382 |

(Continued)

FOREIGN PATENT DOCUMENTS

| | | | | |
|---|---|---|---|---|
| JP | 2-270335 | | 11/1990 | 257/67 |
| JP | 4-370956 | | 12/1992 | 257/67 |
| JP | 5-251667 | * | 9/1993 | 257/903 |
| JP | 5-283650 | * | 10/1993 | 257/903 |
| JP | 5-315571 | | 11/1993 | 257/67 |
| JP | 7-176743 | | 7/1995 | 257/67 |

OTHER PUBLICATIONS

T.F. McNelly, et al. "High Performance 0.25 μm SRAM Technology with Tungsten Interpoly Plug", IEDM '95 Technical Digest, 1995, pp. 927–930.

*Primary Examiner*—Phat X. Cao
*Assistant Examiner*—Theresa T. Doan
(74) *Attorney, Agent, or Firm*—Oblon, Spivak, McClelland, Maier & Neustadt, P.C.

(57) ABSTRACT

Provided are a thin-film transistor formed by connecting polysilicon layers having different conductivity types with each other which prevents occurrence of inconvenience resulting from diffusion of impurities and a method of fabricating the same. A drain (6), a channel (7) and a source (8) are integrally formed on a surface of a second oxide film (4) by polysilicon. The drain (6) is formed to be connected with a pad layer (3) (second polycrystalline semiconductor layer) through a contact hole (5) which is formed to reach an upper surface of the pad layer (3). The pad layer (3) positioned on a bottom portion of the contact hole (5) (opening) is provided with a boron implantation region BR.

8 Claims, 37 Drawing Sheets

U.S. PATENT DOCUMENTS

| | | | |
|---|---|---|---|
| 5,381,040 A | * | 1/1995 | Sun et al. .................... 257/774 |
| 5,382,807 A | | 1/1995 | Tsutsumi et al. ............. 257/69 |
| 5,438,537 A | * | 8/1995 | Sasaki ......................... 257/66 |
| 5,453,952 A | * | 9/1995 | Okudaira et al. ...... 365/189.01 |
| 5,475,240 A | | 12/1995 | Sakamoto .................... 257/67 |
| 5,526,304 A | | 6/1996 | Kawamura ................. 365/154 |
| 5,536,951 A | | 7/1996 | Muragishi .................... 257/69 |
| 5,541,455 A | | 7/1996 | Hodges ........................ 257/67 |
| 5,548,153 A | * | 8/1996 | Muragishi .................... 257/66 |
| 5,581,093 A | * | 12/1996 | Sakamoto .................... 257/67 |
| 5,717,251 A | * | 2/1998 | Hayashi et al. ............. 257/758 |
| 5,818,090 A | * | 10/1998 | Kimura ........................ 257/67 |
| 5,831,285 A | * | 11/1998 | Takeuchi et al. .............. 257/67 |
| 5,831,897 A | * | 11/1998 | Hodges ....................... 257/67 |
| 5,841,199 A | * | 11/1998 | Yang .......................... 257/903 |
| 5,844,256 A | * | 12/1998 | Higashino ................... 257/66 |
| 5,874,770 A | * | 2/1999 | Saia et al. ................... 257/536 |

* cited by examiner

PHOSPHORUS CONCENTRATION IN PLUG
($\times 10^{20}/cm^3$)

THIN-FILM TRANSISTOR AND METHOD OF FABRICATING THE SAME

BACKGROUND OF THE INVENTION

1. Field of the Invention

The present invention relates to a thin-film transistor and a method of fabricating the same, and more particularly, it relates to a thin-film transistor preventing inconvenience resulting from impurity diffusion and a method of fabricating the same.

2. Description of the Background Art

With reference to FIG. 68, the structure of a conventional thin-film transistor (hereinafter referred to as TFT) 90 is described.

FIG. 68 illustrates a sectional structure of the TFT 90. Referring to FIG. 68, a first oxide film 2 is formed on a silicon substrate 1, and a pad layer 3 of polysilicon is selectively formed on the first oxide film 2. Further, a second oxide film 4 is formed to cover the first oxide film 2 and the pad layer 3.

A TFT main part 11 is formed on the second oxide film 4. The TFT main part 11 is formed by a drain 6, a channel 7, a source 8, a gate oxide film 9 which is formed on the channel 7, and a gate 10 which is formed thereon.

The drain 6, the channel 7 and the source 8 are integrally formed on a surface of the second oxide film 4 by polysilicon. The drain 6 is formed to be connected with the pad layer 3 through a contact hole 5 which is formed to reach an upper surface of the pad layer 3.

The pad layer 3, which is employed for electrically connecting the TFT 90 with another device such as a resistor or a transistor, is connected with this device (not shown).

With reference to FIGS. 69 to 73, a method of fabricating the TFT 90 is now described. The following description is made on the assumption that the TFT 90 is a P-channel TFT.

First, the first oxide film 2 is formed on the silicon substrate 1 by CVD or thermal oxidation. Then, a polysilicon film is formed on the first oxide film 2 by CVD. At this time, a phosphorus-added polysilicon film is formed by making deposition while adding phosphorus into CVD gas.

Then, the phosphorus-added polysilicon film is worked into a prescribed pattern by photolithography and etching (lithography), thereby forming the pad layer 3 as shown in FIG. 69.

Then, the second oxide film 4 is formed on the first oxide film 2 and the pad layer 3 by CVD and the contact hole 5 reaching the surface of the pad layer 3 is formed in a prescribed position by lithography, in the step shown in FIG. 70.

Then, a polysilicon film is deposited by CVD with no addition of an impurity and worked into a prescribed pattern by lithography, thereby forming a TFT layer 60 in the step shown in FIG. 71. The TFT layer 60 is adapted to define the drain 6, the channel 7 and the source 8 in a later step.

Then, an oxide film and a polysilicon film are successively deposited on the TFT layer 60 and the second oxide film 4 by CVD. At this time, a phosphorus-added polysilicon film is formed by making deposition while adding phosphorus into CVD gas.

These films are worked into prescribed patterns by lithography through a resist pattern 12 which is formed on a prescribed position, thereby forming the gate 10 and the gate oxide film 9 provided under the same as shown in FIG. 72.

Then, boron is implanted into the overall surface by ion implantation while leaving the resist pattern 12 in the step shown in FIG. 73, for converting a portion of the TFT layer 60 shown in FIG. 72 not covered with the resist pattern 12 into a P-type polysilicon film, thereby forming the P-type source 8 and the P-type drain 6 through the channel 7. Then, the resist pattern 12 is removed thereby obtaining the TFT 90 shown in FIG. 68.

The distance between the boundary between the channel 7 and the drain 6 and a peripheral edge of the contact hole 5 is referred to as a contact distance L, which is reduced when the TFT 90 is further refined and integrated.

As hereinabove described, the pad layer 3 is made of N-type polysilicon containing phosphorus as an impurity in the TFT 90 shown in FIG. 68. On the other hand, the source 8 and the drain 6 are made of P-type polysilicon containing boron as an impurity, while the drain 6 is directly connected to the pad layer 3.

Therefore, due to heat treatment in a later fabrication step such as that in a reflow step of forming a flattened film, for example, phosphorus contained in the pad layer 3 may be diffused to infiltrate into the drain 6. FIG. 74 typically illustrates the state of such phosphorus diffusion. Referring to FIG. 74, phosphorus diffused from the pad layer 3 is spread in the drain 6 along arrow.

Inconvenience resulting from such diffusion of phosphorus in the drain 6 is now described. FIG. 75 shows impurity distributions in the drain 6 and the pad layer 3.

Referring to FIG. 75, the axis of abscissas shows positions in the drain 6 and the pad layer 3, and the axis of ordinates shows the impurity concentrations. Referring to FIG. 75, symbol BP denotes the junction between the pad layer 3 and the drain 6, i.e., the surface position of the pad layer 3. The left and right sides of the junction BP show the states in the drain 6 and the pad layer 3 respectively.

Referring to FIG. 75, the distribution state of phosphorus before heat treatment is shown by a thick line as a distribution chart Q. On the hand, the distribution state of phosphorus after the heat treatment is shown as a distribution chart R. Further, the distribution state of boron after the heat treatment is shown as a distribution chart S. As understood from the distribution chart Q, phosphorus, which is present only in the pad layer 3 before the heat treatment, is diffused in the drain 6 due to the heat treatment. When the concentration of diffused phosphorus is higher than that of boron, phosphorus cancels the action of boron in the drain 6, i.e., compensates boron, to convert the drain 6 to an N type in a constant area from the junction BP.

No problem arises if the distance (hereinafter referred to as interboundary distance) between the junction BP and the boundary between the channel 7 and the drain 6 is sufficiently longer than the length of the constant area which is converted to an N type. However, the contact distance L tends to be shortened following refinement and integration of the TFT 90 as described above, and hence the interboundary distance is also reduced.

When the interboundary distance is below the length of the aforementioned constant area, i.e., if the concentration of diffused phosphorus is higher than that of boron and the phosphorus diffusion area exceeds the boron diffusion area, the overall drain 6 of the TFT 90 is disadvantageously converted to an N type.

In this case, the TFT 90 forms not a PNP transistor but a PNN diode. FIG. 76 shows the operating characteristics of the TFT 90. Referring to FIG. 76, characteristic curves T and U show the operation characteristics of a normal TFT 90 and a TFT forming a diode due to conversion of the drain 6 to an N type. Referring to FIG. 76, the right and left sides of the origin on the axis of abscissas show negative and positive gate voltages, while the upper side of the origin on the axis of ordinates shows negative drain currents.

As shown in FIG. 76, a drain current hardly flows and a leakage current is small while the gate is supplied with a positive voltage if the TFT 90 is normal. If the TFT 90 forms a diode, however, the drain current cannot be cut off and an abnormal leakage current flows even if the gate is supplied with a positive voltage.

While this problem can be solved by preparing the pad layer 3 from P-type polysilicon, this pad layer 3 may have to be of an N type depending on the other device connected with the TFT 90. In an SRAM or the like, for example, this pad layer 3 may be connected to an N-type diffusion layer on the silicon substrate 1, and an unintended parasitic P-N junction (i.e., a diode) is formed across the pad layer 3 (P-type polysilicon) and the N-type diffusion layer (single-crystalline silicon) if the pad layer 3 is of a P type.

Rectification characteristics of this diode are relatively remarkable, and electric resistance in reverse bias extremely damages the circuit characteristics. On the other hand, rectification characteristics of the parasitic P-N junction formed on the junction between polysilicon layers such as the drain 6 and the pad layer 3 of the TFT 90, i.e., a diode, are dull and electric resistance in reverse bias is small.

The characteristics of a diode formed between polysilicon layers become dull due to a number of crystal defects which are present in polysilicon. Namely, the crystal defects form levels in a band gap and electrons and holes contained in the crystal defects flow in positive and negative directions in reverse bias of the parasitic P-N junction, to generate a number of currents (generation currents).

When the pad layer 3 is made of P-type polysilicon, the P-type impurity contained in the pad layer 3 infiltrates into the N-type diffusion layer on the silicon substrate 1, to reach the silicon substrate 1 and cause a short-circuit state, as the case may be.

SUMMARY OF THE INVENTION

According to a first aspect of the present invention, a thin-film transistor comprises a first conductivity type first polycrystalline semiconductor layer which is one of source and drain layers formed on an insulating film and defining a channel layer, a second conductivity type second polycrystalline semiconductor layer which is formed in the insulating film to be electrically connected with the first polycrystalline semiconductor layer, and a conductivity type alteration preventing structure for preventing alteration of the conductivity type from the second polycrystalline semiconductor layer into the first polycrystalline semiconductor layer resulting from infiltration of a second conductivity type impurity.

According to a second aspect of the present invention, the first and second polycrystalline semiconductor layers are directly connected with each other through an opening which is formed in the insulating film, and the conductivity type alteration preventing structure is a first conductivity type semiconductor region formed by implanting ions of a first conductivity type impurity into a portion of the second polycrystalline semiconductor layer which is connected with the first polycrystalline semiconductor layer through the opening in advance of formation of the first polycrystalline semiconductor layer.

According to a third aspect of the present invention, the first and second polycrystalline semiconductor layers are directly connected with each other through an opening which is formed in the insulating film, and the conductivity type alteration preventing structure is the first polycrystalline semiconductor layer getting an impurity concentration which is larger than that of the second polycrystalline semiconductor layer by excess implantation of ions of a first conductivity type impurity.

According to a fourth aspect of the present invention, the first and second polycrystalline semiconductor layers are directly connected with each other through an opening which is formed in the insulating film, and the conductivity type alteration preventing structure is the first polycrystalline semiconductor layer containing nitrogen which is introduced thereinto.

According to a fifth aspect of the present invention, the first and second polycrystalline semiconductor layers are directly connected with each other through an opening which is formed in the insulating film, and the conductivity type alteration preventing structure is a first conductivity type third polycrystalline semiconductor layer which is formed on the second polycrystalline semiconductor layer in advance of the insulating film.

According to a sixth aspect of the present invention, the first and second polycrystalline semiconductor layers are directly connected with each other through an opening which is formed in the insulating film, the first polycrystalline semiconductor layer comprises an offset part having a lower impurity concentration than the remaining parts in the vicinity of a connecting part with the channel layer, and the conductivity type alteration preventing structure is the offset part whose impurity concentration becomes $1 \times 10^{18}$ to $50 \times 10^{18}$ cm$^{-3}$ by implantation of ions of a first conductivity type impurity.

According to a seventh aspect of the present invention, the first and second polycrystalline semiconductor layers are electrically connected with each other through an at least partially first conductivity type third polycrystalline semiconductor layer which is buried in an opening formed through the first polycrystalline semiconductor layer and the insulating film, and the conductivity type alteration preventing structure is the third polycrystalline semiconductor layer getting an impurity concentration which is higher than that of the second polycrystalline semiconductor layer by excess implantation of ions of a first conductivity type impurity.

According to an eighth aspect of the present invention, a structure up to a stage before the excess implantation of the ions of the first conductivity type impurity is formed in the same step as a gate layer which is provided on the channel layer through a gate insulating film, in the third polycrystalline semiconductor layer.

According to a ninth aspect of the present invention, a second conductivity type fourth polycrystalline semiconductor layer is buried in the opening, and thereafter ions of the first conductivity type impurity are implanted at least up to a prescribed depth under the first polycrystalline semiconductor layer, so that the third polycrystalline semiconductor layer is of the first conductivity type up to the prescribed depth and of a second conductivity type in the remaining portion.

According to a tenth aspect of the present invention, the first and second polycrystalline semiconductor layers are electrically connected with each other through a second conductivity type fourth polycrystalline semiconductor layer and a first conductivity type third polycrystalline semiconductor layer which are successively buried in an opening formed through the first polycrystalline semiconductor layer and the insulating film from the side of the second polycrystalline semiconductor layer, and the conductivity type alteration preventing structure is the third polycrystalline semiconductor layer getting an impurity concentration which is higher than that of the second polycrystalline semiconductor layer by excess implantation of ions of a first conductivity type impurity.

According to an eleventh aspect of the present invention, the opening comprises a lower opening for burying the fourth polycrystalline semiconductor layer therein, and an upper opening for burying the third polycrystalline semiconductor layer therein, and the upper and lower openings are formed through different steps.

According to a twelfth aspect of the present invention, the upper opening is formed to deviate in a direction separating from the first polycrystalline semiconductor layer.

According to a thirteenth aspect of the present invention, the first and second polycrystalline semiconductor layers are electrically connected with each other through a second conductivity type third polycrystalline semiconductor layer which is buried in an opening formed through the first polycrystalline semiconductor layer and the insulating film, and the conductivity type alteration preventing structure is a first conductivity type fourth polycrystalline semiconductor layer which is formed between the third polycrystalline semiconductor layer and an inner wall of the opening.

According to a fourteenth aspect of the present invention, the first and second polycrystalline semiconductor layers are electrically connected with each other through a second conductivity type third polycrystalline semiconductor layer which is buried in an opening formed through the first polycrystalline semiconductor layer and the insulating film, and the conductivity type alteration preventing structure is a first conductivity type semiconductor region which is formed by obliquely implanting ions of a first conductivity type impurity into a surface of the first polycrystalline semiconductor layer exposed in the opening.

According to a fifteenth aspect of the present invention a thin-film transistor comprises a first conductivity type first polycrystalline layer which is one of source and drain layers formed on an insulating film and defining a channel layer, and a second conductivity type second polycrystalline semiconductor layer which is formed in the insulating film to be electrically connected with the first polycrystalline semiconductor layer, for preventing alteration of the conductivity type from the second polycrystalline semiconductor layer into the first polycrystalline semiconductor layer resulting from infiltration of a second conductivity type impurity by substantially extending an interboundary distance between a surface of the second polycrystalline semiconductor layer and a boundary between the channel layer and the first polycrystalline semiconductor layer.

According to a sixteenth aspect of the present invention, the first and second polycrystalline semiconductor layers are electrically connected with each other through an at least partially first conductivity type third polycrystalline semiconductor layer which is buried in an opening formed through the first polycrystalline semiconductor layer and the insulating film, and the interboundary distance is substantially extended by forming an irregular part on the insulating film and increasing the formation length of the first polycrystalline semiconductor layer.

According to a seventeenth aspect of the present invention, the first polycrystalline layer is formed on a side which is opposite to that provided with the second polycrystalline semiconductor layer across the channel layer, the thin-film transistor further comprises a first conductivity type third polycrystalline semiconductor layer which is formed in the insulating film to extend over a lower portion of the first polycrystalline semiconductor layer and an upper portion of the second polycrystalline semiconductor layer, and the interboundary distance is substantially extended by connecting the first and second polycrystalline semiconductor layers with each other through the third polycrystalline semiconductor layer.

According to an eighteenth aspect of the present invention, the first polycrystalline layer is formed on a side which is opposite to that provided with the second polycrystalline semiconductor layer across the channel layer, the thin-film transistor further comprises a first conductivity type third polycrystalline layer extending over upper portions of the first and second polycrystalline semiconductor layers through a second insulating film, and the interboundary distance is substantially extended by connecting the first and second polycrystalline semiconductor layers with each other through the third polycrystalline semiconductor layer.

According to a nineteenth aspect of the present invention, the first and second polycrystalline semiconductor layers are directly connected with each other through an opening which is formed through the insulating film and an impurity-added oxide film which is formed on an intermediate portion of the insulating film, and the opening is so formed that its opening dimension is larger in the impurity-added oxide film portion than the remaining portions to present an irregular contour shape in section, for substantially extending the interboundary distance.

According to a twentieth aspect of the present invention, a thin-film transistor includes a first conductivity type first polycrystalline semiconductor layer which is one of source and drain layers formed on an insulating film and defining a channel layer, a second conductivity type second polycrystalline semiconductor layer which is formed in the insulating film to be electrically connected with the first polycrystalline semiconductor layer, and an impurity infiltration preventing structure for preventing infiltration of a second conductivity type impurity from the second polycrystalline semiconductor layer into the first polycrystalline semiconductor layer.

According to a twenty-first aspect of the present invention, the impurity infiltration preventing structure is a sink layer for absorbing the second conductivity type impurity, and the sink layer is a tungsten silicide layer which is formed on the second polycrystalline semiconductor layer.

According to a twenty-second aspect of the present invention, the thin-film transistor further comprises a second conductivity type third polycrystalline semiconductor layer which is formed on the tungsten silicide layer.

According to a twenty-third aspect of the present invention, the thin-film transistor further comprises a first conductivity type third polycrystalline semiconductor layer which is formed on the tungsten silicide layer.

According to a twenty-fourth aspect of the present invention, the impurity infiltration preventing structure is an infiltration inhibition layer for inhibiting infiltration of the second conductivity type impurity, and the infiltration inhibition layer is a silicon nitride film having a thickness of 1 to 10 nm or a silicon oxide film having a thickness of 0.5 to 5 nm which is formed at least on the second polycrystalline semiconductor layer.

According to a twenty-fifth aspect of the present invention, the first and second polycrystalline semiconductor layers are electrically connected with each other through a first conductivity type third polycrystalline semiconductor layer which is buried in an opening formed through the first polycrystalline semiconductor layer and the insulating film, and the infiltration inhibition layer is formed on an inner wall of the opening and a surface of the second polycrystalline semiconductor layer which is exposed on a bottom portion of the opening.

According to a twenty-sixth aspect of the present invention, the thin-film transistor further comprises a first conductivity type fourth polycrystalline semiconductor layer which is formed on the infiltration inhibition layer.

According to a twenty-seventh aspect of the present invention, the thin-film transistor further includes a second tungsten silicon layer containing the first conductivity type impurity which is formed between the infiltration inhibition layer and the first tungsten silicon layer.

According to a twenty-eighth aspect of the present invention, the impurity infiltration preventing structure is an infiltration inhibition layer for inhibiting infiltration of the second conductivity type impurity, and the infiltration inhibition layer is a titanium nitride film which is formed at least on the second polycrystalline semiconductor layer.

According to a twenty-ninth aspect of the present invention, the first and second polycrystalline semiconductor layers are electrically connected with each other through a metal layer which is buried in an opening formed through the first polycrystalline semiconductor layer and the insulating film, and the titanium nitride film is formed on an inner wall of the opening and a surface of the second polycrystalline semiconductor layer which is exposed on a bottom portion of the opening.

According to a thirtieth aspect of the present invention, the impurity infiltration preventing structure is an infiltration inhibition layer for inhibiting infiltration of the second conductivity type impurity, and the infiltration inhibition layer is a titanium silicide film having a surface of a TiSiN alloy layer which is formed at least on the second polycrystalline semiconductor layer.

According to a thirty-first aspect of the present invention, the first and second polycrystalline semiconductor layers are electrically connected with each other through a first conductivity type third polycrystalline semiconductor layer which is buried in an opening formed through the first polycrystalline semiconductor layer and the insulating film, and the titanium silicide film having a surface of a TiSiN alloy layer is formed on a surface of the first polycrystalline semiconductor layer which is exposed in the opening and a surface of the second polycrystalline semiconductor layer which is exposed on a bottom portion of the opening.

According to a thirty-second aspect of the present invention, the first and second polycrystalline semiconductor layers are electrically connected with each other through a first conductivity type third polycrystalline semiconductor layer which is buried in an opening formed through the first polycrystalline semiconductor layer and the insulating film, the thin-film transistor includes the titanium silicide film which is formed on the second polycrystalline semiconductor layer, and the titanium silicide film having a surface of a TiSiN alloy layer is formed on a surface of a titanium silicide layer which is exposed on a bottom portion of the opening.

According to a thirty-third aspect of the present invention, the first and second polycrystalline semiconductor layers are electrically connected with each other through a second conductivity type third polycrystalline semiconductor layer which is buried in an opening formed through the first polycrystalline semiconductor layer and the insulating film, and the conductivity type alteration preventing structure is the third polycrystalline semiconductor layer containing nitrogen which is introduced thereinto.

According to a thirty-fourth aspect of the present invention, a method of fabricating a thin-film transistor including a first conductivity type first polycrystalline semiconductor layer which is one of source and drain layers formed on an insulating film and defining a channel layer, and a second conductivity type second polycrystalline semiconductor layer which is formed in the insulating film to be electrically connected with the first polycrystalline semiconductor layer comprises the steps of (a) forming an opening reaching a surface of the second polycrystalline semiconductor layer through the first and second polycrystalline semiconductor layer and the insulating film, (b) forming a titanium film at least on a wall surface and a bottom surface of the opening by sputtering, (c) silicifying a surface of the first polycrystalline semiconductor layer which is exposed in the opening and a surface of the second polycrystalline semiconductor layer which is exposed on the bottom portion of the opening by lamp annealing thereby silicifying the titanium film, (d) removing an unsilicified part of the titanium film by aqueous ammonia, and (e) converting the silicified titanium film to a titanium silicide film having a surface of a TiSiN alloy layer by annealing the same in an ammonia atmosphere.

According to a thirty-fifth aspect of the present invention, a method of fabricating a thin-film transistor including a first conductivity type first polycrystalline semiconductor layer which is one of source and drain layers formed on an insulating film and defining a channel layer, and a second conductivity type second polycrystalline semiconductor layer which is formed in the insulating film to be electrically connected with the first polycrystalline semiconductor layer includes the steps of (a) forming a titanium silicide layer on the second polycrystalline semiconductor layer, (b) forming an opening reaching a surface of the second polycrystalline semiconductor layer through the titanium silicide layer, and (c) converting the titanium silicide film which is exposed on a bottom portion of the opening to a titanium silicide film having a surface of a TiSiN alloy layer by annealing the same in an ammonia atmosphere.

In the thin-film transistor according to the first aspect of the present invention, alteration of the conductivity type from the second polycrystalline semiconductor layer into the first polycrystalline semiconductor layer resulting from infiltration of the second conductivity type impurity is prevented, whereby the transistor is prevented from forming a diode. Thus, it is possible to obtain a thin-film transistor preventing such inconvenience that a drain current cannot be cut off but an abnormal leakage current flows.

In the thin-film transistor according to the second aspect of the present invention, not only the second conductivity type impurity but the first conductivity type impurity infiltrates from the first conductivity type semiconductor region into the first polycrystalline semiconductor layer, whereby the first conductivity type impurity is prevented from undesirable compensation in the first polycrystalline semiconductor layer, and alteration of the conductivity type is prevented.

In the thin-film transistor according to the third aspect of the present invention, the first polycrystalline semiconductor layer has a higher impurity concentration than the second polycrystalline semiconductor layer, whereby the first conductivity type impurity is prevented from undesirable compensation even if the second conductivity type impurity infiltrates into the first polycrystalline semiconductor layer, and alteration of the conductivity type is prevented.

In the thin-film transistor according to the fourth aspect of the present invention, nitrogen is introduced into the first polycrystalline semiconductor layer for compensating crystal defects, whereby diffusion in the first polycrystalline semiconductor layer is suppressed even if the second conductivity type impurity infiltrates thereinto, and alteration of the conductivity type is prevented. Further, diffusion of the first conductivity type impurity in the first polycrystalline semiconductor layer is also suppressed, whereby the concentration can be maintained at a high level and alteration of the conductivity type can be prevented.

In the thin-film transistor according to the fifth aspect of the present invention, not only the second conductivity type impurity but the first conductivity type impurity infiltrates from the first conductivity type third polycrystalline semiconductor layer into the first polycrystalline semiconductor layer, whereby the first conductivity type impurity is prevented from undesirable compensation in the first polycrystalline semiconductor layer, and alteration of the conductivity type is prevented.

In the thin-film transistor according to the sixth aspect of the present invention, the offset part has an impurity concentration of $1 \times 10^{18}$ to $50 \times 10^{18}$ cm$^{-3}$, whereby alteration of the conductivity type of the first polycrystalline semiconductor layer can be prevented while satisfying conditions such as relaxation of an interelectrode electric field between the first polycrystalline semiconductor layer and a gate and reduction of a resistance value.

In the thin-film transistor according to the seventh aspect of the present invention, not only the second conductivity type impurity but the first conductivity type impurity infiltrates from the third polycrystalline semiconductor layer into the first polycrystalline semiconductor layer, whereby the first conductivity type impurity is prevented from undesirable compensation in the first polycrystalline semiconductor layer, and alteration of the conductivity type is prevented.

In the thin-film transistor according to the eighth aspect of the present invention, the ions of the first conductivity type impurity are implanted in excess after forming the third polycrystalline semiconductor layer in the same step as the gate layer, whereby fabrication steps can be simplified.

In the thin-film transistor according to the ninth aspect of the present invention, alteration of the conductivity type of the first polycrystalline semiconductor layer is prevented, while formation of an unintended parasitic P-N junction is prevented when a lower portion of the third polycrystalline semiconductor layer is connected not only with the second polycrystalline semiconductor layer but with a second conductivity type single-crystalline semiconductor layer.

In the thin-film transistor according to the tenth aspect of the present invention, not only the second conductivity type impurity but the first conductivity type impurity infiltrates from the third polycrystalline semiconductor layer into the first polycrystalline semiconductor layer, whereby the first conductivity type impurity is prevented from undesirable compensation in the first polycrystalline semiconductor layer, and alteration of the conductivity type is prevented. Further, formation of an unintended parasitic P-N junction is prevented when the fourth polycrystalline semiconductor layer is connected not only with the second polycrystalline semiconductor layer but with a second conductivity type single-crystalline semiconductor layer.

In the thin-film transistor according to the eleventh aspect of the present invention, the upper and lower openings are formed through different steps independently of each other, whereby the relative positions can be arbitrarily changed to cope with a structure which must change the position for forming either opening.

In the thin-film transistor according to the twelfth aspect of the present invention, the upper opening is formed to deviate in the direction separating from the first polycrystalline semiconductor layer, whereby the distance (interboundary distance) between the upper surface of the second polycrystalline semiconductor layer and the boundary between the channel layer and the first polycrystalline semiconductor layer is extended and an influence exerted by infiltration of the second conductivity type impurity can be reduced.

In the thin-film transistor according to the thirteenth aspect of the present invention, the first conductivity type impurity is prevented from compensation in the first polycrystalline semiconductor layer even if the first and second polycrystalline semiconductor layers are electrically connected with each other through the second conductivity type third polycrystalline semiconductor layer since the first conductivity type fourth polycrystalline semiconductor layer is formed between the third polycrystalline semiconductor layer and the inner wall of the opening and the first conductivity type impurity also infiltrates from the fourth polycrystalline semiconductor layer even if the second conductivity type impurity infiltrates from the third polycrystalline semiconductor layer, whereby alteration of the conductivity type is prevented.

In the thin-film transistor according to the fourteenth aspect of the present invention, the first conductivity type impurity is prevented from compensation in the first polycrystalline semiconductor layer even if the first and second polycrystalline semiconductor layers are electrically connected with each other through the second conductivity type third polycrystalline semiconductor layer since the first conductivity type semiconductor region is formed on the surface of the first polycrystalline semiconductor layer exposed in the opening and the first conductivity type impurity also infiltrates from the semiconductor region even if the second conductivity type impurity infiltrates from the third polycrystalline semiconductor layer, whereby alteration of the conductivity type is prevented.

In the thin-film transistor according to the fifteenth aspect of the present invention, the interboundary distance is substantially extended to prevent the first conductivity type impurity from entire compensation in the first polycrystalline semiconductor layer even if the second conductivity type impurity infiltrates, whereby alteration of the conductivity type is prevented.

In the thin-film transistor according to the sixteenth aspect of the present invention, a concrete structure for substantially extending the interboundary distance is provided.

In the thin-film transistor according to the seventeenth aspect of the present invention, the interboundary distance can be increased by the length of the third polycrystalline semiconductor layer.

In the thin-film transistor according to the eighteenth aspect of the present invention, the interboundary distance can be increased by the length of the third polycrystalline semiconductor layer. Further, the third polycrystalline semiconductor layer is formed on the upper portion of the first polycrystalline semiconductor layer, whereby fabrication steps can be simplified as compared with the case of forming the third polycrystalline semiconductor layer in the insulating film.

In the thin-film transistor according to the nineteenth aspect of the present invention, a concrete structure for substantially extending the interboundary distance is provided.

In the thin-film transistor according to the twentieth aspect of the present invention, the second conductivity type impurity is prevented from infiltrating from the second polycrystalline semiconductor layer into the first polycrystalline semiconductor layer, whereby the transistor is prevented from forming a diode. Thus, it is possible to obtain a thin-film transistor preventing such inconvenience that a drain current cannot be cut off but an abnormal leakage current flows.

In the thin-film transistor according to the twenty-first aspect of the present invention, the second conductivity type impurity is absorbed by the tungsten silicide film which is formed on the second polycrystalline semiconductor layer, whereby the second conductivity type impurity is prevented from infiltrating into the first polycrystalline semiconductor layer.

The thin-film transistor according to the twenty-second aspect of the present invention includes the second conductivity type third polycrystalline semiconductor layer on the tungsten silicide layer, whereby the tungsten silicide layer is held between the second and third polycrystalline semiconductor layers not to directly come into contact with the gate oxide film when also serving as a gate for a MOS transistor, for example, thereby solving a problem of reduction in withstand voltage of the gate oxide film resulting from stress or the like. Further, the first conductivity type impurity is prevented from being absorbed by the tungsten silicide layer.

The thin-film transistor according to the twenty-third aspect of the present invention includes the second conductivity type third polycrystalline semiconductor layer on the tungsten silicide layer, whereby the tungsten silicide layer is held between the second and third polycrystalline semiconductor layers not to directly come into contact with the gate oxide film when also serving as a gate for a MOS transistor, for example, thereby solving a problem of reduction in withstand voltage of the gate oxide film resulting from stress or the like. Further, the third polycrystalline semiconductor layer is of the first conductivity type, whereby influence exerted on the first polycrystalline semiconductor layer by impurity infiltration can be reduced.

In the thin-film transistor according to the twenty-fourth aspect of the present invention, the silicon nitride film having a thickness of 1 to 10 nm or the silicon oxide film having a thickness of 0.5 to 5 nm which is formed on at least the second polycrystalline semiconductor layer inhibits movement of the impurity although the same has electric conductivity, whereby the second conductivity type impurity is prevented from infiltrating into the first polycrystalline semiconductor layer.

In the thin-film transistor according to the twenty-fifth aspect of the present invention, the infiltration inhibition layer is formed on the inner wall of the opening and the surface of the second polycrystalline semiconductor layer exposed on the bottom portion of the opening, whereby the infiltration inhibition layer is interposed on the surface of the first polycrystalline semiconductor layer exposed in the opening and the surface of the second polycrystalline semiconductor layer exposed on the bottom portion of the opening, and the second conductivity type impurity is reliably prevented from infiltrating into the first polycrystalline semiconductor layer.

In the thin-film transistor according to the twenty-sixth aspect of the present invention, the fourth polycrystalline semiconductor layer can be formed in the same area as the second polycrystalline semiconductor layer, whereby the contact resistance therebetween can be reduced.

In the thin-film transistor according to the twenty-seventh aspect of the present invention, the first and second tungsten silicide layers contain the first conductivity type impurity, for absorbing the first conductivity type impurity from the first polycrystalline semiconductor layer and preventing reduction of the impurity concentration of the first polycrystalline semiconductor layer.

In the thin-film transistor according to the twenty-eighth aspect of the present invention, the titanium nitride film which is formed at least on the second polycrystalline semiconductor layer has a remarkable action for serving as a diffusion barrier against impurity atoms due to a dense structure, whereby infiltration of the second conductivity type impurity from the second polycrystalline semiconductor layer is reliably prevented.

In the thin-film transistor according to the twenty-ninth aspect of the present invention, the titanium nitride film is formed on the inner wall of the opening and the surface of the second polycrystalline semiconductor layer exposed on the bottom portion of the opening, whereby the titanium nitride film is interposed on the surface of the first polycrystalline semiconductor layer exposed in the opening and the surface of the second polycrystalline semiconductor layer exposed on the bottom portion of the opening, and the second conductivity type impurity is reliably prevented from infiltrating into the first polycrystalline semiconductor layer. Further, the titanium nitride film also serves as a barrier metal for preventing the metal layer which is buried in the opening from being diffused in the first and second polycrystalline semiconductor layers.

In the thin-film transistor according to the thirtieth aspect of the present invention, the titanium silicide film having a surface of a TiSiN alloy layer which is formed at least on the second polycrystalline semiconductor layer is a conductor having a property of transmitting no impurity, whereby infiltration of the second conductivity type impurity from the second polycrystalline semiconductor layer is reliably prevented.

In the thin-film transistor according to the thirty-first aspect of the present invention, the titanium silicide film having a surface of a TiSiN alloy layer is interposed on the surface of the first polycrystalline semiconductor layer exposed in the opening and the surface of the second polycrystalline semiconductor layer exposed on the bottom portion of the opening, whereby the second conductivity type impurity is reliably prevented from infiltrating into the first polycrystalline semiconductor layer.

In the thin-film transistor according to the thirty-second aspect of the present invention, the titanium silicide film having a surface of a TiSiN alloy layer is interposed on the titanium silicide layer exposed on the bottom portion of the opening, whereby the second conductivity type impurity is reliably prevented from infiltrating into the first polycrystalline semiconductor layer.

In the thin-film transistor according to the thirty-third aspect of the present invention, nitrogen is introduced into the third polycrystalline semiconductor layer for compensating crystal defects, whereby the second conductivity type impurity is suppressed from infiltrating from the third polycrystalline semiconductor layer or from the exterior into the third polycrystalline semiconductor layer, and alteration of the conductivity type of the first polycrystalline semiconductor layer is prevented.

In the method of fabricating a thin-film transistor according to the thirty-fourth aspect of the present invention, the titanium silicide film having a surface of a TiSiN alloy layer can be formed on the surface of the first polycrystalline semiconductor layer exposed in the opening and the surface of the second polycrystalline semiconductor layer exposed on the bottom portion of the opening.

In the method of fabricating a thin-film transistor according to the thirty-fifth aspect of the present invention, the titanium silicide film having a surface of a TiSiN alloy layer can be formed on the titanium silicide layer exposed on the bottom portion of the opening. Further, the fabrication steps can be simplified since no titanium silicide layer may be formed in the opening.

An object of the present invention is to provide a thin-film transistor preventing occurrence of inconvenience resulting film impurity diffusion and a method of fabricating the same, in relation to a thin-film transistor connecting polysilicon layers having different conductivity types with each other.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

<Embodiment 1>

Abnormality of electric characteristics of a TFT (thin-film transistor) is caused by compensation of boron in a P-type drain resulting from diffusion of phosphorus from an N-type pad layer, a conductivity alteration preventing structure may be provided so that boron is not compensated following infiltration of phosphorus, as one of methods for solving this problem.

A TFT having a structure of diffusing boron simultaneously with phosphorus as a conductivity type alteration preventing structure is now described.

<1-1. Device Structure>

Figure 1:
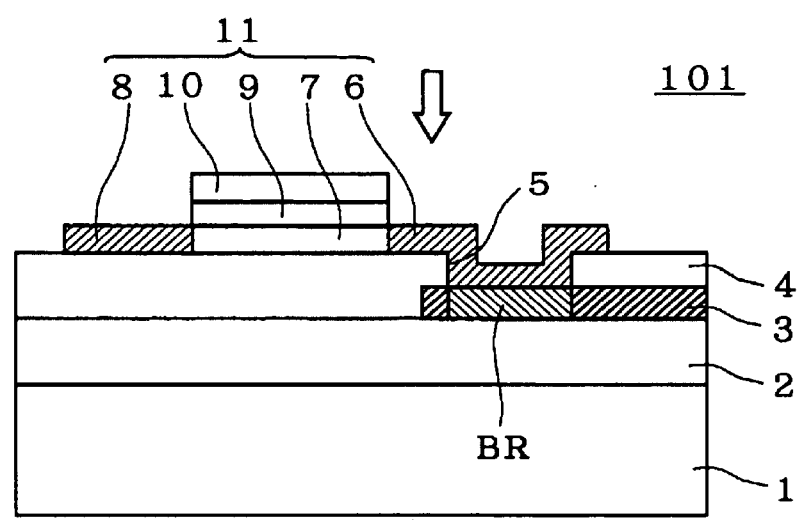
FIG. 1 is a sectional view for illustrating the structure of a semiconductor device according to an embodiment 1 of the present invention.
Figure 2:
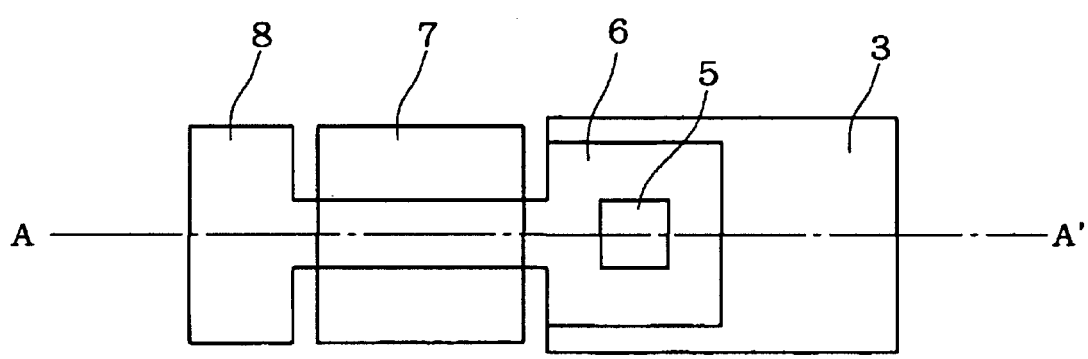
FIG. 2 is a plan view for illustrating the structure of a TFT.

With reference to FIGS. 1 and 2, the structure of a TFT 101 is described as an embodiment 1 of the present invention. While all TFTs are described as P-channel TFTs in the following description, the present invention is also applicable to an N-channel TFT, as a matter of course.

FIG. 1 illustrates a sectional structure of the TFT 101, and FIG. 2 is a plan view showing the structure of FIG. 1 as viewed along arrow. While FIG. 1 corresponds to a sectional view taken along the line A–A' in FIG. 2, FIG. 2 also shows a structure which cannot be originally visualized in solid lines, for directly showing the structure.

Referring to FIG. 1, a first oxide film 2 is formed on a silicon substrate 1, and a pad layer 3 of N-type polysilicon is selectively formed on the first oxide film 2. A second oxide film 4 is formed to cover the first oxide film 2 and the pad layer 3.

The first and second oxide films 2 and 4 can be generically referred to as an insulating film, and the pad layer 3 can be regarded as being formed in this insulating film. This also applies to the remaining embodiments described later.

A TFT main part 11 is formed on an upper portion of the second oxide film 4. The TFT main part 11 is formed by a drain 6 (first polycrystalline semiconductor layer), a channel 7, a source 8, a gate oxide film 9 which is formed on the channel 7, and a gate 10 which is formed thereon.

The drain 6, the channel 7 and the source 8 are integrally formed on a surface of the second oxide film 4 by polysilicon. The drain 6 is formed to be connected with the pad layer 3 through a contact hole 5 which is formed to reach an upper surface of the pad layer 3 (second polycrystalline semiconductor layer). A boron-implanted region BR is formed in a portion of the pad layer 3 positioned on the bottom portion of the contact hole 5 (opening).

As shown in FIG. 2, the contact hole 5 has a rectangular plan shape, while the drain 6 which is buried therein also has a rectangular plan shape.

<1-2. Characteristic Function/Effect>

As described above, the boron-implanted region BR is formed in the portion of the pad layer 3 positioned on the bottom portion of the contact hole 5 in the TFT 101, whereby the drain 6 is connected with the boron-implanted region BR. When heat treatment is performed in a later fabrication step, therefore, boron is also diffused simultaneously with phosphorus, whereby phosphorus and boron infiltrate into the drain 6 so that boron infiltrating from the pad layer 3 maintains the drain 6 in the P-type state even if phosphorus compensates boron in the drain 6, thereby preventing the drain 6 from being converted to an N type.

The boron concentration of the boron-implanted region BR provided in the pad layer 3 must be at about the total of the phosphorus concentration in the pad layer 3 and the boron concentration required in the drain 6.

<1-3. Fabrication Method>

A method of fabricating the TFT 101 is now described with reference to FIGS. 3 to 8. First, the first oxide film 2 is formed on the silicon substrate 1 by CVD or thermal oxidation. Then, a polysilicon film is formed on the first oxide film 2 by CVD. At this time, a phosphorus-added polysilicon film, i.e., an N-type polysilicon film, is formed by making deposition while adding phosphorus into CVD gas.

Figure 3:
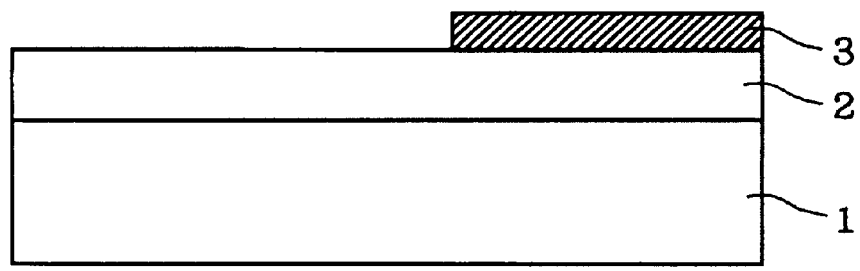
FIG. 3 illustrates a step of fabricating the semiconductor device according to the embodiment 1.

Then, this phosphorus-added polysilicon film is worked into a prescribed pattern by photolithography and etching (i.e., lithography), thereby forming the pad layer 3, as shown in FIG. 3.

Figure 4:
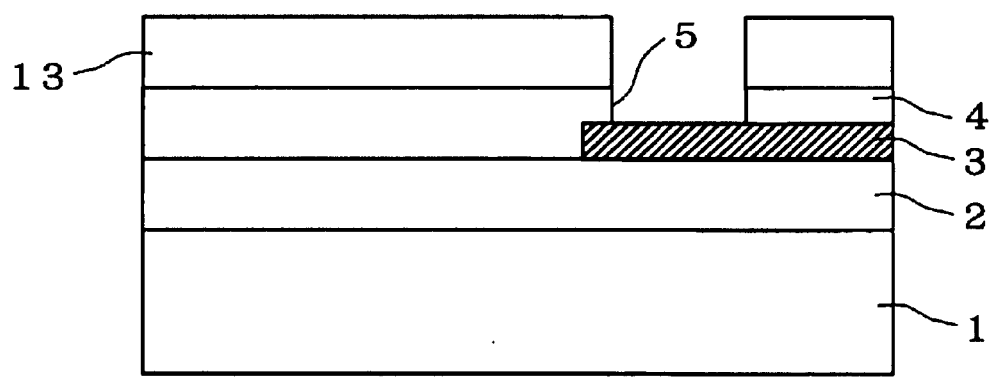
FIG. 4 illustrates a step of fabricating the semiconductor device according to the embodiment 1.

Then, the second oxide film 4 is formed on the first oxide film 2 and the pad layer 3 by CVD, a prescribed resist pattern 13 is formed thereon, and the contact hole 5 reaching the surface of the pad layer 3 is formed by lithography, in a step shown in FIG. 4.

Figure 5:
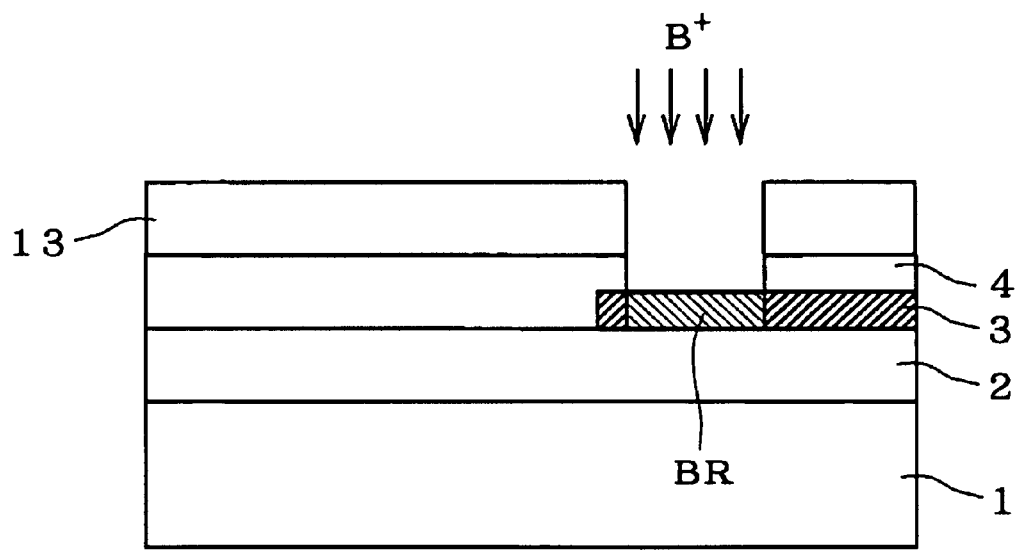
FIG. 5 illustrates a step of fabricating the semiconductor device according to the embodiment 1.

In a step shown in FIG. 5, boron is implanted into the overall surface by ion implantation through the resist pattern 13 serving as a mask for selectively forming the boron-implanted region BR, and thereafter the resist pattern 13 is removed. Alternatively, boron may be implanted through the second oxide film 4 serving as a mask, without employing the resist pattern 13.

The boron injection rate is at least $2 \times 10^{15}$ cm$^{-2}$ when the thickness of the pad layer 3 is 100 nm and the phosphorus concentration is $1 \times 10^{20}$ cm$^{-3}$, for example.

Figure 6:
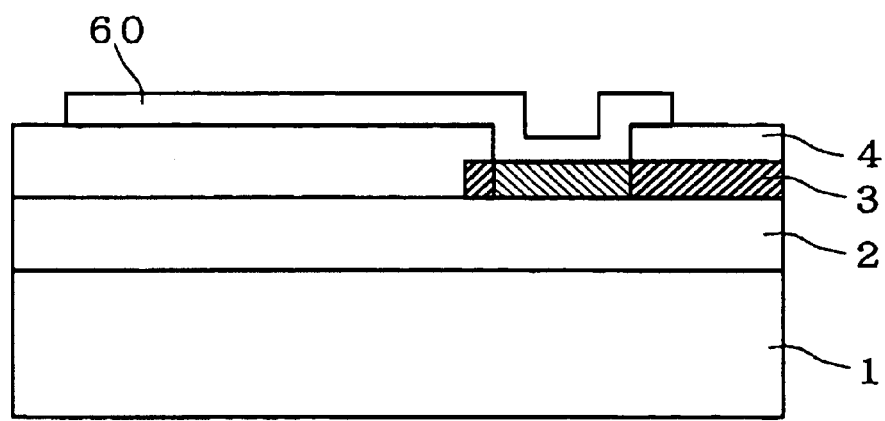
FIG. 6 illustrates a step of fabricating the semiconductor device according to the embodiment 1.

In a step shown in FIG. 6, a polysilicon film containing no impurity is deposited by CVD and worked into a prescribed pattern by lithography, thereby forming a TFT layer 60. The TFT layer 60 is adapted to define the drain 6, the channel 7 and the source 8 in a later step.

Then, an oxide film and a polysilicon film are successively deposited on the TFT layer 60 and the second oxide film 4 by CVD. At this time, a phosphorus-added polysilicon film is formed by making deposition while adding phosphorus into CVD gas.

Figure 7:
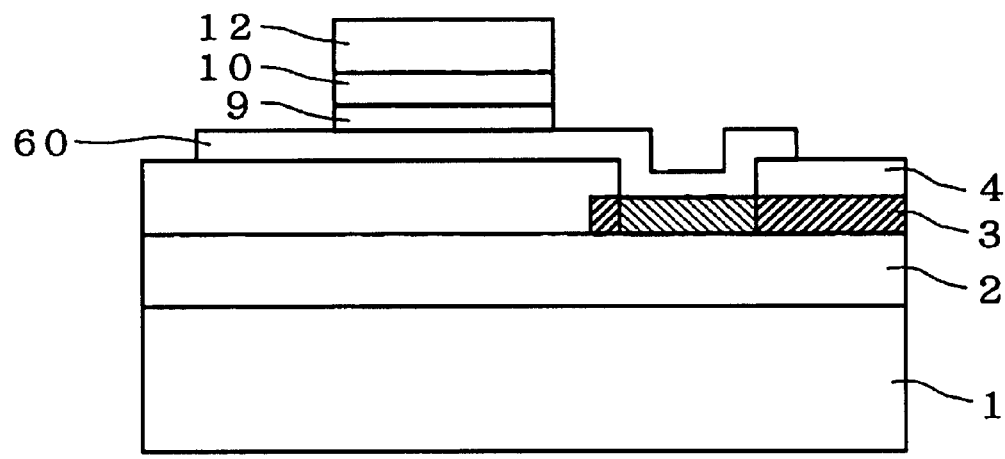
FIG. 7 illustrates a step of fabricating the semiconductor device according to the embodiment 1.

These films are worked into prescribed patterns by lithography through a resist pattern 12 which is formed on a prescribed position for serving as a mask, thereby forming the gate 10 and the gate oxide film 9 provided under the same, as shown in FIG. 7.

Figure 8:
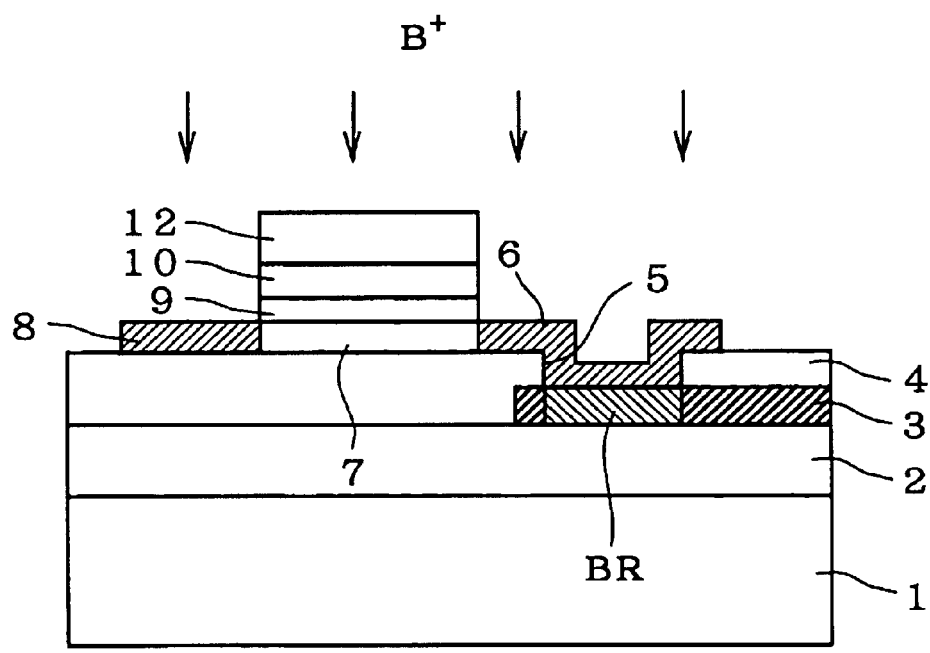
FIG. 8 illustrates a step of fabricating the semiconductor device according to the embodiment 1.

In a step shown in FIG. 8, boron is implanted into the overall surface by ion implantation while leaving the resist pattern 12 for converting parts of the TFT layer 60 shown in FIG. 7 not covered with the resist pattern 12 to P-type polysilicon films, thereby forming the P-type source 8 and the P-type drain 6 through the channel 7. Then, the resist pattern 12 is removed, thereby obtaining the TFT 101 having the P-type drain 6 which is connected with the P-type boron-implanted region BR.

While an actual TFT has such a complicated structure that an insulating layer is formed on the drain 6, the source 8 and the gate 10 and a wiring layer is provided thereon, these layers are omitted for the purpose of simplification.

<Embodiment 2>

As one of methods of preventing N-type conversion of a drain caused by diffusion of phosphorus from an N-type pad layer, the boron concentration of the drain may be previously increased.

Namely, the drain part may contain boron in a concentration not compensated by infiltration of phosphorus. When a pad layer 3 has a phosphorus concentration of $1 \times 10^{20}$ cm$^{-3}$, for example, a drain 6 may have a boron concentration of at least $2 \times 10^{20}$ cm$^{-3}$.

Figure 9:
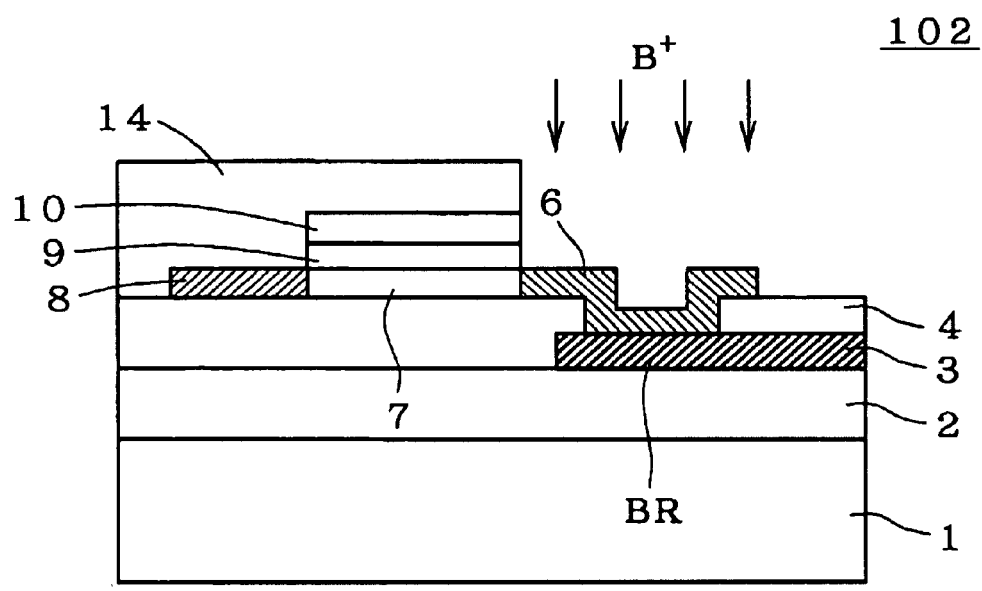
FIG. 9 is a sectional view for illustrating the structure of a semiconductor device according to an embodiment 2 of the present invention.

With reference to FIG. 9, a step of increasing the boron concentration of the drain 6 is described. FIG. 9 shows a step following the steps described with reference to FIGS. 6 to 8 after the steps described in relation to the embodiment 1 of the present invention with reference to FIGS. 3 and 4.

As shown in FIG. 9, a resist pattern 14 is formed on upper portions of a source 8 and a gate 10 for further implanting boron into the drain 6 through the resist pattern 14 serving as a mask, thereby obtaining a TFT 102 including the drain 6 having a boron concentration which is higher than the originally necessary concentration. If the thickness of the TFT layer 60 shown in FIG. 6 is 100 nm, the boron injection rate may be at least $2 \times 10^{15}$ cm$^{-2}$. In order to reduce the depth of implantation at the same implantation energy, BF$_2$ ions may be implanted in the same rate.

While the resist pattern 14 is formed on the upper portions of the source 8 and the gate 10 not to increase the boron concentrations of the source 8 and the gate 10 in FIG. 9, boron may alternatively be implanted with no provision of the resist pattern 14, if reduction of the source-to-drain breakdown voltage etc. causes no problem even if the boron concentration of the source 8 is increased.

Namely, the boron injection rate may be increased in the step of fabricating the gate 10 and the drain 6, whereby the fabrication steps can be simplified.

<Embodiment 3>

Methods of preventing N-type conversion of a drain caused by diffusion of phosphorus from an N-type pad layer includes a method of suppressing diffusion of phosphorus by introducing nitrogen into the drain.

"1995 Symposium on VLSI Technology Digest of Technical Papers" reports that diffusion of an impurity contained in single-crystalline silicon is suppressed by introduction of nitrogen into the single-crystalline silicon in pages 19 to 20.

Figure 10:
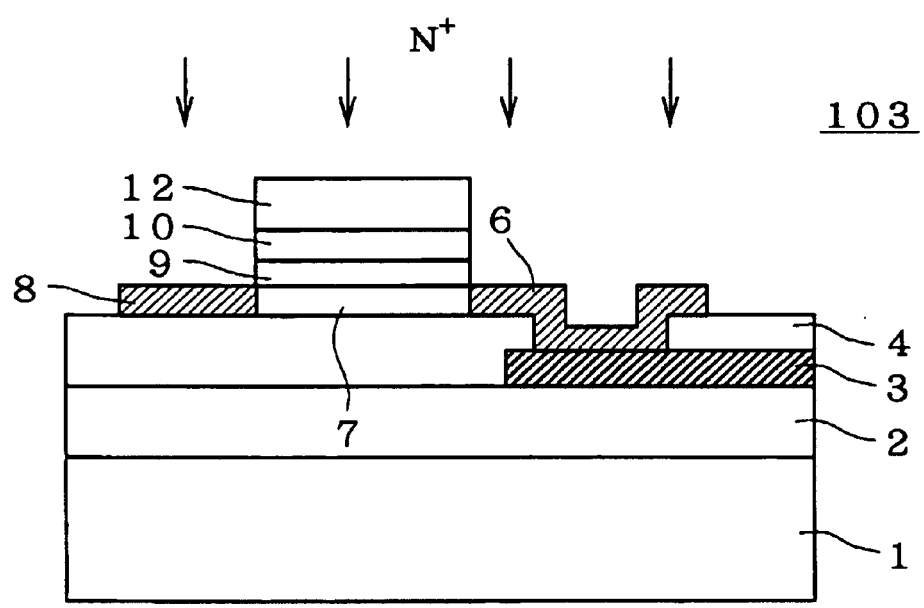
FIG. 10 is a sectional view for illustrating a step of fabricating a semiconductor device according to an embodiment 3 of the present invention.

Therefore, nitrogen is introduced into a drain 6 in a step of fabricating the same. The step of introducing nitrogen is now described with reference to FIG. 10. FIG. 10 shows a step following the steps described with reference to FIGS. 6 to 8 after the steps described with reference to FIGS. 3 and 4.

As shown in FIG. 10, nitrogen ions are implanted into the overall surface by ion implantation while leaving a resist pattern 12 on a gate 10. The injection rate of the nitrogen ions is about $1\times10^{15}$ to $10\times10^{15}$ cm$^{-2}$, and heat treatment of at least 700° C. is applied for activating nitrogen after the implantation, thereby obtaining a TFT 103.

While the impurity diffusion is generally speeded up in polysilicon by a number of crystal defects, it has been proved by experiments made by the inventors that such impurity diffusion is suppressed by implantation of nitrogen, due to compensation of crystal defects in polysilicon.

Even if phosphorus contained in a pad layer 3 is diffused and infiltrates into the drain 6, therefore, diffusion in the drain 6 is suppressed thereby preventing N-type conversion of the drain 6. While the heat treatment in the later fabrication step diffuses not only phosphorus contained in the pad layer 3 but boron contained in the drain 6 and reduces the boron concentration, such diffusion of boron is also suppressed due to the presence of nitrogen in the drain 6, whereby the boron concentration can be maintained at a high value.

While nitrogen is implanted after the boron implantation in the description with reference to FIG. 10, boron may alternatively be implanted after implantation of nitrogen.

In the embodiment 1 of the present invention, nitrogen may be implanted into the overall surface of the pad layer 3 following the step of forming the pad layer 3 described with reference to FIG. 3, thereby suppressing diffusion of phosphorus contained in the pad layer 3 and preventing infiltration of phosphorus into the drain 6. Alternatively, nitrogen may be implanted into both of the drain 6 and the pad layer 3.

Further, nitrogen may not be implanted into the overall surface of the pad layer 3, but a nitrogen-implanted region may be formed in a portion of the pad layer 3 positioned on the bottom portion of the contact hole 5. Such a step may be carried out by employing nitrogen ions in place of the boron ions in the step of forming the boron-implanted region BR described with reference to FIG. 5, and hence description thereof is omitted.

Nitrogen may be replaced with fluorine or chlorine, for suppressing diffusion of phosphorus and boron.

The method of introducing nitrogen into the drain 6 or the pad layer 3 is not restricted to the aforementioned ion implantation, but nitrogen may alternatively be introduced by adding ammonia ($NH_3$) gas or the like in formation of the polysilicon layer for defining the drain 6 and the pad layer 3.

<Embodiment 4>

<4-1. Device Structure>

As one of methods of preventing N-type conversion of a drain caused by diffusion of phosphorus from an N-type pad layer, a P-type pad layer may be formed on the N-type pad layer. A concrete structure therefor is now described.

Figure 11:
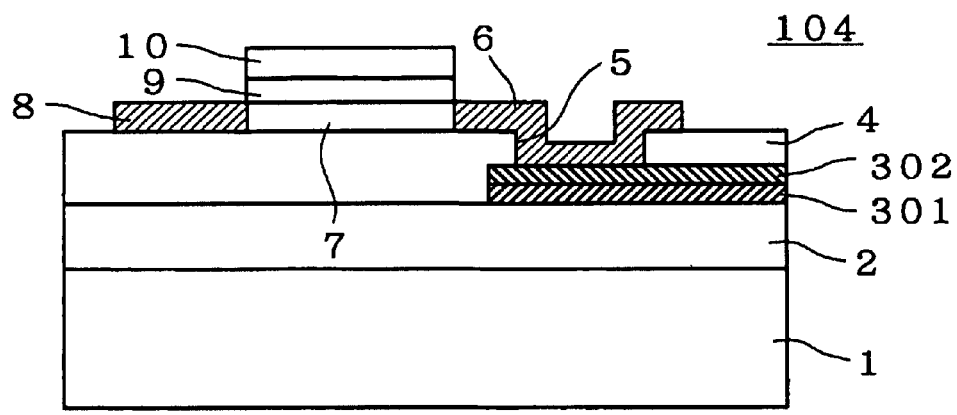
FIG. 11 is a sectional view for illustrating the structure of a semiconductor device according to an embodiment 4 of the present invention.

FIG. 11 shows a TFT 104 having pad layers of a two-layer structure. Referring to FIG. 11, a first oxide film 2 is formed on a silicon substrate 1, a first pad layer 301 (second polycrystalline semiconductor layer) of N-type polysilicon is selectively formed on the first oxide film 2, and a second pad layer 302 (third polycrystalline semiconductor layer) of P-type polysilicon is formed on the first pad layer 301.

A drain 6 is formed to be connected with the pad layer 302 through a contact hole 5 which is formed to reach an upper surface of the second pad layer 302. Structures identical to those of the TFT 101 described with reference to FIG. 1 are denoted by the same reference numerals, for omitting redundant description.

<4-2. Characteristic Function/Effect>

As described above, the pad layers are formed in a two-layer structure in the TFT 104, and the drain 6 is connected with the P-type second pad layer 302. When heat treatment is performed in a later fabrication step, therefore, boron is also diffused from the second pad layer 302 simultaneously with phosphorus from the first pad layer 301, so that phosphorus and boron infiltrate into the drain 6. Even if phosphorus compensates boron contained in the drain 6, therefore, boron infiltrating from the second pad layer 302 maintains the drain 6 in a P-type state.

<4-3. Fabrication Method>

A method of fabricating the TFT 104 is now described with reference to FIGS. 12 and 13. In a step shown in FIG. 12, a polysilicon film of 50 nm in thickness is formed on the first oxide film 2 by CVD. At this time, a phosphorus-added polysilicon film 311 is formed by making deposition while adding phosphorus into CVD gas.

Then, a polysilicon film containing no impurity is deposited by 50 nm on the phosphorus-added polysilicon film 311 by CVD, and thereafter boron ions are implanted into only this polysilicon film by ion implantation, for forming a boron-added polysilicon film 321. The injection rate is about $1\times10^{15}$ cm$^{-2}$.

Figure 12:
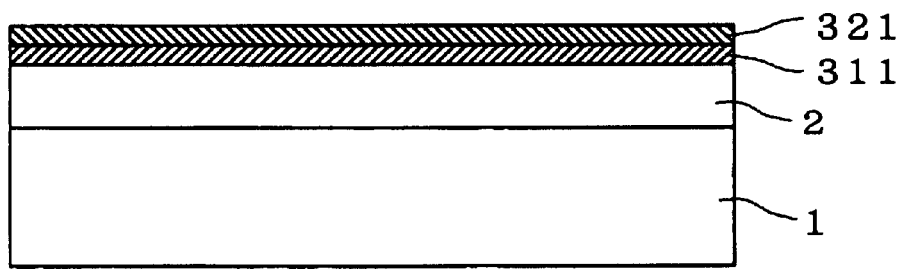
FIG. 12 illustrates a step of fabricating the semiconductor device according to the embodiment 4 of the present invention.
Figure 13:
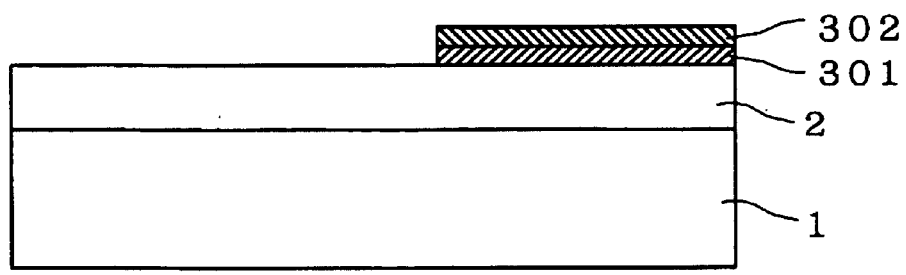
FIG. 13 illustrates a step of fabricating the semiconductor device according to the embodiment 4 of the present invention.

In a step shown in FIG. 13, the phosphorus-added polysilicon film 311 and the boron-added polysilicon film 321 shown in FIG. 12 are worked into prescribed patterns by photolithography and etching (lithography), thereby forming pad layers of a two-layer structure consisting of the first pad layer 301 and the second pad layer 302 formed thereon. Subsequent steps are substantially identical to those of the fabrication steps for the TFT 101, and hence redundant description is omitted.

<Embodiment 5>

<5-1. Device Structure>

Figure 14:
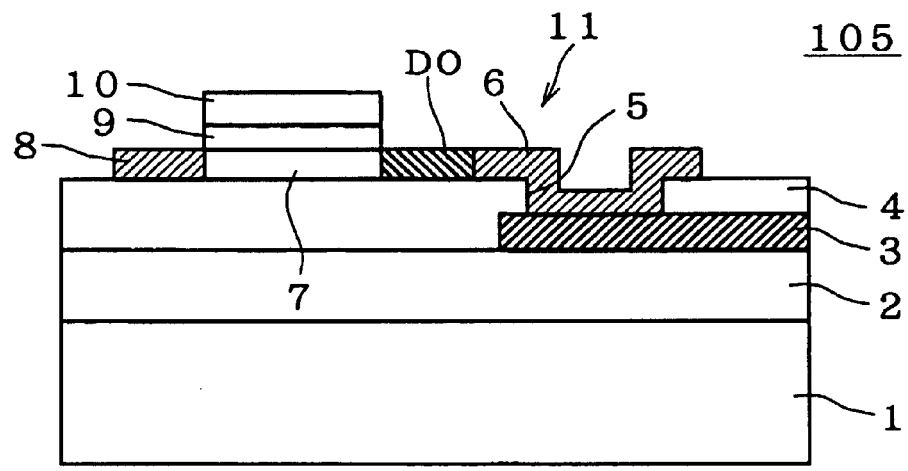
FIG. 14 is a sectional view for illustrating the structure of a semiconductor device according to an embodiment 5 of the present invention.

In relation to a method of reducing an OFF-state current of a TFT, a TFT of a drain offset structure provided with an offset part having a lower impurity concentration than a drain between the drain and a channel is proposed. FIG. 14 is a sectional view of a TFT 105 having such a drain offset structure.

As shown in FIG. 14, a drain 6 is not directly connected to a channel 7 in a TFT main part 11 which is formed on an upper portion of an oxide film 4, but an offset part DO is interposed between the drain 6 and the channel 7. Structures identical to those of the TFT 101 described with reference to FIG. 1 are denoted by the same reference numerals, for omitting redundant description.

Due to such provision of the offset part DO, the distance between the drain 6 and a gate 10 is increased to relax an electric field between both electrodes and reducing a leakage current (OFF-state current) of this TFT 105. The offset part DO is formed in a P type in a P-channel TFT, and its impurity concentration is generally set at about $1\times10^{17}$ to $10\times10^{17}$ cm$^{-3}$, in order to minimize the electric field while reducing resistance.

<5-2. Fabrication Method>

Figure 15:
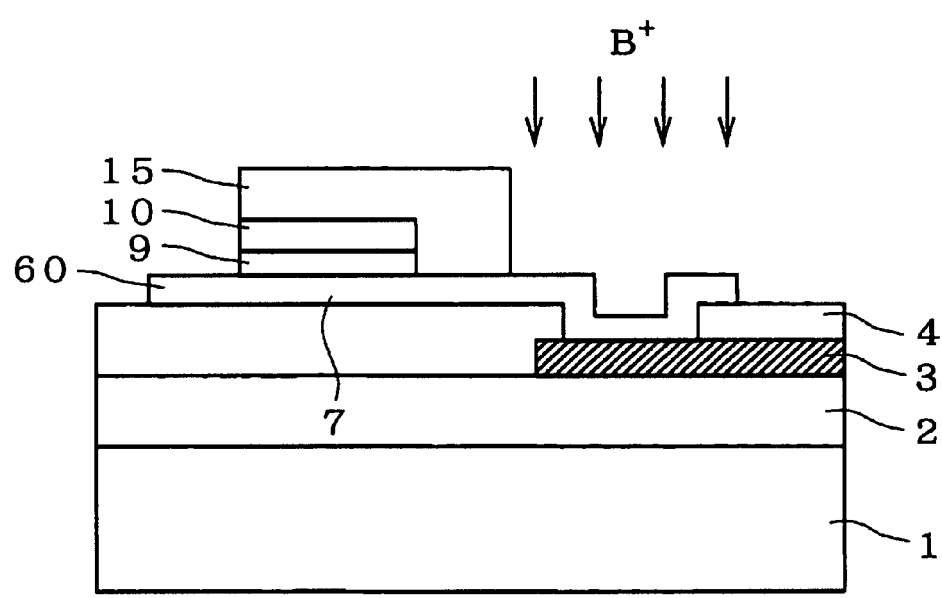
FIG. 15 illustrates a step of fabricating the semiconductor device according to the embodiment 5 of the present invention.
Figure 16:
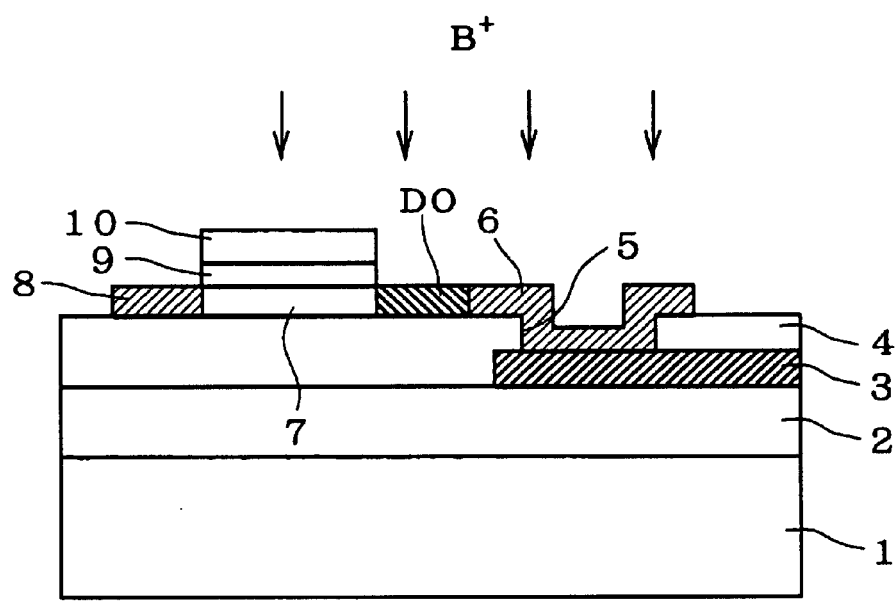
FIG. 16 illustrates a step of fabricating the semiconductor device according to the embodiment 5 of the present invention.

With reference to FIGS. 15 and 16, a method of fabricating the TFT 105 is now described. After the steps described with reference to FIGS. 6 and 7 are carried out following the steps described with reference to FIGS. 3 and 4, a resist pattern 15 is formed to cover an upper portion of the gate 10 and that of a part of a TFT layer 60 for defining the offset part DO.

In a step shown in FIG. 15, boron ions are implanted into the TFT layer 60 by $1\times10^{15}$ cm$^{-2}$ by ion implantation through the resist pattern 15 serving as a mask, thereby forming a P-type source 8 and the P-type drain 6. If the thickness of the TFT layer 60 is 100 nm, the impurity concentration of the TFT layer 60 is $1\times10^{20}$ cm$^{-3}$.

In a step shown in FIG. 16, the resist pattern 15 is removed and thereafter boron ions are implanted into the TFT layer 60 shown in FIG. 15 in a density of $5\times10^{12}$ cm$^{-2}$ by ion implantation through the gate 10 serving as a mask, thereby forming the offset part DO having an impurity concentration of $5\times10^{17}$ cm$^{-3}$.

Thus, while the impurity concentration of the offset part DO is generally set at about $1\times10^{17}$ cm$^{-3}$, this concentration is not sufficient for preventing the drain 6 from N-type conversion caused by phosphorus diffused from a pad layer 3. While it is readily presumable that N-type conversion can be prevented by increasing the impurity concentration of the offset part DO, it is uneasy to decide an impurity concentration satisfying both of relaxation of an electric field between the electrodes of the drain 6 and the gate 10 and reduction of resistance. However, the inventors have ascertained an impurity concentration satisfying these conditions.

Figure 17:
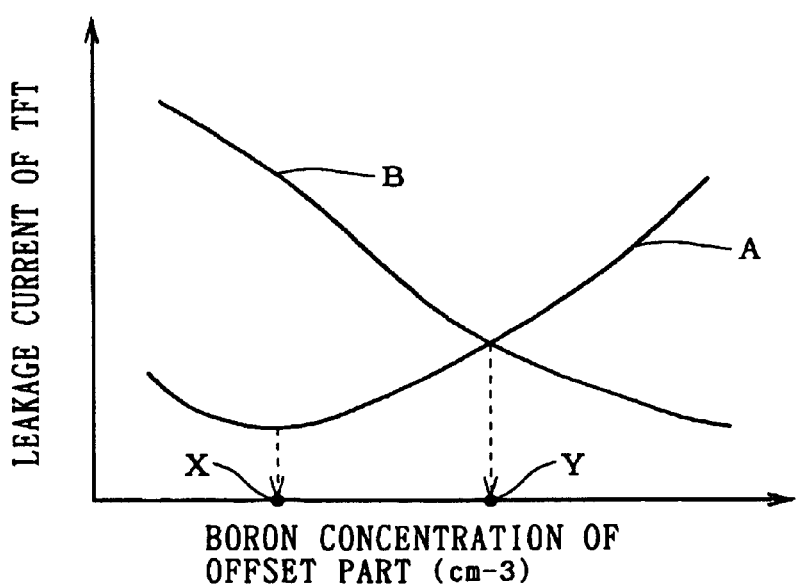
FIG. 17 illustrates the relations between boron concentrations of drain offset parts and leakage currents.

FIG. 17 shows the relations between boron concentrations of offset parts DO and leakage currents of TFTs. Referring to FIG. 17, a characteristic curve A shows characteristics with no phosphorus diffusion from a pad layer when no pad layer is provided and the leakage current results from the electric field between the drain 6 and the gate 10 shown in FIG. 16. On the other hand, a characteristic curve B shows characteristics with presence of phosphorus diffusion from a pad layer.

As understood from FIG. 17, a boron concentration (shown by a point X in FIG. 17) minimizing the leakage current is present in the characteristic curve A, and its value is $1\times10^{17}$ to $10\times10^{17}$ cm$^{-3}$. In the characteristic curve B, however, the leakage current is reduced as the boron concentration is increased, since boron compensates diffused phosphorus, as described above.

The concentration of the offset part DO must be lower than that of the drain 6, while the leakage current must be suppressed to the minimum. While it has heretofore been uneasy to decide a boron concentration satisfying both conditions, an optimum value of the impurity concentration of the offset part DO can be obtained by obtaining the characteristic curves A and B and putting down these curves with each other.

Namely, a point (shown by a point Y in FIG. 17) at the intersection of the characteristic curves A and B exhibits the boron concentration minimizing the leakage current. The value, which is higher than the optimum concentration in case of providing no phosphorus diffusion and varied with the phosphorus concentration of the pad layer 3 and a contact distance, is about $1\times10^{18}$ to $50\times10^{18}$ cm$^{-3}$.

<5-3. Characteristic Function/Effect>

As hereinabove described, the drain 6 can be prevented from N-type conversion caused by phosphorus diffusion by setting the impurity concentration of the offset part DO to be higher than the optimum concentration in case of providing no phosphorus diffusion in the TFT 105 of a drain offset structure which may cause phosphorus diffusion from the pad layer 3. In this case, the impurity concentration of the offset part DO may be obtained from the intersection between the characteristic curves with no phosphorus diffusion from the pad layer and with phosphorus diffusion from the pad layer.

<Embodiment 6>

<6-1. Device Structure>

While each of the above embodiments 1 to 5 of the present invention has been described with reference to a TFT of the so-called direct contact system attaining electrical contact by directly connecting the drain and the pad layer of the TFT with each other, such electrical contact between the drain and the pad layer of the TFT may alternatively be attained through a plug which is made of polysilicon. This system is referred to as a plug contact system. The structure of a TFT of such a plug contact system for preventing N-type conversion of a drain is now described.

Figure 18:
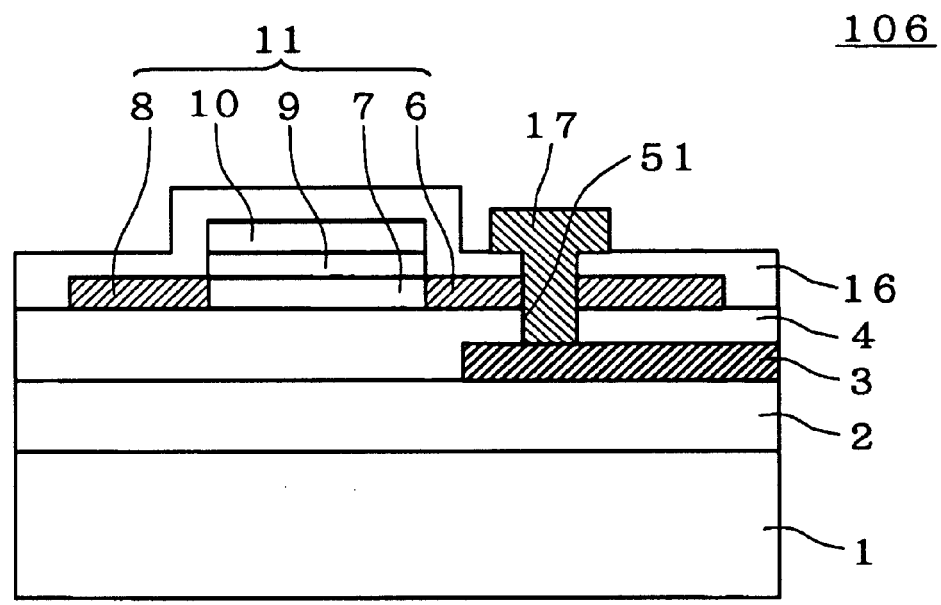
FIG. 18 is a sectional view for illustrating the structure of a semiconductor device according to an embodiment 6 of the present invention.

FIG. 18 shows a sectional structure of a plug contact system TFT 106. Referring to FIG. 18, a first oxide film 2 is formed on a silicon substrate 1, and a pad layer 3 of polysilicon is selectively formed on the first oxide film 2. A second oxide film 4 is formed to cover the first oxide film 2 and the pad layer 3.

A TFT main part 11 is formed on an upper portion of the second oxide film 4. The TFT main part 11 is formed by a drain 6, a channel 7, a source 8, a gate oxide film 9 which is formed on the channel 7, and a gate 10 which is formed thereon.

The drain 6, the channel 7 and the source 8 are integrally formed on a surface of the second oxide film 4 by polysilicon. A third oxide film 16 is formed to cover the TFT main part 11.

A contact hole 51 is formed to reach an upper surface of the pad layer 3 through prescribed positions of the third oxide film 16, the drain 6 and the second oxide film 4, and a plug 17 (third polycrystalline semiconductor layer) which is made of P-type polysilicon is buried in the contact hole 51.

The plug 17 is provided with a leg part which is buried in the contact hole 51 and a head part which is formed on the third oxide film 16, and has a T-shaped section. The bottom portion of the leg part is connected to the upper surface of the pad layer 3 while the side portion thereof is connected to the drain 6, thereby electrically connecting the drain 6 and the pad layer 3 with each other.

The impurity concentration of the plug 17 is set at a value higher than the phosphorus concentration of the pad layer 3, e.g., at least twice the phosphorus concentration, for example.

<6-2. Fabrication Method>

Figure 19:
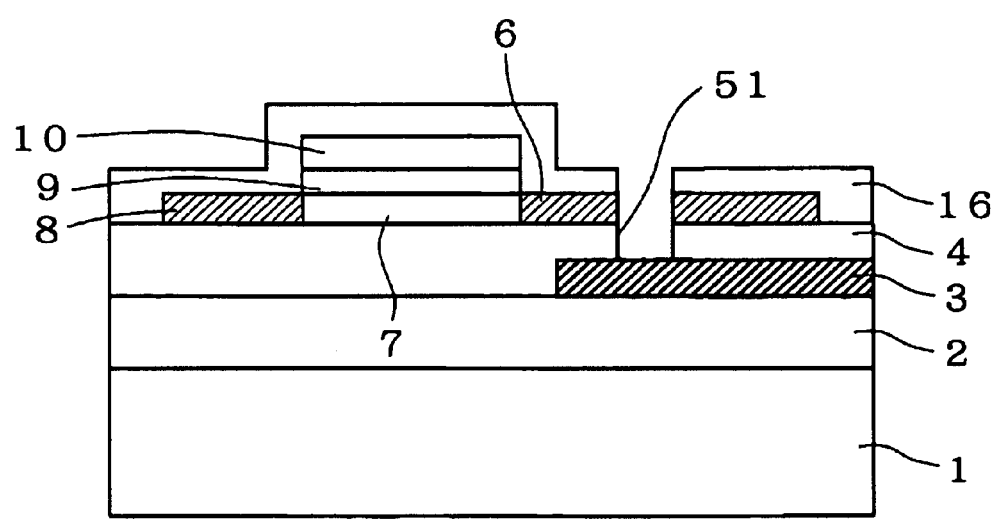
FIG. 19 illustrates a step of fabricating the semiconductor device according to the embodiment 6 of the present invention.

A method of fabricating the TFT 106 is now described with reference to FIGS. 19 and 20. First, steps up to the state of the structure shown in FIG. 19 are described. The first oxide film 2 is formed on the silicon substrate 1 by CVD or thermal oxidation. Then, a polysilicon film is formed on the first oxide film 2 by CVD. At this time, a phosphorus-added polysilicon film is formed by making deposition while adding phosphorus into CVD gas.

Then, the phosphorus-added polysilicon film is worked into a prescribed pattern by photolithography and etching (i.e., lithography), thereby forming the N-type pad layer 3.

Then, the second oxide film 4 is formed on the first oxide film 2 and the pad layer 3 by CVD, a polysilicon film is deposited thereon by CVD with no addition of an impurity and worked into a prescribed pattern by lithography, thereby forming a TFT layer 60. The TFT layer 60 is adapted to define the drain 6, the channel 7 and the source 8 in a later step.

Then, an oxide film and a polysilicon film are successively deposited on the TFT layer 60 and the second oxide film 4 by CVD. At this time, a phosphorus-added polysilicon film is formed by making deposition while adding phosphorus into CVD gas.

These films are worked into prescribed patterns by lithography through a resist pattern which is formed on a prescribed position for serving as a mask, thereby forming the gate 10 and the gate oxide film 9 provided under the same.

Then, boron is implanted into the overall surface by ion implantation while leaving the aforementioned resist pattern for converting parts of the TFT layer 60 which is not covered with the resist pattern, thereby forming the P-type source 8 and the P-type drain 6 through the channel 7 and completing the TFT main part 11.

The third oxide film 16 is formed on the TFT main part 11, and thereafter the contact hole 51 is formed to reach an upper surface of the pad layer 3 through the prescribed positions of the third oxide film 16, the drain 6 and the second oxide film 4 by lithography, thereby obtaining the structure shown in FIG. 19.

Figure 20:
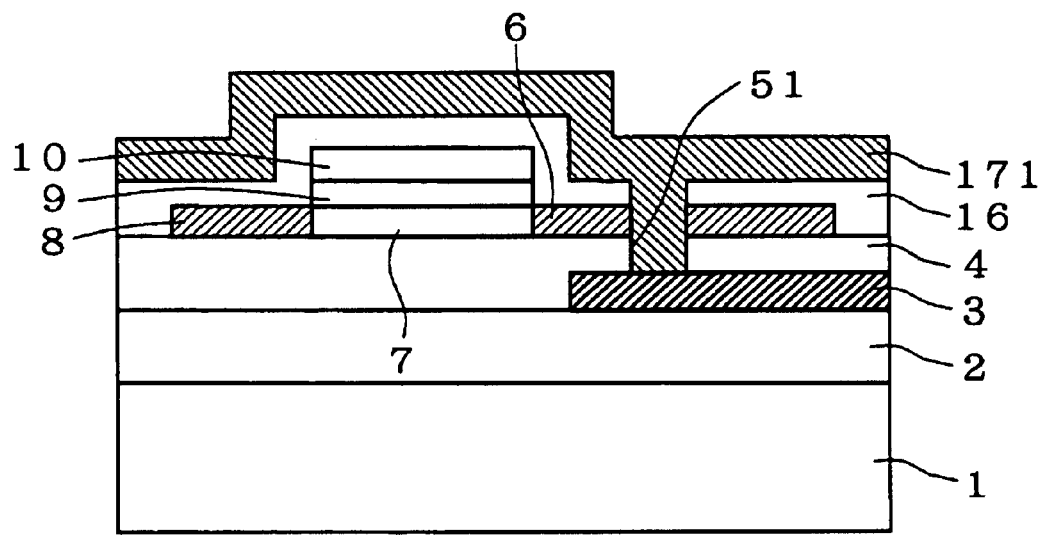
FIG. 20 illustrates a step of fabricating the semiconductor device according to the embodiment 6 of the present invention.

In a step shown in FIG. 20, a polysilicon film containing no impurity is deposited on the overall surface of the third oxide film 16 and in the contact hole 51 by CVD, and thereafter boron ions are implanted into the overall surface by ion implantation, thereby forming a boron-added polysilicon film 171.

At this time, the boron-added polysilicon film 171 may be formed on the overall surface of the third oxide film 16 and in the contact hole 51 by making deposition while adding boron into CVD gas.

If the diameter of the contact hole 51 is 400 nm, the polysilicon film 171 is deposited in a thickness of at least 200 nm, whereby the contact hole 51 can be entirely filled up with the boron-added polysilicon film 171.

Boron ions are selectively implanted into a prescribed position of the boron-added polysilicon film 171, i.e., a position for forming the plug 17, by ion implantation for increasing the impurity concentration of this part to a value higher than the phosphorus concentration of the pad layer 3, e.g., at least twice the phosphorus concentration, and thereafter the boron-added polysilicon film 171 is worked into a prescribed pattern by lithography, thereby forming the TFT 106 having the T-shaped plug 17 shown in FIG. 18.

<6-3. Characteristic Function/Effect>

While phosphorus diffused from the pad layer 3 may also be diffused in the drain 6 through the plug 17 in FIG. 18, it is possible to prevent boron from entire compensation by infiltration of phosphorus by increasing the concentration of boron introduced into the plug 17 to a value higher than the phosphorus concentration of the pad layer 3, e.g., at least twice the phosphorus concentration, thereby preventing phosphorus from being diffused into the drain 6.

Further, it is possible to improve the effect of avoiding an influence exerted by diffusion of phosphorus from the pad layer 3 as the distance (hereinafter referred to as a plug height) between the surface of the pad layer 3 and the lower surface of the drain 6 is increased. For example, a sufficient effect can be attained by setting the plug height at about 100 nm.

Due to the plug contact system, the structure can be readily modified as follows:

<6-4. Modification 1>

While the plug 17 is formed by a dedicated boron-added polysilicon film in the aforementioned TFT 106, it is possible to omit the step of fabricating the polysilicon film by forming the plug 17 by a polysilicon film of the same conductivity type as the gate 10 and employing the gate oxide film 9 in place of the third oxide film 16, thereby simplifying the fabrication steps. in this case, however, the gate 10 must be made of P-type polysilicon, in order to suppress an influence exerted by phosphorus diffusion from the pad layer 3.

This fabrication method is now described with reference to FIGS. 21 and 22. Steps up to formation the second oxide film 4 shown in FIG. 21 are identical to those of the fabrication steps for the TFT 106 described with reference to FIG. 19, and hence redundant description is omitted.

A TFT layer 60 (not shown) of polysilicon containing no impurity is formed on the second oxide film 4 and thereafter worked into a prescribed pattern by lithography through a mask of a resist pattern which is formed on a prescribed position (i.e., a channel 7) of the TFT layer 60, boron is implanted into the overall surface by ion implantation while leaving the resist pattern, and parts of the TFT layer 60 which are not covered with the resist pattern are converted to P-type polysilicon films, thereby forming a P-type source 8 and a P-type drain 6 through the channel 7.

Figure 21:
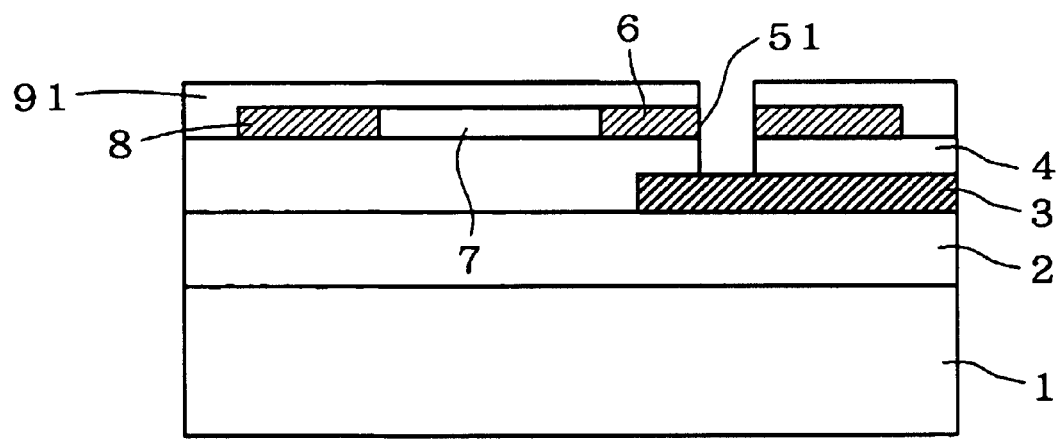
FIG. 21 illustrates a step of fabricating a modification of the semiconductor device according to the embodiment 6 of the present invention.

In a step shown in FIG. 21, an oxide film 91 is formed on the overall surface, and thereafter a contact hole 51 is formed to reach an upper surface of a pad layer 3 through prescribed positions of the drain 6 and the second oxide film 4.

Figure 22:
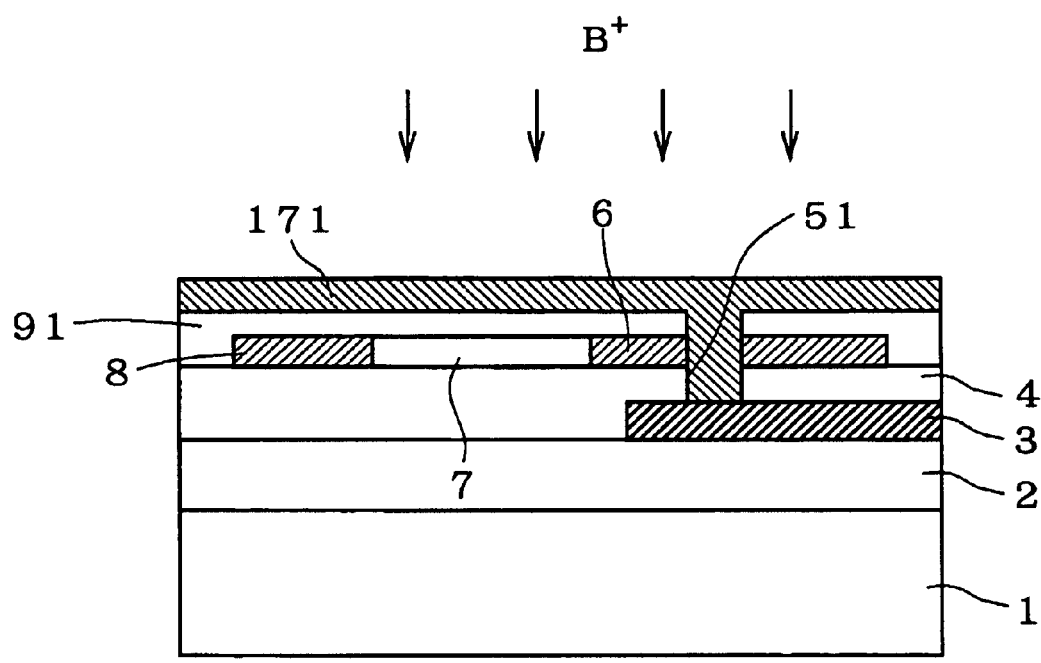
FIG. 22 illustrates a step of fabricating another modification of the semiconductor device according to the embodiment 6 of the present invention.

In a step shown in FIG. 22, a polysilicon film containing no impurity is deposited on the overall surface of the oxide film 91 and in the contact hole 51 by CVD, and thereafter boron ions are implanted into the overall surface by ion implantation, thereby forming a boron-added polysilicon film 171.

The polysilicon film 171 may be formed depositing the boron-added polysilicon film by CVD using $B_2H_6$ and $SiH_4$ gas or the like. In this case, the injection process of boron is unnecessary, and the distribution of boron in the polysilicon film 171 becomes more even than when the boron injection is used.

Figure 23:
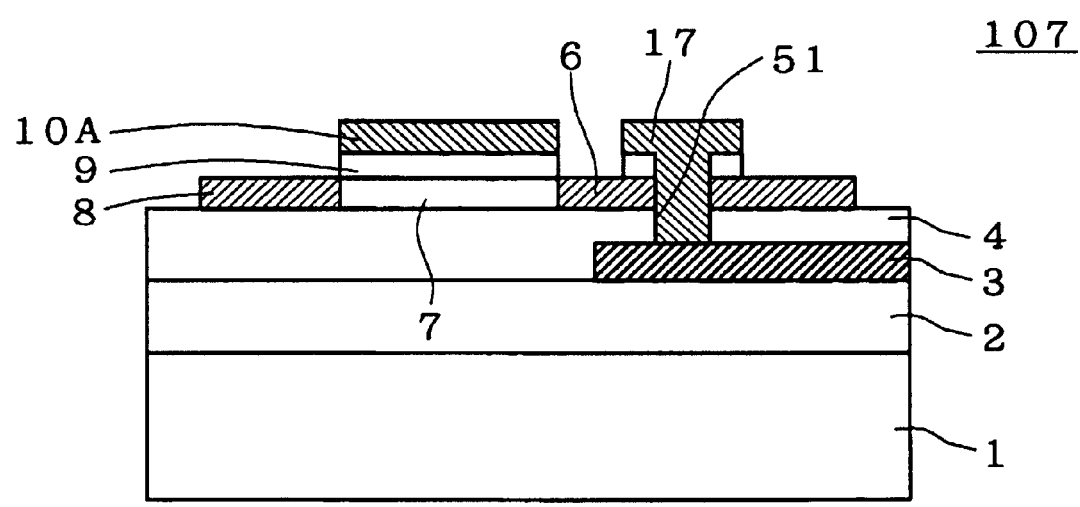
FIG. 23 illustrates a step of fabricating still another modification of the semiconductor device according to the embodiment 6 of the present invention.

Boron ions are selectively implanted into a prescribed position of the boron-added polysilicon film 171, i.e., a position for forming a plug 17, by ion implantation for increasing the impurity concentration of this part to a value higher than the phosphorus concentration of the pad layer 3, e.g., at least twice the phosphorus concentration, and thereafter the boron-added polysilicon film 171 and the oxide film 91 are worked into prescribed patterns by lithography, thereby forming a TFT 107 having a gate IOA and the plug 17 of P-type polysilicon, as shown in FIG. 23.

<6-5. Modification 2>

In the aforementioned TFT 107, the gate 10A is made of P-type polysilicon. N-type polysilicon and P-type polysilicon have different work functions, such that the threshold voltage of the TFT moves to a positive direction when the gate is made of N-type polysilicon as compared with the case of employing N-type polysilicon as the gate. In other words, the threshold voltage is increased. If this is not allowable, the gate and the plug must be made of N-type polysilicon and P-type polysilicon respectively although the polysilicon films are formed in the same step.

A fabrication method of this case is described with reference to FIGS. 24 and 25. Steps up to formation of a boron-added polysilicon film 171 shown in FIG. 24 are identical to those of the fabricating steps for the TFT 107 described with reference to FIGS. 21 and 22.

Figure 24:
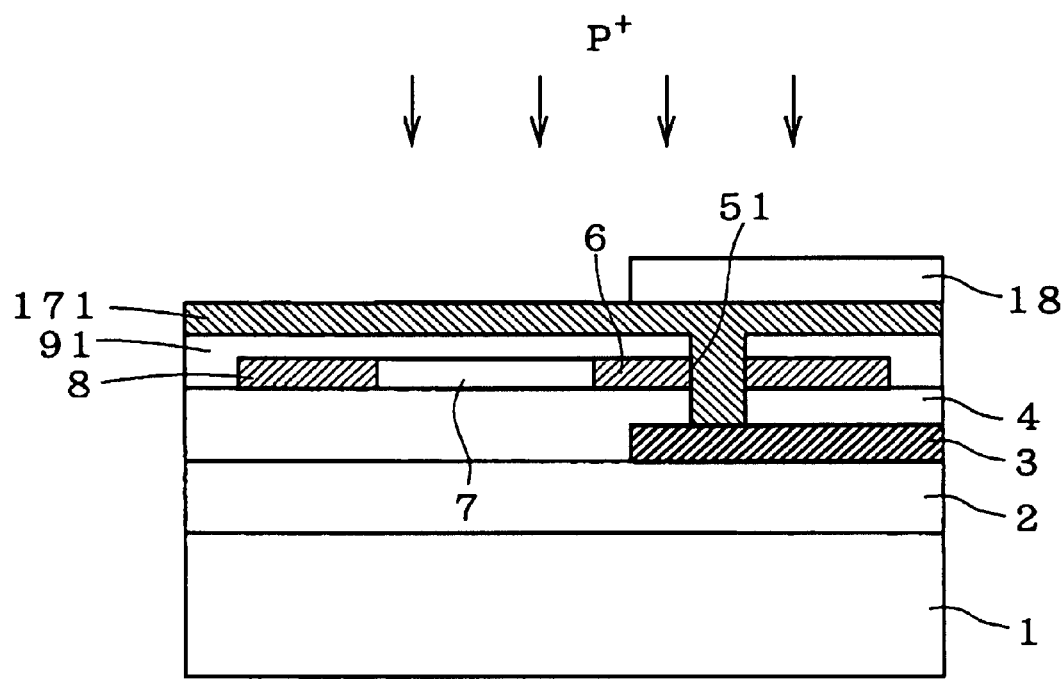
FIG. 24 illustrates a step of fabricating a further modification of the semiconductor device according to the embodiment 6 of the present invention.

In a step shown in FIG. 24, a resist pattern 18 is formed on a plug forming region of the boron-added polysilicon film 171, i.e., on an upper portion of a contact hole 51 and its periphery, and employed as a mask for implanting phosphorus ions by ion implantation. In this case, the boron ions are implanted in a concentration of twice the boron concentration of the boron-added polysilicon film 171, e.g., $2 \times 10^{15}$ cm$^{-2}$, whereby it is possible to compensate boron in a part not covered with the resist pattern 18, i.e., a part for defining a gate 10, for attaining N-type conversion.

Figure 25:
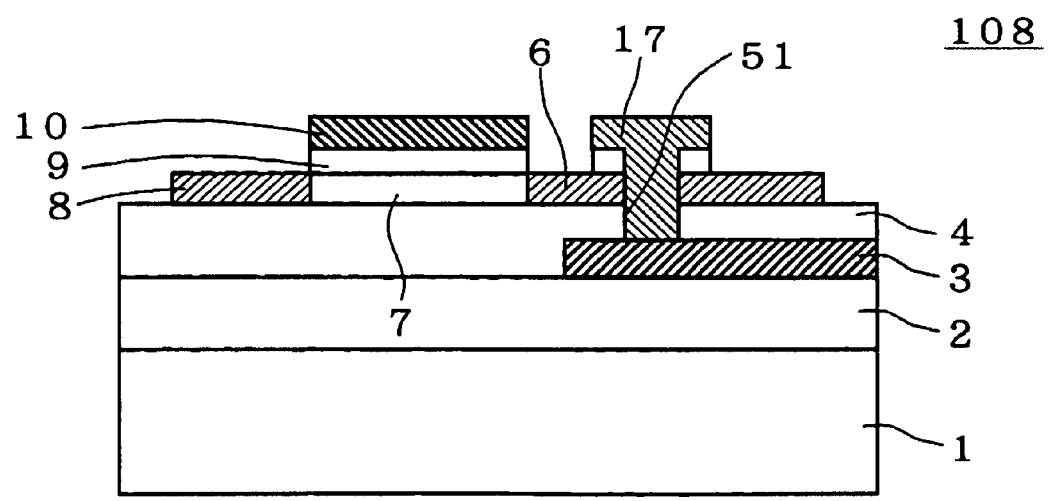
FIG. 25 illustrates the structure of a further modification of the semiconductor device according to the embodiment 6 of the present invention.

Then, the resist pattern 18 is removed, thereafter boron ions are selectively implanted into a prescribed position of the boron-added polysilicon film 171, i.e., the position for forming a plug 17, for increasing the impurity concentration of this part to a value higher than the phosphorus concentration of a pad layer 3, e.g., at least twice the phosphorus concentration, and thereafter the boron-added polysilicon film 171, the part converted to an N-type, and an oxide film 91 are worked into prescribed patterns by lithography, thereby forming a TFT 108 having a gate 10 of N-type polysilicon and the plug 17 of P-type polysilicon, as shown in FIG. 25.

<6-6. Modification 3>

The gate 10 and the plug 17 are made of N-type polysilicon and P-type polysilicon in the aforementioned TFT 108, and hence the step of forming the P-type polysilicon film and converting the part for defining the gate 10 to an N type is necessary. If the plug is made of N-type polysilicon, however, the fabrication steps can be simplified. A structure and a fabrication method therefor are now described with reference to FIGS. 26 and 27. Steps up to formation of an oxide film 91 shown in FIG. 26 are identical to those of the fabrication steps for the TFT 107 described with reference to FIG. 21.

A contact hole 51 is formed by lithography to reach an upper surface of a pad layer 3 through prescribed positions of the oxide film 91, a drain 6 and a second oxide film 4.

Figure 26:
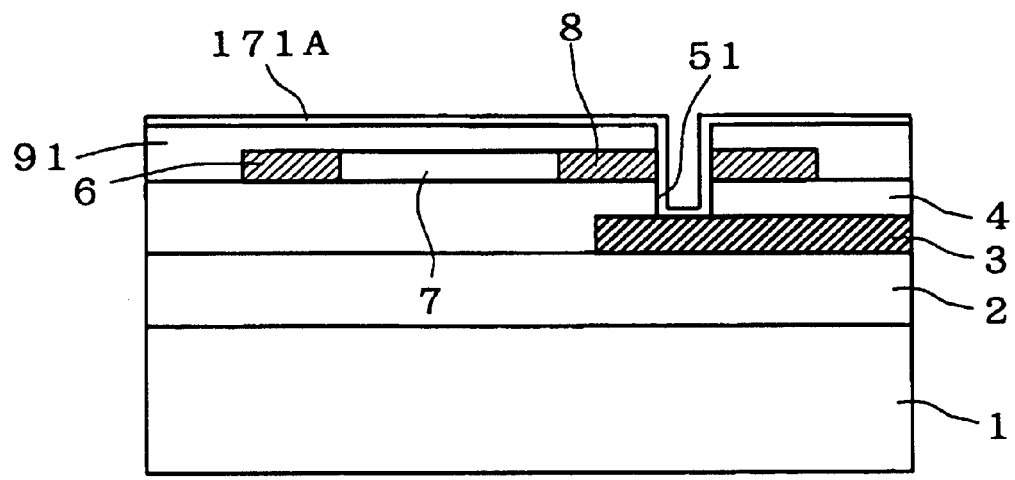
FIG. 26 illustrates a step of fabricating a further modification of the semiconductor device according to the embodiment 6 of the present invention.

As shown in FIG. 26, a boron-added polysilicon film 171A is formed on the overall surface of the oxide film 91 and in the contact hole 51 by CVD. In this case, the boron-added polysilicon film 171A is formed to have a thickness which is sufficiently smaller than the opening dimension of the contact hole 51, e.g., about ¼ the opening dimension of the contact hole 51. Therefore, the boron-added polysilicon film 171A is formed along the inner surface of the contact hole 51, not to completely fill up the same.

The boron concentration of the boron-added polysilicon film 171A is set at a value higher than the phosphorus concentration of the pad layer 3, e.g., about twice the phosphorus concentration of the pad layer 3.

Figure 27:
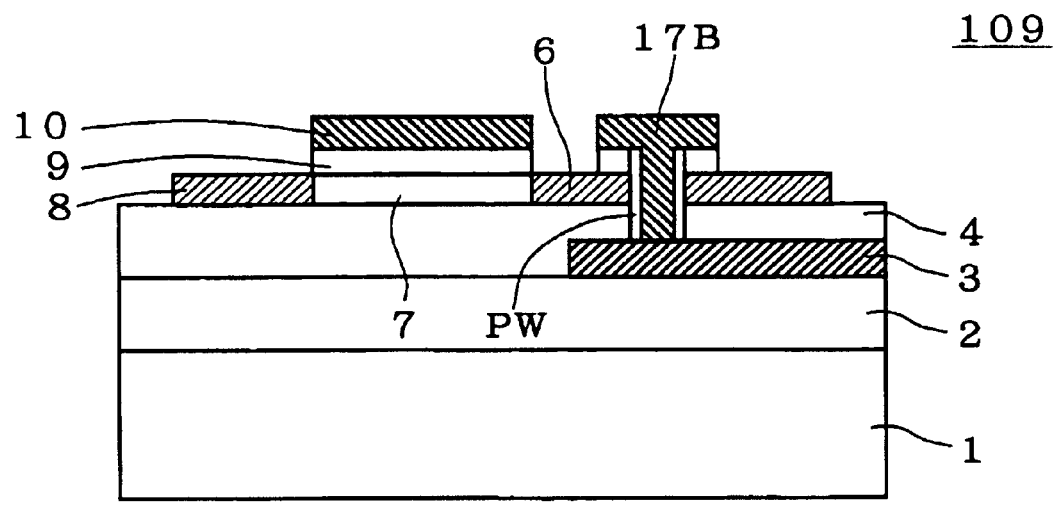
FIG. 27 illustrates the structure of a further modification of the semiconductor device according to the embodiment 6 of the present invention.

Then, anisotropic dry etching is performed to leave the boron-added polysilicon film 171A on only the side wall of the contact hole 51, thereby forming a P-type polysilicon side wall PW (fourth polycrystalline semiconductor layer), as shown in FIG. 27.

Then, a phosphorus-added polysilicon film containing phosphorus is formed by CVD on the overall surface of the oxide film 91, in the contact hole 51 and inside the P-type polysilicon side wall PW, and thereafter the phosphorus-added polysilicon film and the oxide film 91 are worked into prescribed patterns by lithography, thereby forming a TFT 109 having a plug 17B of the same N-type polysilicon as a gate 10, as shown in FIG. 27.

As hereinabove described, the gate 10 and the plug 17B can be made of the same N-type polysilicon, whereby a step of fabricating a polysilicon film can be omitted and the fabrication steps can be simplified. Further, the P-type polysilicon side wall PW is interposed between the drain 6 and the plug 17B, whereby boron is also diffused following phosphorus diffusion from the plug 17B, for reducing N-type conversion of the drain 6.

If the P-type polysilicon side wall PW is formed on the side wall of the contact hole, the plug 17 may be made not of P-type polysilicon but of N-type polysilicon in the TFT 106 described with reference to FIG. 18 by forming the P-type polysilicon side wall PW.

Phosphorus diffused from the plug 17B of N-type polysilicon may alternatively be compensated by implanting boron into the drain 6 which is exposed in the contact hole 51 by ion implantation for converting this part to a P-type semiconductor region (semiconductor region) having a high boron concentration, without forming the P-type polysilicon side wall PW on the overall side wall of the contact hole 51.

In this case, boron is implanted with oblique rotation to attain a prescribed angle of implantation with respect to a horizontal plane. This angle is decided in consideration of the opening dimension of the contact hole 51 and the formation depth of the drain 6. The implantation density is about $1 \times 10^{15}$ to $10 \times 10^{15}$ cm$^{-2}$. In this case, the impurity is not restricted to boron, so far as the same is a P-type impurity.

<6-7. Modification 4>

While the plug 17 is entirely made of P-type polysilicon in the TFT 108 shown in FIG. 25, a part which is in contact with the pad layer 3 may alternatively be made of N-type polysilicon. A fabrication method therefor is now described with reference to FIG. 28. Steps up to formation of an oxide film 91 shown in FIG. 28 are identical to those of the fabrication steps for the TFT 107 described with reference to FIGS. 21 and 22.

Figure 28:
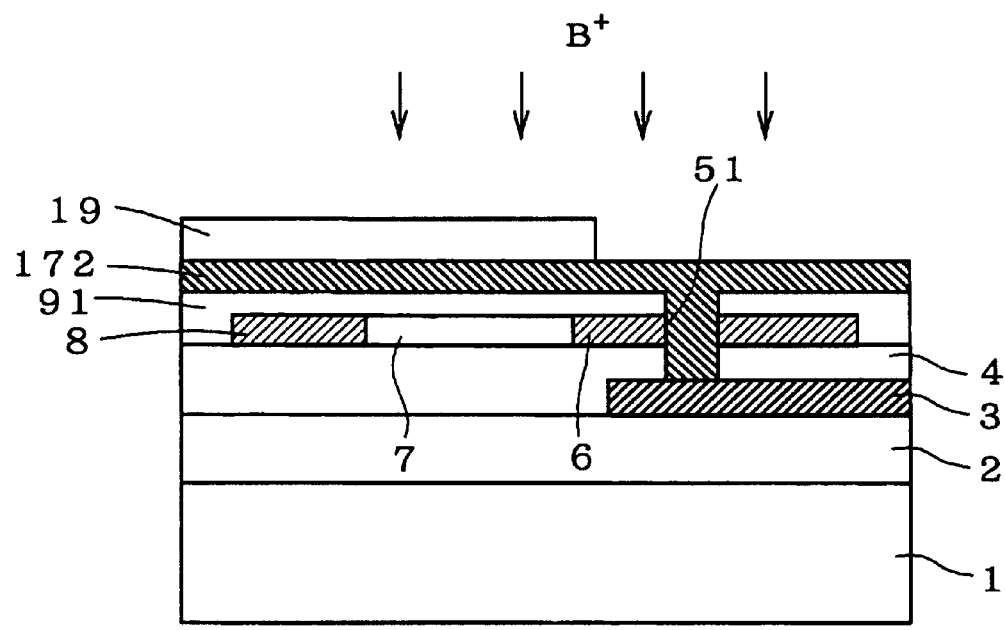
FIG. 28 illustrates a step of fabricating a further modification of the semiconductor device according to the embodiment 6 of the present invention.

In a step shown in FIG. 28, a phosphorus-added polysilicon film 172 containing phosphorus is deposited by CVD on the overall surface of the oxide film 91 and in a contact hole 51 in a thickness of 100 nm, for example.

A resist pattern 19 is formed on a gate forming region of the phosphorus-added polysilicon film 172, i.e., a part for defining a gate 10 and its periphery, and employed as a mask for implanting boron ions by ion implantation. At this time, the implantation energy for the boron ions is so adjusted that the range of the ions will not reach a contact part between a drain 6 and the pad layer 3, whereby it is possible to form a plug 17C (see FIG. 29) which is made of P-type polysilicon up to a portion above the contact part between the drain 6 and the pad layer 3 and of N-type polysilicon around a lower contact part with the pad layer 3.

In this case, the implantation energy for the boron ions, which depends on the height of the plug 17C, is set at 30 to 80 keV.

Figure 29:
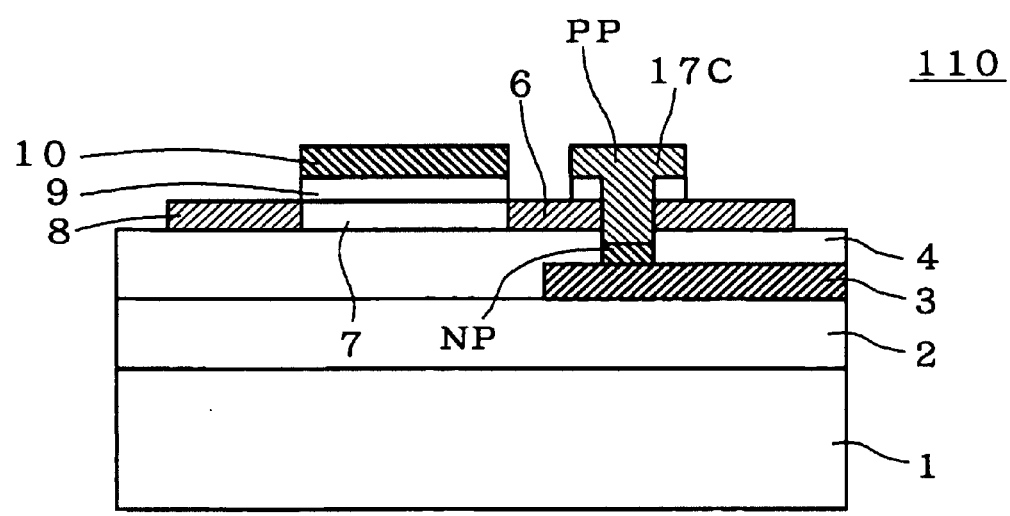
FIG. 29 illustrates the structure of a further modification of the semiconductor device according to the embodiment 6 of the present invention.

The resist pattern 19 is removed and thereafter the phosphorus-added polysilicon film 172 and the part converted to a P type are worked into prescribed patterns by lithography, thereby forming a TFT 110 having the gate 10 of N-type polysilicon and the plug 17C consisting of an upper P-type polysilicon part PP and a lower N-type polysilicon part NP, as shown in FIG. 29.

The plug 17C of such a structure is necessary when a lower portion of the plug 17C is in contact with an N-type diffusion layer which is formed on a silicon substrate.

Figure 30:
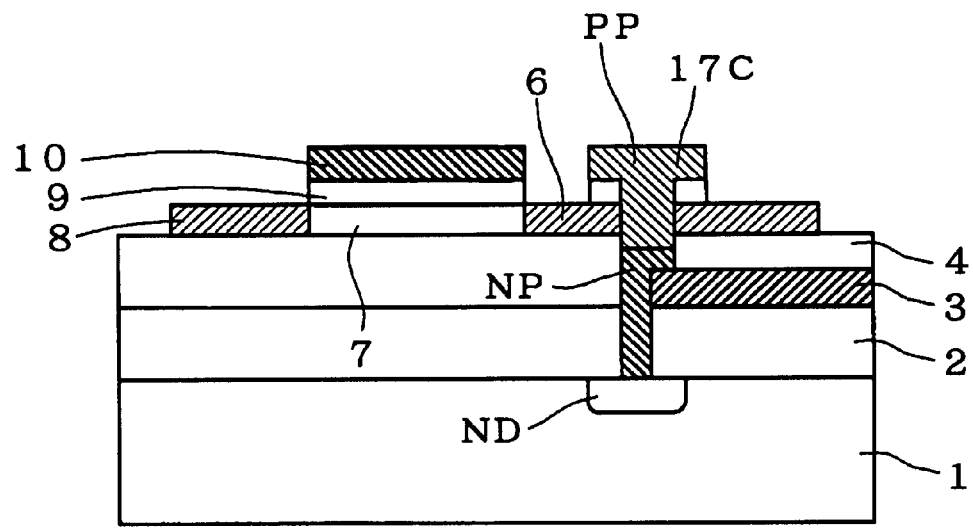
FIG. 30 illustrates an applied state of the semiconductor device according to the embodiment 6 of the present invention.

FIG. 30 shows such a structure. Referring to FIG. 30, an N-type diffusion layer ND is formed in a surface of a silicon substrate 1, and an N-type polysilicon part NP of a plug 17C is in contact with the N-type diffusion layer ND through a first oxide film 2. If the plug 17C is entirely made of P-type polysilicon, an unintended parasitic P-N junction is disadvantageously formed between the same and the N-type diffusion layer ND. However, this disadvantage can be prevented due to the lower N-type polysilicon part NP.

While the N-type diffusion layer ND is a part of a transistor etc. which is formed on the silicon substrate 1, the remaining structure is omitted for the purpose of simplification.

<Embodiment 7>

<7-1. Device Structure>

While the embodiment 6 of the present invention has been described with reference to a structure of electrically connecting a drain and a pad layer with each other through a plug completely filling up a contact hole and having a T-shaped section, a plug not completely filling up a contact hole may be employed depending on the size of the contact hole.

Figure 31:
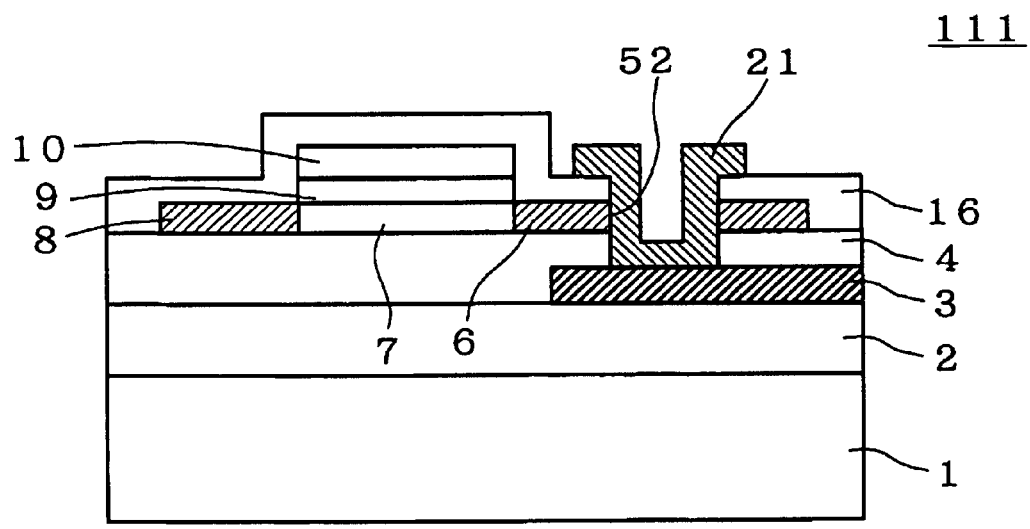
FIG. 31 is a sectional view for illustrating the structure of a semiconductor device according to an embodiment 7 of the present invention.

FIG. 31 shows a sectional structure of a plug contact system TFT 111 employing a plug having a U-shaped section. Referring to FIG. 31, a contact hole 52 is formed to reach an upper surface of a pad layer 3 through prescribed positions of a third oxide film 16, a drain 6 and a second oxide film 4, and a plug 21 having a U-shaped section which is made of P-type polysilicon is buried in the contact hole 52.

The plug 21 is formed along the inner wall surface of the contact hole 52, and its central portion is hollow. This is because the plug 21 cannot completely fill up the contact hole 52, which has an opening dimension larger than twice the thickness of the plug 21.

The bottom portion of the plug 21 is connected to the upper surface of the pad layer 3 while its side portion is in contact with the drain 6, thereby electrically connecting the drain 6 and the pad layer 3 with each other.

The impurity concentration of the plug 21 is set at a value higher than the phosphorus concentration of the pad layer 3, e.g., at least twice the phosphorus concentration.

Other structures identical to those of the TFT 106 described with reference to FIG. 18 are denoted by the same reference numerals, to omit redundant description. A fabrication method and a characteristic function/effect of the TFT 111 are also identical to those of the TFT 106, and hence redundant description is omitted.

<7-2. Modification 1>

When only a part of the plug 21 which is in contact with the pad layer 3 is converted to an N type in the aforementioned TFT 111, it is possible to prevent formation of an unintended parasitic P-N junction between the plug 21 and an N-type diffusion layer which is formed on a silicon substrate even if a lower portion of the plug 21 comes into contact with the N-type diffusion layer.

Figure 32:
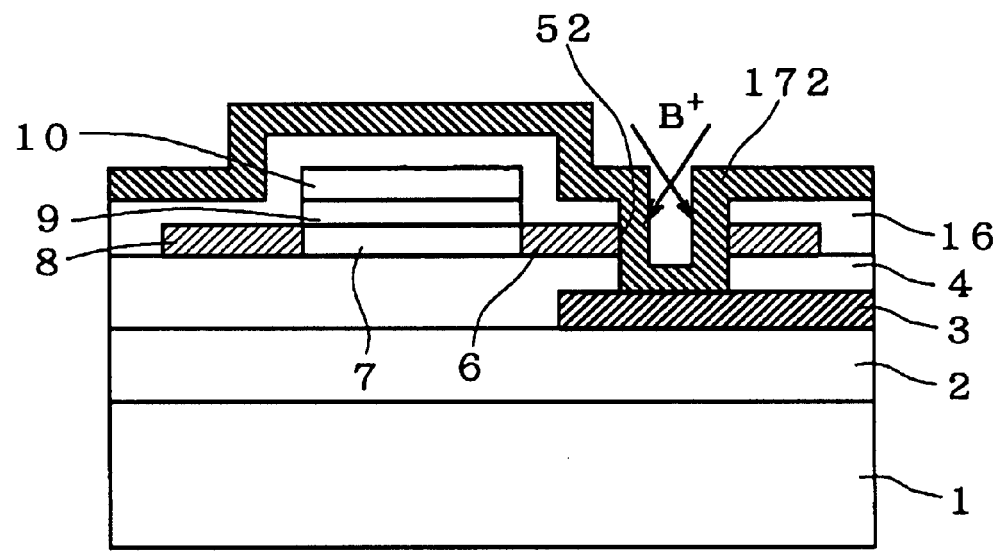
FIG. 32 illustrates a step of fabricating a modification of the semiconductor device according to the embodiment 7 of the present invention.

A fabrication method therefor is now described with reference to FIGS. 32 and 33. Steps up to formation of a third oxide film 16 shown in FIG. 32 are identical to those of the fabrication steps for the TFT 106 described with reference to FIG. 19.

A contact hole 52 is formed by lithography to reach an upper surface of a pad layer 3 through prescribed positions of the third oxide film 16, a drain 6 and a second oxide film 4.

Then, a phosphorus-added polysilicon film 172 is deposited on the overall surface of the third oxide film 16 and in the contact hole 52 by CVD in a thickness of 100 nm, for example.

Then, boron ions are implanted into the phosphorus-added polysilicon film 172 by ion implantation.

If the implantation is perpendicularly performed at this time, boron is also implanted into the part which is in contact with the pad layer 3 to convert the same to a P type, and the target function/effect cannot be attained. As shown in FIG. 32, therefore, the boron implantation is obliquely performed at a prescribed angle of implantation with respect to the horizontal plane. In consideration of the opening dimension of the contact hole 52 and the formation depth of the drain 6 (or that of the N-type polysilicon part NP), the angle is so decided that boron is not implanted into a portion which is close to the contact part with the pad layer 3 under the phosphorus-added polysilicon film 172 formed along the inner wall of the contact hole 52. This angle is in the range of 10° to 60°.

Figure 33:
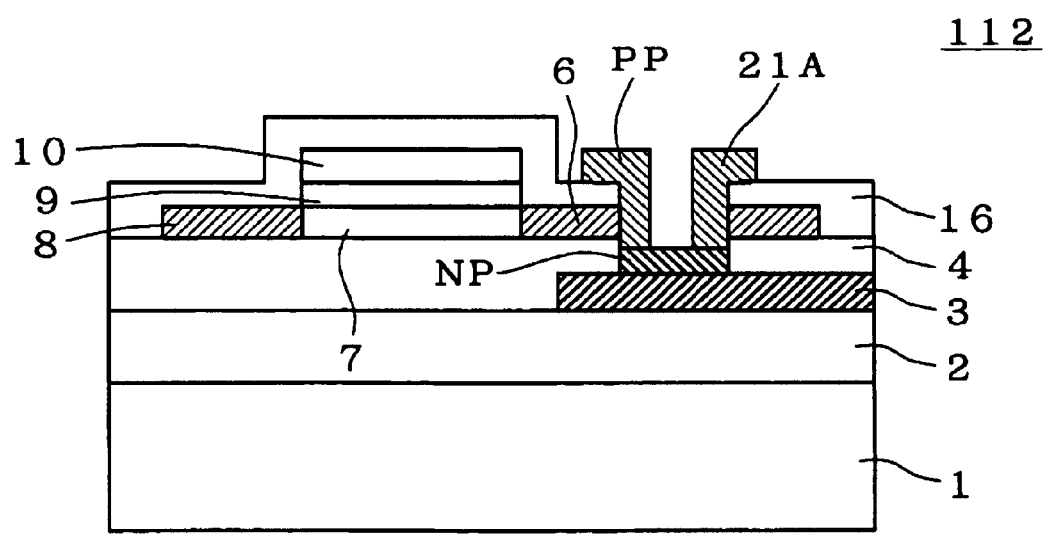
FIG. 33 is a sectional view for illustrating the structure of another modification of the semiconductor device according to the embodiment 7 of the present invention.

The phosphorus-added polysilicon film 172 and the part converted to a P type are worked into prescribed patterns by lithography, thereby forming a TFT 112 provided with a plug 21A having lower and upper portions of N-type and P-type polysilicon parts NP and PP respectively, as shown in FIG. 33.

<7-3. Modification 2>

The following method is also employable as a method of converting only a part of a plug having a U-shaped section which is in contact with a pad layer to an N type.

Figure 34:
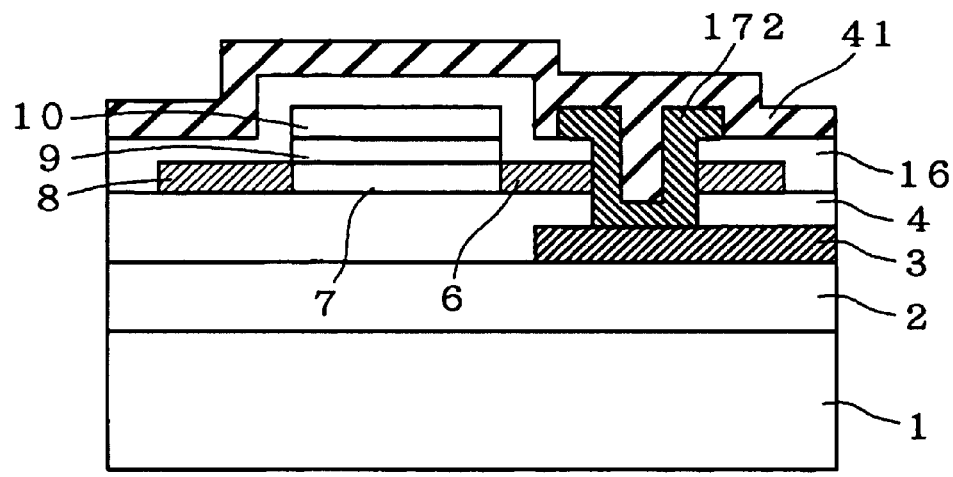
FIG. 34 illustrates a step of fabricating still another modification of the semiconductor device according to the embodiment 7 of the present invention.

This fabrication method is now described with reference to FIGS. 34 and 35. Steps up to formation of a phosphorus-added polysilicon film 172 shown in FIG. 34 are identical to those of the fabrication steps for the TFT 112 described with reference to FIG. 32. The phosphorus-added polysilicon film 172 is already subjected to lithography.

In a step shown in FIG. 34, an oxide film 41 is formed by CVD to cover a third oxide film 16 and the phosphorus-added polysilicon film 172.

Figure 35:
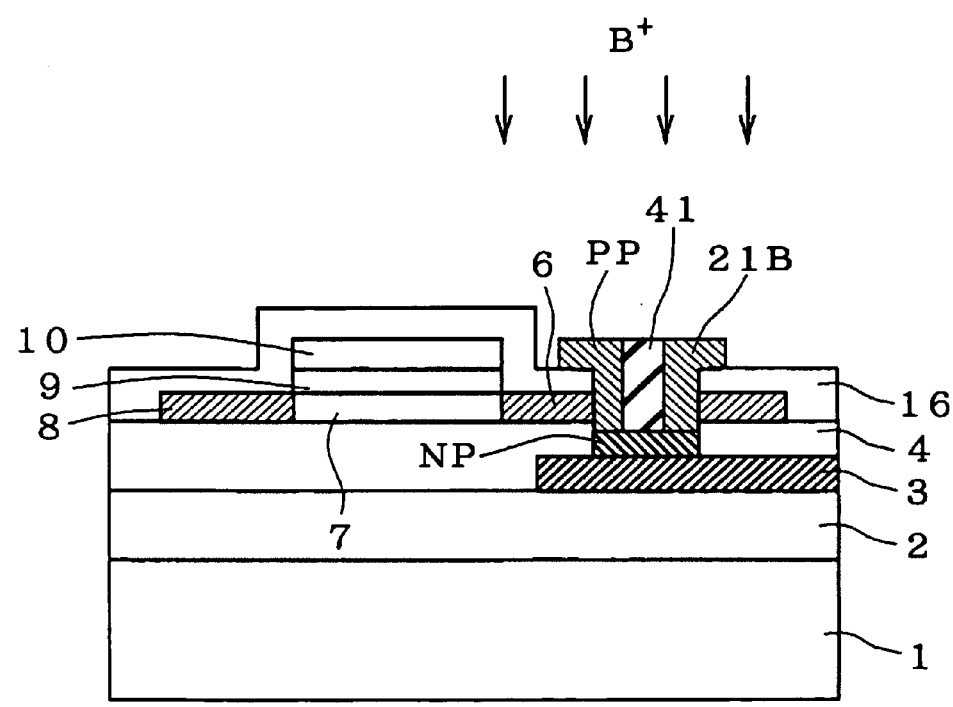
FIG. 35 illustrates a step of fabricating a further modification of the semiconductor device according to the embodiment 7 of the present invention.

In a step shown in FIG. 35, the oxide film 41 is anisotropically etched, to be left only in a depression in an upper surface of the phosphorus-added polysilicon film 172.

Then, boron ions are implanted into the overall surface by ion implantation, thereby obtaining a TFT 113 having an N-type part which is in contact with a pad layer 3.

Although the ions are perpendicularly implanted, no boron is implanted into the N-type part which is in contact with the pad layer 3 due to the oxide film 41 buried in the depression.

Thus, the boron ions may not be obliquely implanted, whereby the implantation angle may not be calculated and controlled, and the fabrication steps can be simplified.

The oxide film 41 may alternatively be formed after the phosphorus-added polysilicon film 172 is formed on the overall surface of the third oxide film 16 and in a contact hole 52 and before working the same into U shapes.

<Embodiment 8>

<8-1. Device Structure>

In a plug contact system TET electrically connecting its drain with a pad layer through a plug which is made of polysilicon, N-type polysilicon may be previously buried in a contact hole so that P-type polysilicon is thereafter buried, as a method of converting a part of the plug which is in contact with the pad layer to an N type while converting an upper portion thereof to a P type.

Figure 36:
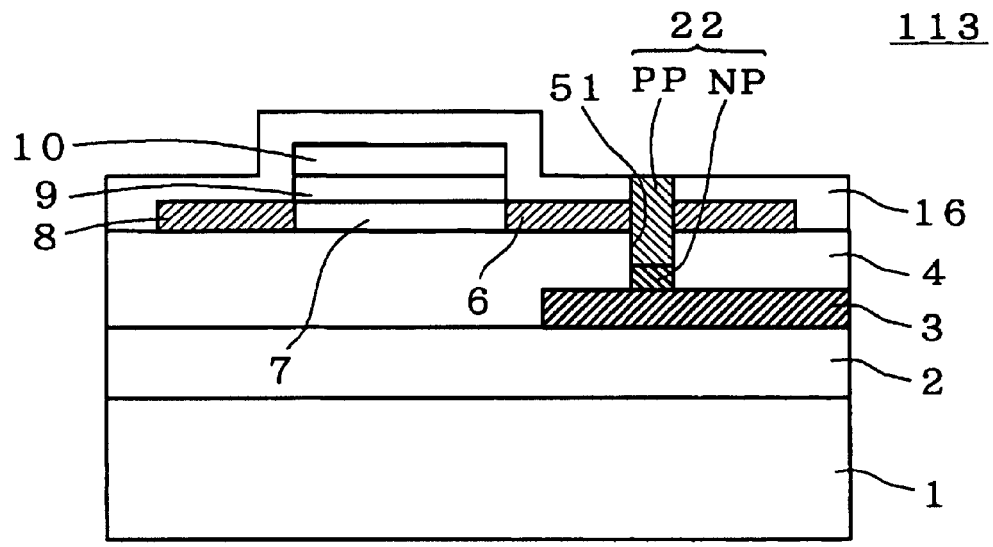
FIG. 36 is a sectional view for illustrating the structure of a semiconductor device according to an embodiment 8 of the present invention.

The structure and a method of fabricating a TFT 113 which is formed by such a method are now described with reference to FIG. 36. Referring to FIG. 36, a contact hole 51 is formed to reach an upper surface of a pad layer 3 through prescribed positions of a third oxide film 16, a drain 6 and a second oxide film 4, and a plug 22 is buried in this contact hole 51.

The plug 22 is completely buried in the contact hole 51, so that its end surface is exposed on a surface of the third oxide film 16. The plug 22 has a lower N-type polysilicon part NP (fourth polycrystalline semiconductor layer) which is in contact with the pad layer 3, and an upper P-type polysilicon part PP (third polycrystalline semiconductor layer) containing boron in a higher concentration than the phosphorus concentration of the pad layer 3, e.g., at least twice the phosphorus concentration. Other structures identical to those of the TFT 106 described with reference to FIG. 18 are denoted by the same reference numerals, to omit redundant description.

<8-2. Fabrication Method>

Steps up to formation of the contact hole 51 are identical to those of the fabrication steps for the TFT 106 described with reference to FIG. 19, and hence redundant description is omitted.

After formation of the contact hole 51, a phosphorus-added polysilicon film is deposited on the third oxide film 16 and in the contact hole 51. At this time, the thickness of the deposited film is about 200 to 300 nm, if the opening dimension of the contact hole 51 is 400 nm, for example.

Then, the phosphorus-added polysilicon film is entirely etched by dry etching. This etching is stopped when the phosphorus-added polysilicon film deposited in the contact hole 51 is removed up to a prescribed depth. The depth for stopping the etching is decided in consideration of the position of formation of the drain 6, so that at least the drain 6 is completely exposed.

Then, a polysilicon film containing no impurity is deposited on the third oxide film 16 and in the contact hole 51. Boron ions are implanted into the overall surface by ion implantation for forming a P-type polysilicon film, which in turn is worked by lithography into a desired pattern, to be left only in the contact hole 51 for forming the P-type polysilicon part PP.

<8-3. Characteristic Function/Effect>

The plug 22 having the lower N-type polysilicon part NP and the upper P-type polysilicon part PP is formed through the aforementioned steps, so that no unintended parasitic P-N junction is formed between the lower part of the plug 22 and an N-type diffusion layer which is formed on a silicon substrate I when the former is in contact with the latter.

<Embodiment 9>

<9-1. Device Structure>

While two types of polysilicon materials, i.e., N-type polysilicon and P-type polysilicon, are successively buried in the contact hole 51 which is formed in a single step for forming the plug 22 of a two-layer structure in the aforementioned TFT 113, contact holes for burying N-type polysilicon and P-type polysilicon therein may alternatively be formed independently of each other.

Figure 37:
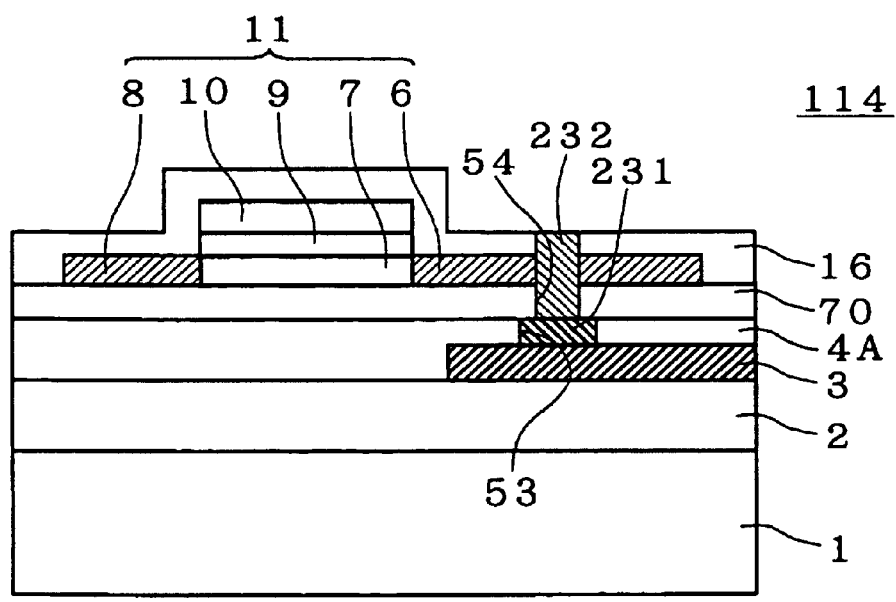
FIG. 37 is a sectional view for illustrating the structure of a semiconductor device according to an embodiment 9 of the present invention.

With reference to FIG. 37 showing the structure of a TFT 114 which is formed in such a manner, the structure and the fabrication method are now described.

Referring to FIG. 37, a second oxide film 4A is formed to cover a first oxide film 2 and a pad layer 3. A contact hole 53 (lower opening) is formed to reach an upper surface of the pad layer 3 through a prescribed position of the second oxide film 4A, and a plug 231 (fourth polycrystalline semiconductor layer) of N-type polysilicon is buried in the contact hole 53.

An intermediate oxide film 70 is formed to cover an upper part of the second oxide film 4A, and a TFT main part 11 is formed on an upper part of the intermediate oxide film 70. A third oxide film 16 is formed to cover the TFT main part 11, a contact hole 54 (upper opening) is formed to reach an upper surface of the plug 231 through prescribed positions of the third oxide film 16, a drain 6 and the intermediate oxide film 70, and another plug 232 (third polycrystalline semiconductor layer) is buried in the contact hole 54.

The plug 232 is completely buried in the contact hole 54, so that its end surface is exposed on the surface of the third oxide film 16.

The second oxide film 4A and the intermediate oxide film 70, which are of the same type, cannot be distinguished from each other but can be handled as a single-layer oxide film after formation. Other structures identical to those of the TFT 106 described with reference to FIG. 18 are denoted by the same reference numerals, to omit redundant description.

<9-2. Fabrication Method>

A method of fabricating the TFT 114 is now described. Steps up to formation of the second oxide film 4A are identical to those of the fabrication steps for the TFT 106 described with reference to FIG. 19, and hence redundant description is omitted.

The second oxide film 4A is formed to cover the pad layer 3 and the first oxide film 2. The second oxide film 4A is formed to be smaller than an originally necessary thickness, e.g., half the necessary thickness.

Then, the contact hole 53 is formed to reach an upper surface of the pad layer 3 through a prescribed position of the second oxide film 4A, and a phosphorus-added polysilicon film is deposited by CVD on the second oxide film 4 and in the contact hole 53.

Then, the phosphorus-added polysilicon film is entirely etched by dry etching, to leave the phosphorus-added polysilicon film, i.e., an N-type polysilicon film, only in the contact hole 53, thereby forming the plug 231.

Then, the intermediate oxide film 70 is formed on an upper portion of the second oxide film 4A. The thickness of the intermediate oxide film 70 is decided to attain the original thickness which is necessary for the second oxide film 4A in correspondence to its thickness.

Then, the TFT main part 11 is formed on the intermediate oxide film 70, the third oxide film 16 is formed on the TFT main part 11, and thereafter the contact hole 54 is formed to reach an upper surface of the plug 231 through prescribed positions of the third oxide film 16, the drain 6 and the intermediate oxide film 70.

Then, a polysilicon film containing no impurity is deposited by CVD on the third oxide film 16 and in the contact hole 54. Boron ions are implanted into the overall surface by ion implantation for forming a P-type polysilicon film, which in turn is subjected to lithography to be left in a desired pattern only in the contact hole 54, thereby forming the plug 232.

<9-3. Characteristic Function/Effect>

A plug of a two-layer structure is formed by the plugs 231 and 232 of N-type polysilicon and P-type polysilicon through the aforementioned steps, so that no unintended parasitic P-N junction is formed between the lower part of the plug 231 and an N-type diffusion layer which is formed on a silicon substrate 1 when the former is in contact with the latter.

The plugs 231 and 232 are formed independently of each other through different steps, whereby various modifications can be structurally performed. A modification is now described.

<9-4. Modification>

The plugs 231 and 232 are formed independently of each other through different steps, whereby the positional relation therebetween can be arbitrarily changed.

Figure 38:
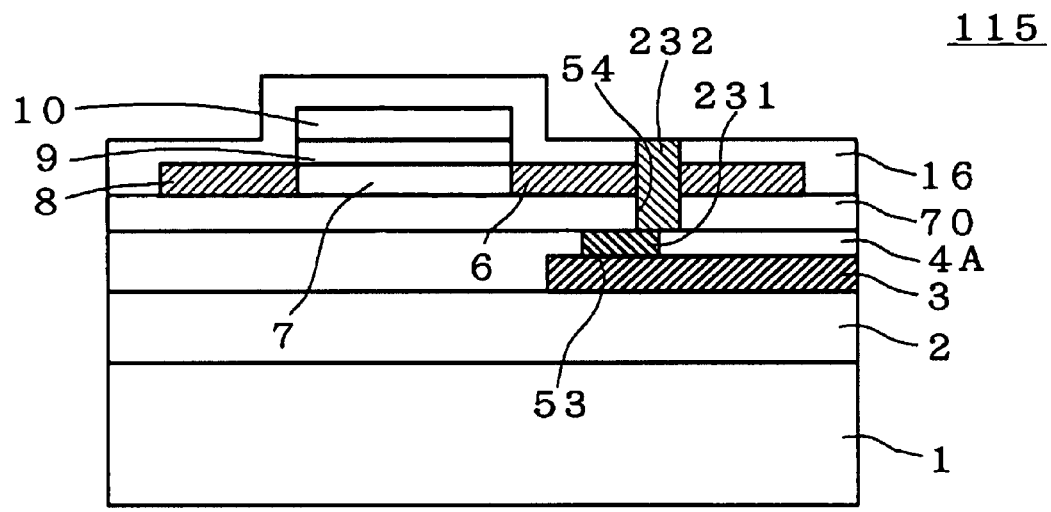
FIG. 38 illustrates the structure of a modification of the semiconductor device according to an embodiment 9 of the present invention.

FIG. 38 shows a TFT 115 provided with plugs 231 and 232 having central axes deviating from each other. Referring to FIG. 38, the plug 232 is so formed that the position of its central axis deviates from that of the central axis of the plug 231 rightward in FIG. 38, i.e., to separate from a channel 7.

Due to this structure, the distance (interboundary distance) between the upper surface (i.e., the connection part) of the plug 231 of N-type polysilicon and the boundary between the channel 7 and a drain 6 can be extended, thereby reducing influence exerted by phosphorus diffusion from the plug 231.

While not only the central axis of the plug 232 but that of the plug 231 may deviate to separate from the channel 7, the aforementioned structure of moving only the plug 232 is effective when arrangement of a pad layer 3 is so restricted that the plug 231 deviates from the pad layer 3 or an N-type diffusion layer which is formed on a silicon substrate 1 upon movement.

<Embodiment 10>

While the aforementioned TFT 115 has the structure of extending the distance (interboundary distance) between the upper surface of the plug 231 of N-type polysilicon, i.e., the connection part, and the boundary between the channel 7 and the drain 6 by making the central axes of the plugs 232 and 231 deviate from each other, the interboundary distance may alternatively be extended by arbitrarily forming a step part or an irregular part.

Figure 39:
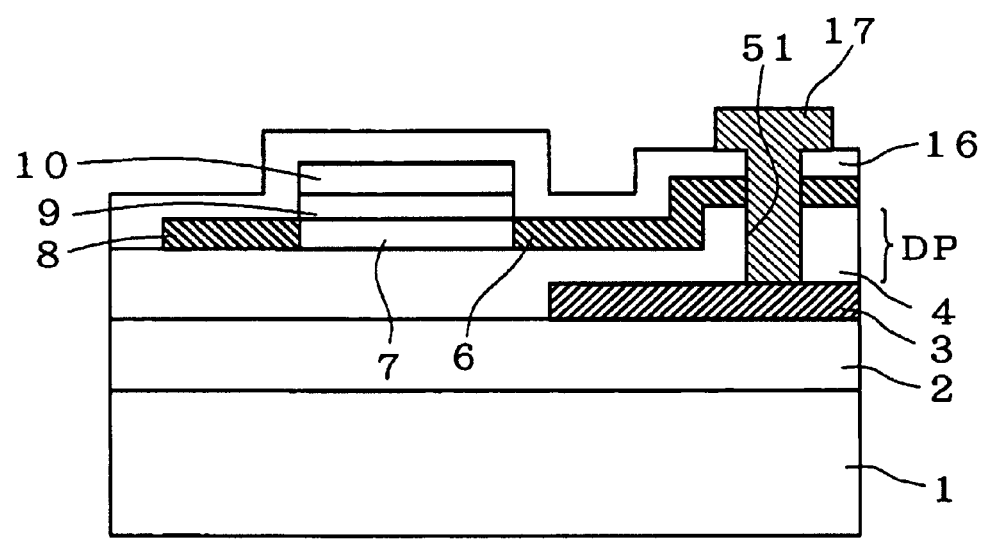
FIG. 39 illustrates the structure of a semiconductor device according to an embodiment 10 of the present invention.
Figure 40:
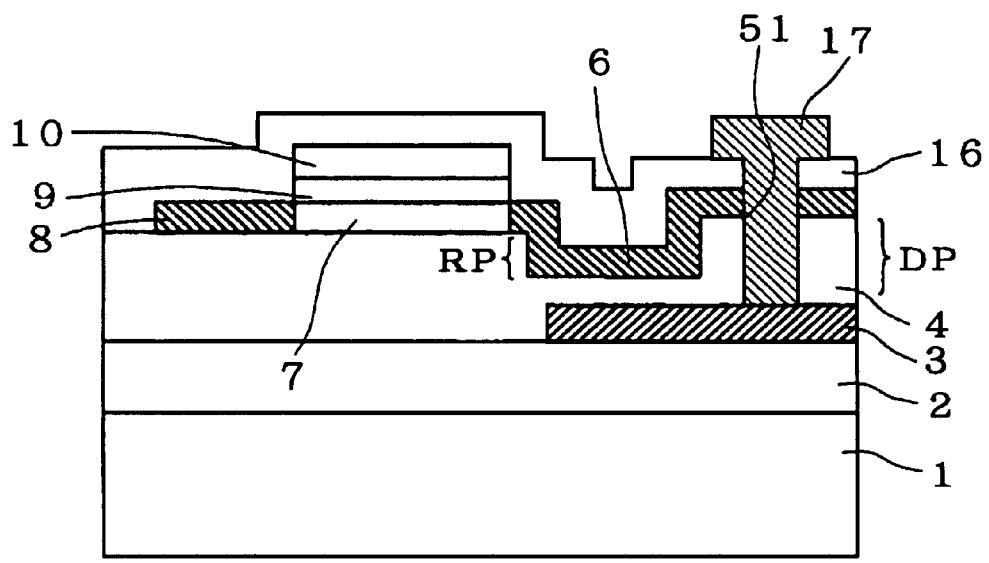
FIG. 40 is a sectional view for illustrating the structure of a modification of the semiconductor device according to the embodiment 10 of the present invention.
Figure 41:
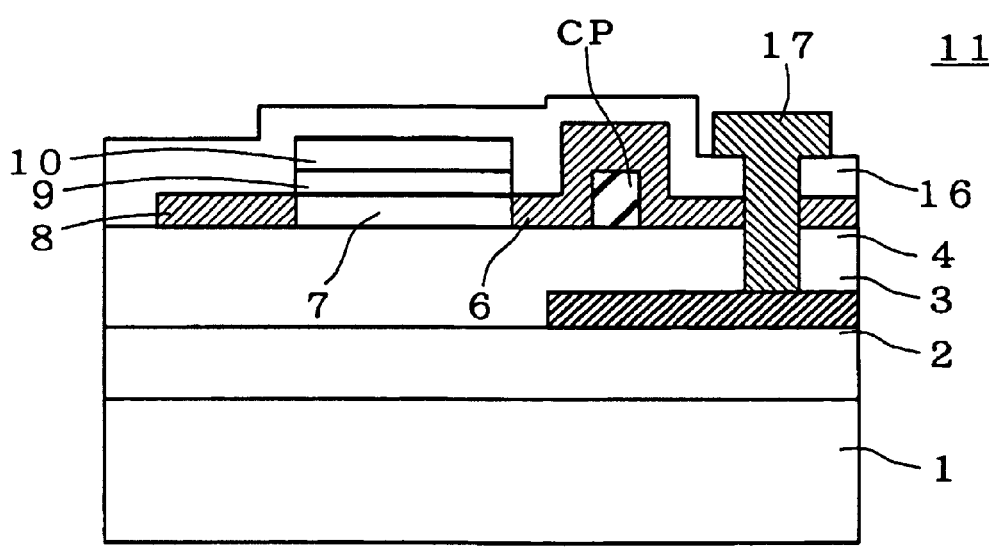
FIG. 41 is a sectional view for illustrating the structure of another modification of the semiconductor device according to the embodiment 10 of the present invention.

FIGS. 39 to 41 show structures of extending interboundary distances in plug contact system TFTs.

<10-1. Structure of TFT 116>

In a TFT 116 shown in FIG. 39, the thickness of a second oxide film 4 is so ununiform that the thickness of a portion close to a connection part between a plug 17 and a pad layer 3 is larger than those of the remaining portions, for defining a step part DP in a direction separating from a major surface of a silicon substrate 1.

A drain 6 is formed to reach the step part DP and a contact hole 51 is formed through the step part DP so that the plug 17 is buried therein, whereby the length of the drain 6 is increased while the distance between the connection part of the plug 17 and the pad layer 3 and the drain 6 is also increased. Thus, the interboundary distance can be extended to reduce influence exerted by phosphorus diffusion from the pad layer 3.

<10-2. Structure of TFT 117>

In a TFT 117 shown in FIG. 40, the thickness of a portion of a second oxide film 4 in the vicinity of a contact part between a plug 17 and a pad layer 3 is increased as compared with those of the remaining portions thereby forming a step part DP in a direction separating from a major surface of a silicon substrate 1, while the thickness of another portion of the second oxide film 4 between the step part DP and a channel 7 is reduced as compared with those of the remaining portions thereby forming a concave part RP.

A drain 6 is formed on the concave part RP and the step part DP and a contact hole 51 is formed through the step part DP so that the plug 17 is buried therein, whereby the length of the drain 6 is further increased and the distance between the contact part of the plug 17 and the pad layer 3 and the drain 6 is also increased, whereby the interboundary distance can be further extended for reducing influence exerted by phosphorus diffusion from the pad layer 3.

<10-3. Structure of TFT 118>

In a TFT 118 shown in FIG. 41, the thickness of a second oxide film 4 is uniform while a convex part CP is provided on a portion of the second oxide film 4 between a plug 17 and a channel 7. The convex part CP can be obtained by forming a nitride film of a prescribed thickness, for example, on the second oxide film 4. Thus, the second oxide film 4 may not be etched and the steps can be simplified.

A drain 6 is formed on the convex part CP and a portion of the second oxide film 4 in the vicinity of a contact part between the plug 17 and a pad layer 3, whereby the length of the drain 6 is further increased and the interboundary distance can be further extended to reduce influence exerted by phosphorus diffusion from the pad layer 3.

While the T-shaped plug 17 is employed in each of the TFTs 116 to 118, a plug which is completely buried in the contact hole 51 or a U-shaped plug may alternatively be employed, as a matter of course.

<Embodiment 11>

Figure 42:
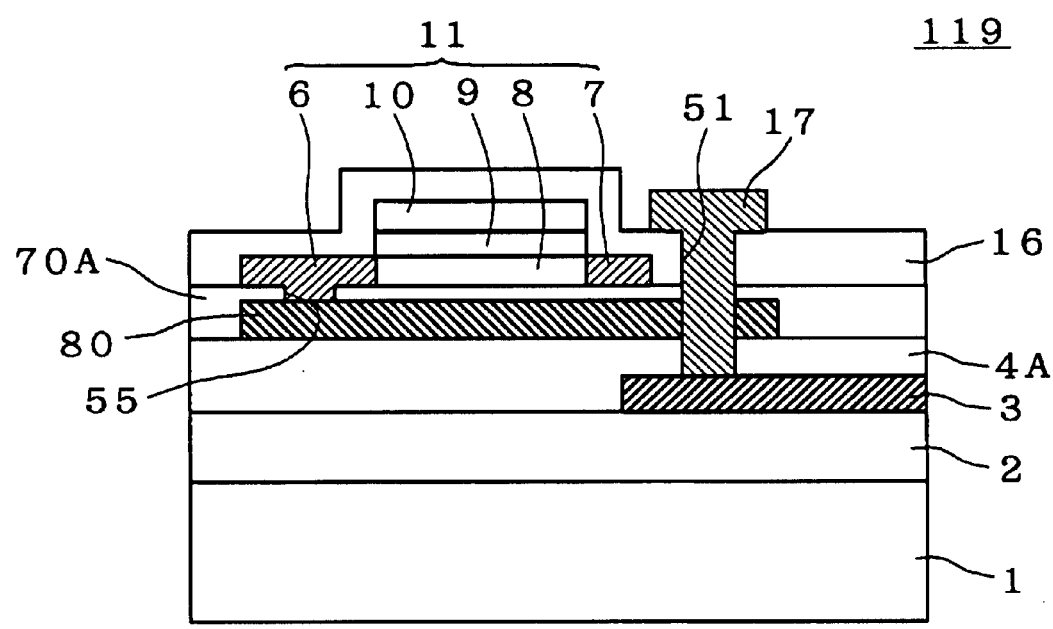
FIG. 42 is a sectional view for illustrating the structure of a semiconductor device according to an embodiment 11 of the present invention.
Figure 43:
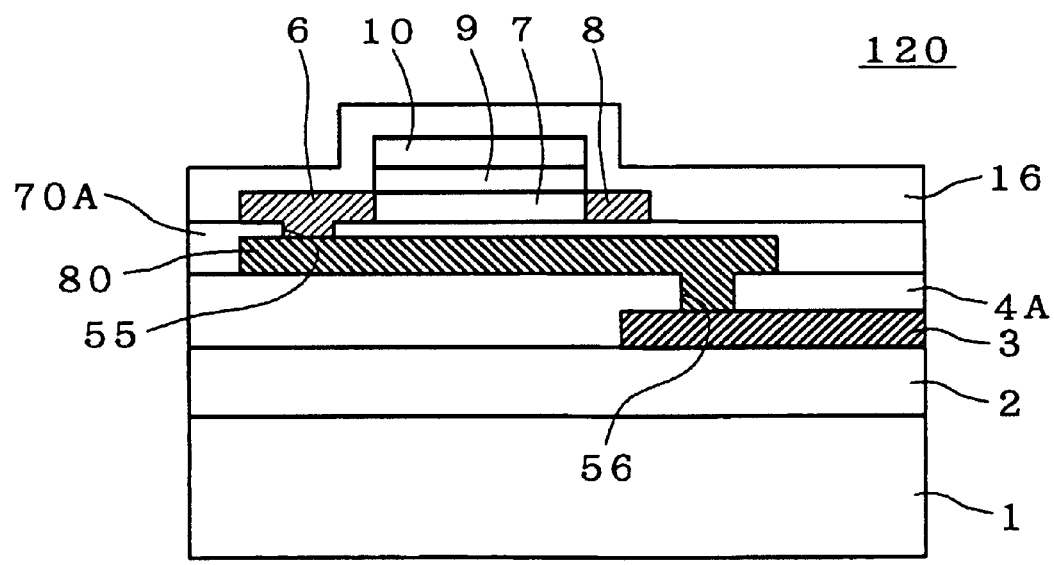
FIG. 43 is a sectional view for illustrating the structure of a modification of the semiconductor device according to the embodiment 11 of the present invention.
Figure 44:
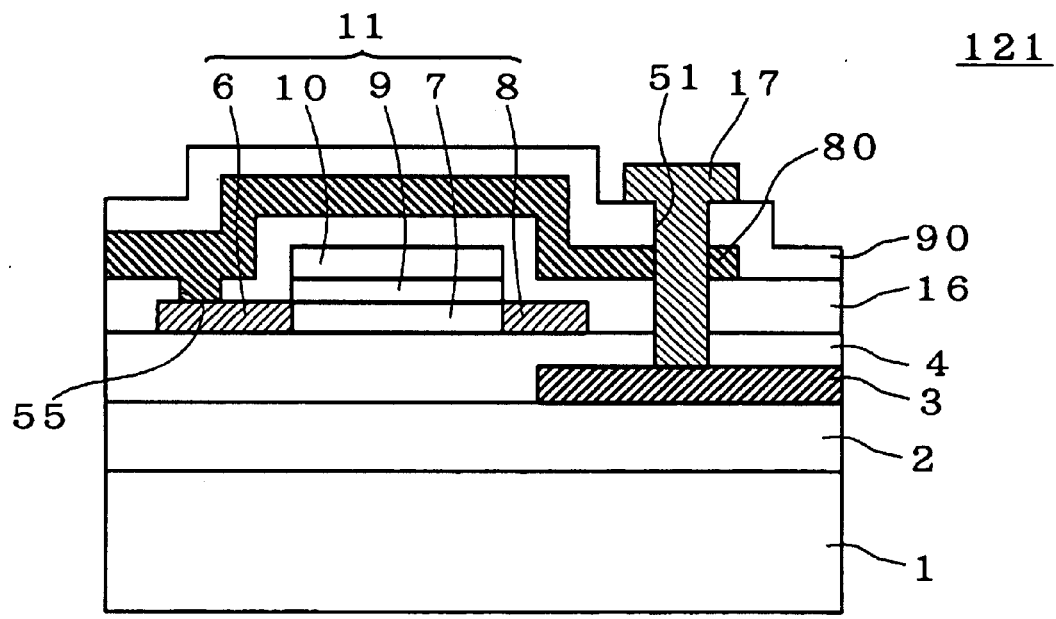
FIG. 44 is a sectional view for illustrating the structure of another modification of the semiconductor device according to the embodiment 11 of the present invention.

While a step part or an irregular part is arbitrarily formed to extend the interboundary distance in each of the aforementioned TFTs 116 to 118, the interboundary distance can also be extended in the following structure. FIGS. 42 to 44 show structures of TFTs 119 to 121 extending interboundary distances.

<11-1. Structure of TFT 119>

In the TFT 119 shown in FIG. 42, an extended polysilicon layer 80 (third polycrystalline semiconductor layer) of P-type polysilicon is formed on a second oxide film 4A (insulating film), and an intermediate oxide film 70A (insulating film) is formed to cover the extended polysilicon layer 80. A TFT main part 11 is formed on an upper portion of the intermediate oxide film 70A, and a third oxide film 16 is formed to cover the TFT main part 11. A drain 6 of the TFT main part 11 is formed on a side which is opposite to that provided with a plug 17 through a channel 7, and the TFT main part 11 is formed on an upper portion of the extended polysilicon layer 80.

A contact hole 51 is formed to reach an upper surface of a pad layer 3 through prescribed positions of a third oxide film 16, the intermediate oxide film 70A, the extended polysilicon layer 80 and a second oxide film 4A, and a plug 17 is buried in this contact hole 51.

On a side which is opposite to the contact hole 51 through the channel 7, another contact hole 55 is formed to reach an upper surface of the extended polysilicon layer 80 through the intermediate oxide film 70A, and a drain 6 is buried in this contact hole 55.

The second oxide film 4A and the intermediate oxide film 70A can be generically referred to as an insulating film, and the extended polysilicon layer 80 can be regarded as being formed in this insulating film.

In such a structure, the extended polysilicon layer 80 is directly in contact with the plug 17 so that the drain 6 and the plug 17 are electrically connected with each other through the extended polysilicon layer 80, and the length of the drain 6 is substantially increased. Thus, the interboundary distance is remarkably extended so that influence exerted by phosphorus diffusion from the pad layer 3 can be reduced.

<11-2. Structure of TFT 120>

While the extended polysilicon layer 80 is connected with the pad layer 3 through the plug 17 in the TFT 119 described with reference to FIG. 42, the extended polysilicon layer 80 may alternatively be directly connected with the pad layer 3.

FIG. 43 shows such a structure as the TFT 120. Referring to FIG. 43, structures identical to those of the TFT 119 are denoted by the same reference numerals, to omit redundant description.

As shown in FIG. 43, a contact hole 56 is formed to reach an upper surface of a pad layer 3 through a prescribed position of a second oxide film 4A, and an extended polysilicon layer 80 is buried in this contact hole 56.

The length of a drain 6 is substantially increased also by this structure, whereby the interboundary distance is remarkably extended and influence exerted by phosphorus diffusion from the pad layer 3 can be reduced.

The extended polysilicon layer 80 is directly connected with the pad layer 3 with no employment of a plug, whereby the contact hole 56 can be readily formed with no necessity for forming a polysilicon film for a plug, and the steps can be simplified.

<11-3. Structure of TFT 121>

While the extended polysilicon layer 80 is formed under the TFT main part 11 in the TFT 119 described with reference to FIG. 42, the extended polysilicon layer 80 may alternatively be formed on the TFT main part 11.

In the TFT 121 shown in FIG. 44, a TFT main part 11 is formed on a second oxide film 4, and a third oxide film 16 (second insulating film) is formed to cover the TFT main part 11. A drain 6 of the TFT main part 11 is formed on a side which is opposite to that provided with a plug 17 through a channel 7.

An extended polysilicon layer 80 of P-type polysilicon is formed on an upper portion of the third oxide film 16 to cover the TFT main part 11, and a fourth oxide film 90 is formed to cover the extended polysilicon layer 80.

A contact hole 51 is formed to reach an upper surface of the pad layer 3 through prescribed positions of the fourth oxide film 90, the extended polysilicon layer 80, the third oxide film 16 and the second oxide film 4, and a plug 17 is buried in this contact hole 51.

On a side which is opposite to the contact hole 51 through the channel 7, another contact hole 55 is formed to reach an upper surface of the drain 6 through the third oxide film 16, and the extended polysilicon layer 80 is buried in this contact hole 55.

In such a structure, the extended polysilicon layer 80 is directly in contact with the plug 17 so that the drain 6 and the plug 17 are electrically connected with each other through the extended polysilicon layer 80, and the length of the drain 6 is substantially increased. Thus, the interboundary distance is remarkably extended so that influence exerted by phosphorus diffusion from the pad layer 3 can be reduced.

<11-4. Structure of TFT 122>

While the extended polysilicon layer 80 is connected with the pad layer 3 through the plug 17 in the TFT 121 described with reference to FIG. 44, the extended polysilicon layer 80 may alternatively be directly connected to the pad layer 3.

Figure 45:
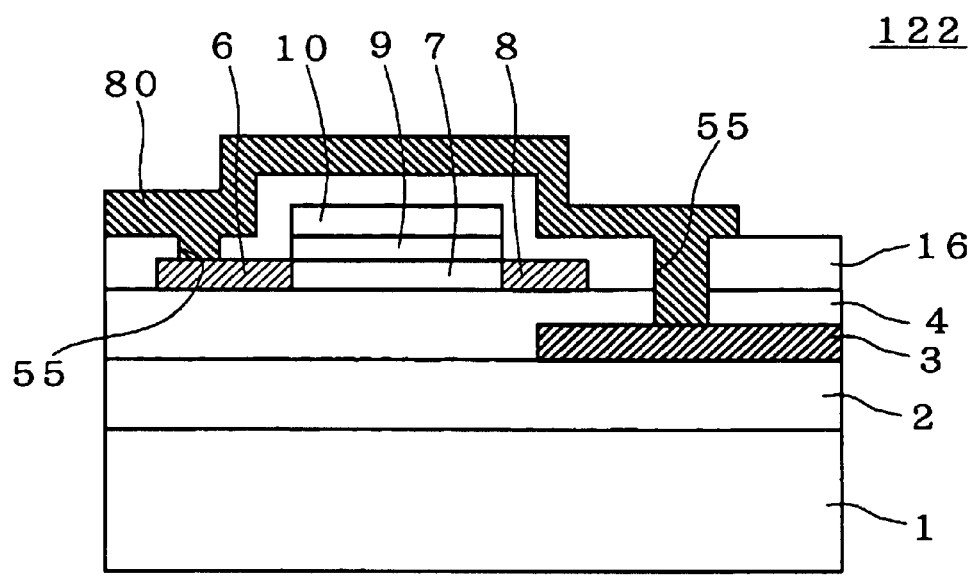
FIG. 45 is a sectional view for illustrating the structure of still another modification of the semiconductor device according to the embodiment 11 of the present invention.

FIG. 45 shows such a structure as a TFT 122. Referring to FIG. 45, structures identical to those of the TFT 121 are denoted by the same reference numerals, to omit redundant description.

Referring to FIG. 45, a contact hole 55 is formed to reach an upper surface of a pad layer 3 through prescribed positions of a third oxide film 16 and a second oxide film 4, and an extended polysilicon layer 80 is buried in this contact hole 55.

Also according to this structure, the length of a drain 6 is substantially increased, the interboundary distance is remarkably extended and influence exerted by phosphorus diffusion from the pad layer 3 can be reduced.

The extended polysilicon layer 80 is directly connected to the pad layer 3 with no employment of a plug, whereby no oxide film may be formed on the extended polysilicon layer 80, no polysilicon film may be formed for a plug, and the steps can be simplified.

<Embodiment 12>

<12-1. Device Structure>

Figure 46:
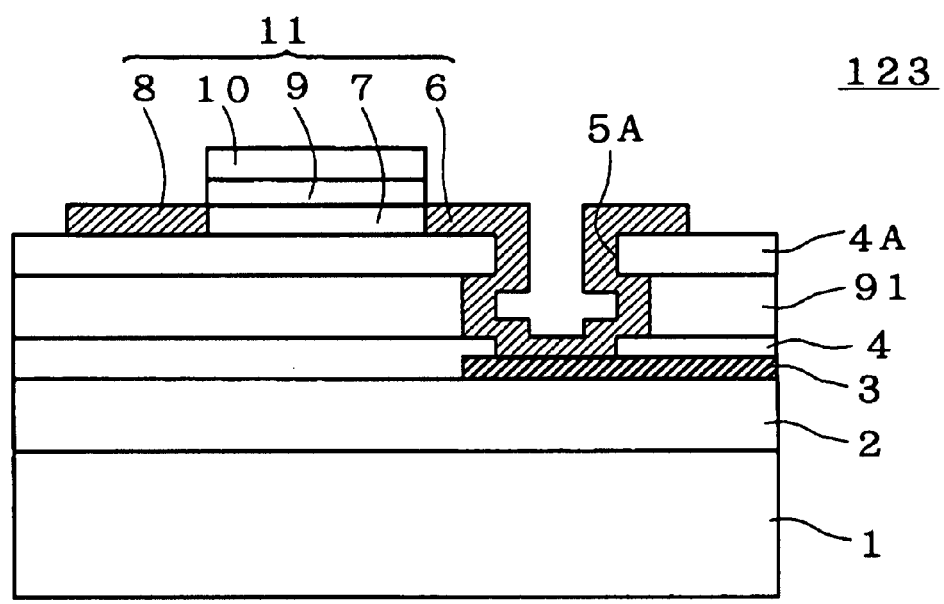
FIG. 46 is a sectional view for illustrating the structure of a semiconductor device according to an embodiment 12 of the present invention.

Also in a direct contact system TFT, an interboundary distance can be extended by the following structure:

In a TFT 123 shown in FIG. 46, an impurity-added oxide film 91 containing an impurity such as boron or phosphorus is formed on an upper portion of a second oxide film 4 (insulating film) covering a first oxide film 2 and a pad layer 3, an oxide film 4A (insulating film) containing no impurity similarly to the second oxide film 4 is formed on an upper portion of the impurity-added oxide film 91, and a TFT main part 11 is formed on an upper portion of the oxide film 4A.

The second oxide film 4 and the oxide film 4A can be generically referred to as an insulating film, and the impurity-added oxide film 91 can be regarded as being formed in this insulating film.

A drain 6 is formed to be connected with the pad layer 3 through a contact hole 5A which is formed to reach an upper surface of the pad layer 3 through the oxide film 4A, the impurity-added oxide film 91 and the second oxide film 4.

The contact hole 5A has an opening dimension which is larger than the remaining portion in the part of the impurity-added oxide film 91, to have an irregular contour shape. The drain 6 is formed along the wall surface of the contact hole 5A, whereby an interboundary distance (the drain length in this case) is extended and influence exerted by phosphorus diffusion from the pad layer 3 can be reduced.

<12-2. Fabrication Method>

The shape having a larger opening dimension in the part of the impurity-added oxide film 91 can be attained by forming a hole reaching the pad layer 3 by anisotropic etching and thereafter further performing wet etching with hydrofluoric acid in formation of the contact hole 5A.

The impurity-added oxide film 91 is at a higher wet etching rate and further remarkably corroded with hydrofluoric acid as compared with the oxide film 4A and the second oxide film 4.

<Embodiment 13>

In order to prevent N-type conversion of a drain caused by diffusion of phosphorus from an N-type pad layer, an impurity infiltration preventing structure may be provided for preventing infiltration of phosphorus from the pad layer in the drain.

A structure including a sink layer for absorbing phosphorus as an impurity infiltration preventing structure is now described.

<13-1. Device Structure>

Figure 47:
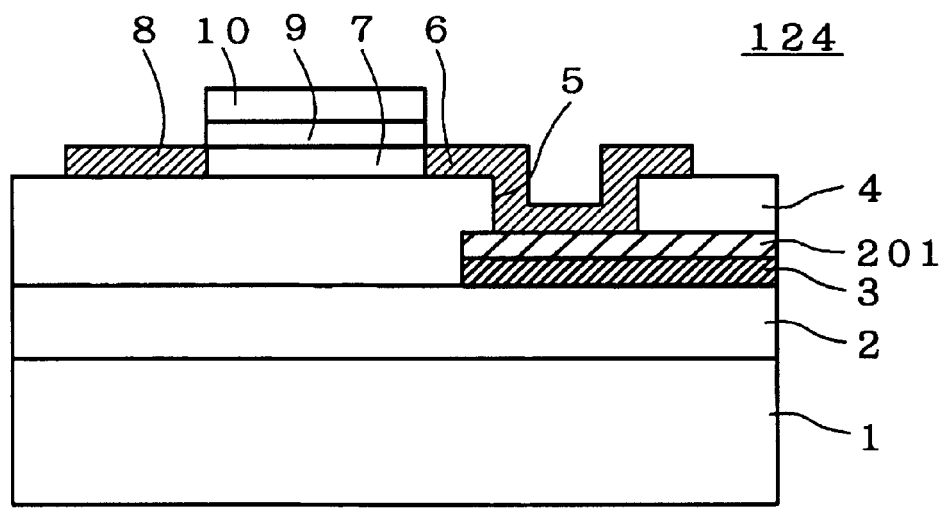
FIG. 47 is a sectional view for illustrating the structure of a semiconductor device according to an embodiment 13 of the present invention.

A TFT 124 shown in FIG. 47 includes a tungsten silicide film (WSi film) 201 provided as a sink layer on an upper portion of a pad layer 3, a contact hole 5 is formed to reach a surface of the WSi film 201 through a second oxide film 4, and a drain 6 is connected to the WSi film 201 through the contact hole 5. Structures identical to those of the TFT 101 described with reference to FIG. 1 are denoted by the same reference numerals, to omit redundant description.

The WSi film 201, having a property of absorbing an impurity such as phosphorus, is superposed on the pad layer 3 for absorbing phosphorus which is diffused from the pad layer 3, whereby infiltration of phosphorus into the drain 6 can be suppressed. The thickness of the WSi film 201 may be at least 50 nm.

In place of the WSi film 201, an amorphous silicon film or a fine-grain polysilicon film having small grain diameters of not more than 100 Å may be employed.

An amorphous silicon film or a fine-grain polysilicon film has a property of incorporating an impurity in grain boundaries therein. When such a film is formed on the pad layer 3, therefore, phosphorus is incorporated in the grain boundaries, to infiltrate into the drain 6.

Fine-grain polysilicon can be obtained by implanting impurity ions of silicon, N (nitrogen), O (oxygen) or B (boron) into polysilicon which is prepared by CVD by ion implantation in a density of $1 \times 10^{16}$ cm$^{-2}$, for example, for further refining silicon crystals.

In order to prevent excess reduction of the phosphorus concentration in the pad layer 3 due to provision of the aforementioned sink layer on the pad layer 3, the phosphorus concentration must be previously set at a higher value as compared with a structure provided with no sink layer. This also applies to the drain 6.

<13-1. Modification 1>

While the TFT 124 described with reference to FIG. 47 includes the sink layer provided on the upper portion of the pad layer 3, a similar function/effect can be attained also in a structure including a sink layer provided on a lower portion of the pad layer 3.

When the WSi film 201 is employed as the sink layer, however, inconvenience may result from combination with the WSi film 201 depending on the type of a film which is formed on its lower portion. While a gate oxide film is formed on the lower portion of the WSi film 201 when the WSi film 201 is employed also as a gate electrode of a MOS transistor which is formed in the surface of the silicon substrate 1, for example, a problem such as reduction of the withstand voltage of the gate oxide film caused by stress or the like may result if the WSi film 201 is directly in contact with the gate oxide film.

Figure 48:
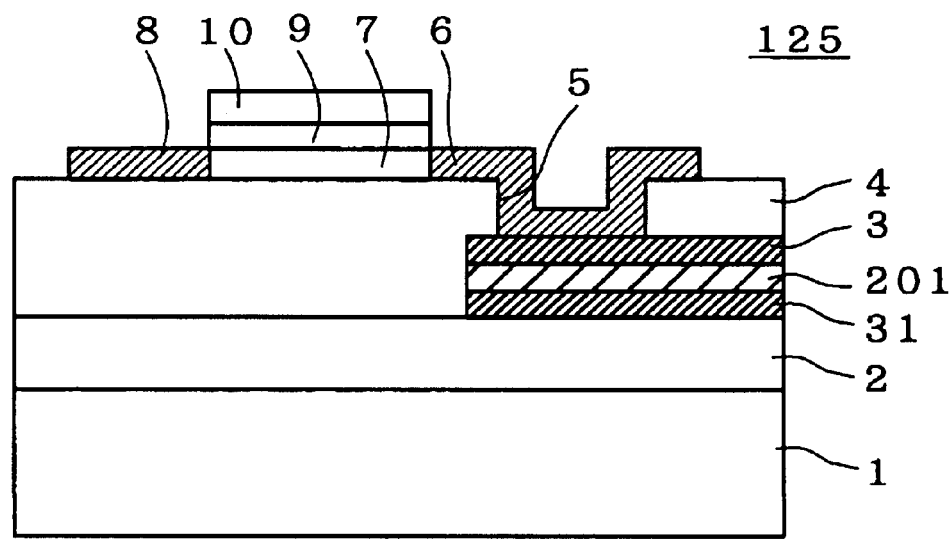
FIG. 48 is a sectional view for illustrating the structure of a modification of the semiconductor device according to the embodiment 13 of the present invention.

In a TFT 125 shown in FIG. 48, a WSi film 201 is provided on a lower portion of a pad layer 3 of N-type polysilicon, while another pad layer 31 (third polycrystalline semiconductor layer) of N-type polysilicon is also formed on the lower portion of the WSi film 201.

Either one of the pad layers 3 and 31, which are identical to each other, may be formed on or under the WSi film 201.

Due to this structure, occurrence of the aforementioned problem can be prevented when the WSi film 201 is also employed as a gate electrode of a MOS transistor which is formed in a surface of a silicon substrate 1, since the pad layer 31 of N-type polysilicon is interposed between the WSi film 201 and a gate oxide film (not shown) provided in the silicon substrate 1.

Further, boron which is an impurity contained in the drain 6 is prevented from being absorbed by the WSi film 201 since the pad layer 3 is interposed between the WSi film 201 and the drain 6.

<13-3. Modification 2>

While the TFJ 125 described with reference to FIG. 48 includes the pad layers 3 and 31 of N-type polysilicon provided on the upper and lower portions of the WSi film 201, the pad layer which is formed on the upper portion of the WSi film 201 may not be made of N-type polysilicon.

Figure 49:
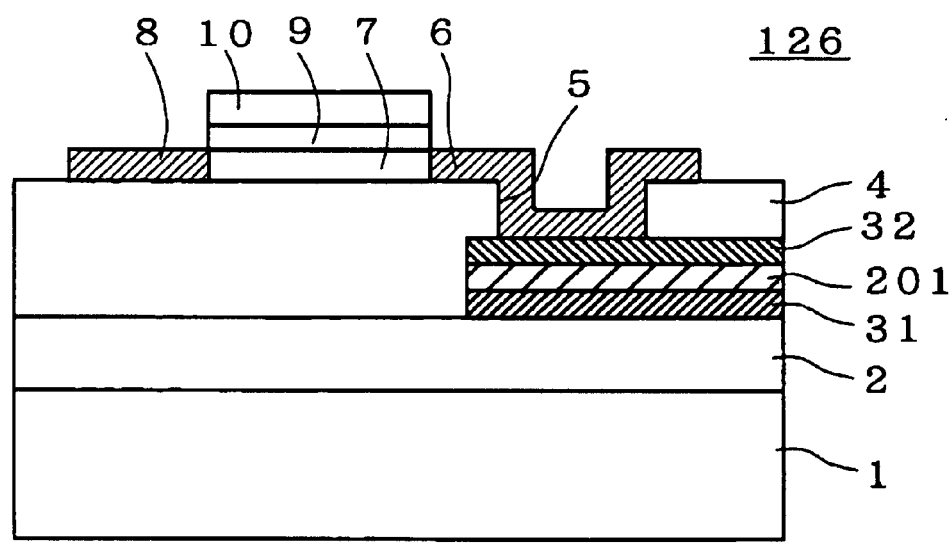
FIG. 49 is a sectional view for illustrating the structure of another modification of the semiconductor device according to the embodiment 13 of the present invention.

For example, a pad layer 32 (third polycrystalline semiconductor layer) of P-type polysilicon may be formed on an upper portion of a WSi film 201, as in a TFT 126 shown in FIG. 49. An effect similar to that of the TFT 125 can be attained also in this case.

<13-4. Modification 3>

While the contact hole 5 is formed to reach the surface of the WSi film 201 and the drain 6 is connected with the WSi film 201 through the contact hole 5 in the TFT 124 described with reference to FIG. 47, the drain 6 may alternatively be directly in contact with the pad layer 3.

Figure 50:
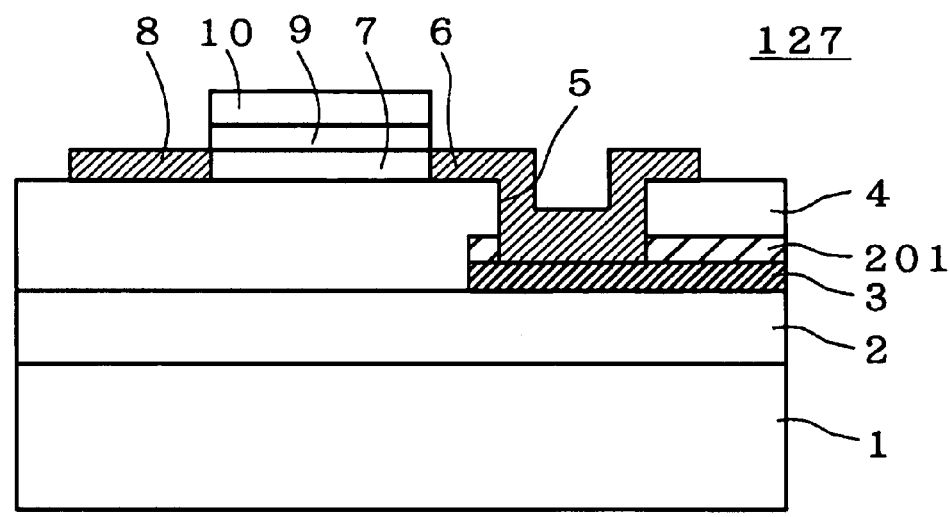
FIG. 50 is a sectional view for illustrating the structure of still another modification of the semiconductor device according to the embodiment 13 of the present invention.

For example, a contact hole 5 may be formed to reach a surface of a pad layer 3 through a second oxide film 4 and a WSi film 201 so that the drain 6 is in contact with the pad layer 3, as in a TFT 127 shown in FIG. 50. The WSi film 201 comes into contact with the drain 6 also in such a structure, N-type conversion of the drain 6 can be suppressed by absorbing phosphorus diffused from the pad layer 3.

<Embodiment 14>

A structure including an infiltration inhibition layer for inhibiting infiltration of phosphorus as an impurity infiltration preventing structure is described.

<14-1. Device Structure>

Figure 51:
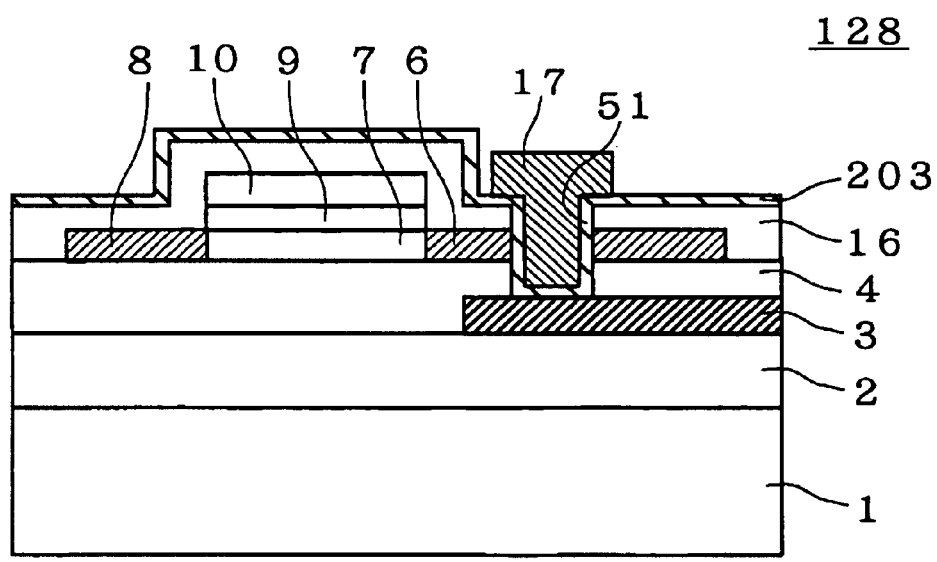
FIG. 51 is a sectional view for illustrating the structure of a semiconductor device according to an embodiment 14 of the present invention.

A TFT 128 shown in FIG. 51 includes a silicon nitride film (SiN film) 203 as an infiltration inhibition layer. This silicon nitride film 203 has a thickness of 1 to 10 nm, and is formed along overall regions of contact surfaces of a pad layer 3 and a plug 17, a wall surface of a contact hole 51 and an upper surface of a third oxide film 16. Structures identical to those of the TFT 106 described with reference to FIG. 18 are denoted by the same reference numerals, to omit redundant description.

An SiN film originally has an electric insulating property, with a property of transmitting no impurity such as boron or phosphorus. If the thickness of the SiN film is not more than 10 nm, however, the film passes electrons and holes due to a tunnel phenomenon, to have electric conductivity. When the film thickness is not more than 1 nm, on the other hand, the film transmits impurity atoms of phosphorus or the like. When the film thickness is within the range of 1 to 10 nm, therefore, the film can be regarded as having electric conductivity with a property of inhibiting movement of an impurity such as phosphorus.

When the SiN film 203 is formed as shown in FIG. 51, this film 203 is interposed in two portions of the connection surface between the pad layer 3 and the plug 17 and that between the plug 17 and the drain 6 in the contact hole 51, whereby phosphorus from the pad layer 3 can be reliably prevented from infiltrating into the drain 6.

Further, the SiN film 203 completely covers a leg portion of the plug 17, whereby the plug 17 may be made not of P-type polysilicon but of N-type polysilicon.

<14-2. Modification 1>

While the SiN film 203 is interposed in two portions between the contact surfaces of the pad layer 3 and the plug 17 and between the plug 17 and the drain 6 in the contact hole 51 in the TFT 128 described with reference to FIG. 51, the SiN film 203 may alternatively be interposed between the contact surfaces of the pad layer 3 and the plug 17.

Figure 52:
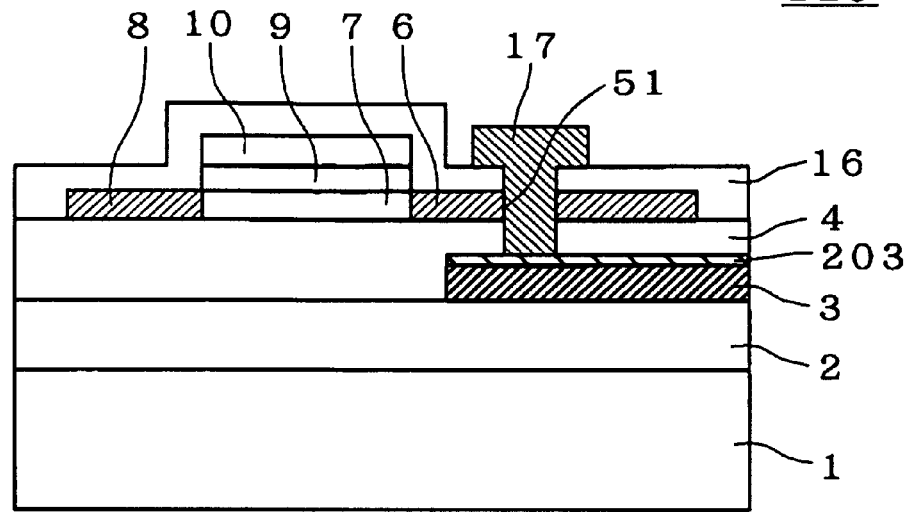
FIG. 52 is a sectional view for illustrating the structure of a modification of the semiconductor device according to the embodiment 14 of the present invention.

As in a TFT 129 shown in FIG. 52, for example, an SiN film 203 may be formed only on an upper portion of a pad layer 3 so that a contact hole 51 is formed to reach a surface of the SiN film 203 and a plug 17 is in contact with the SiN film 203.

Also in this structure, phosphorus from the pad layer 3 is prevented from infiltrating into the plug 17, whereby N-type conversion of a drain 6 can be prevented.

While the SiN film 203 has electric conductivity, its resistance value is unnegligible. In particular, such an SiN film interposed in a number of portions of a current path influences operation characteristics of a TFF. In the TFT 129, however, the SiN film 203 is interposed only between the contact surfaces of the pad layer 3 and the plug 17, and hence influence exerted by its electric resistance is small.

<14-3. Modification 2>

While the TFT 129 described with reference to FIG. 52 includes the SiN film 203 on the upper portion of the pad layer 3 of N-type polysilicon and the plug 17 is connected to the SiN film 203, the following structure may alternatively be employed.

Figure 53:
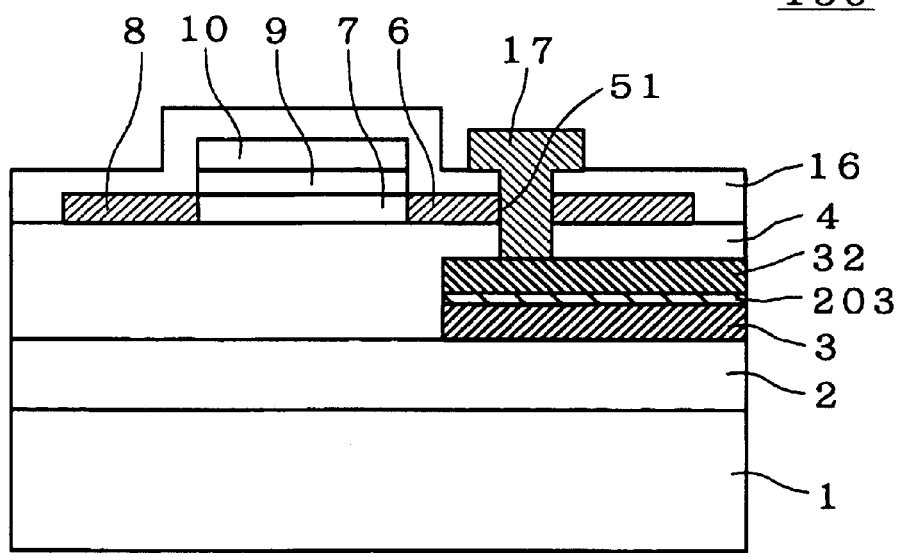
FIG. 53 is a sectional view for illustrating the structure of another modification of the semiconductor device according to the embodiment 14 of the present invention.

As in a TFT 130 shown in FIG. 53, a pad layer 32 (fourth polycrystalline semiconductor layer) of P-type polysilicon may be further provided on an upper portion of an SiN film 203 so that a plug 17 is connected to this pad layer 32. A function/effect similar to that of the TFT 129 can be attained also in such a structure.

In this structure, further, the SiN film 203 is connected to the pad layer 32 having an equivalent area, whereby contact resistance can be reduced as compared with the case of directly connecting the SiN film 203 to the plug 17.

<14-4. Modification 3>

While the pad layer 32 of P-type polysilicon is formed on the upper portion of the SiN film 203 for connecting the plug 17 of P-type polysilicon in the TFT 130 described with reference to FIG. 53, WSi containing boron may alternatively be employed in place of the plug 17 and the pad layer 32 of P-type polysilicon.

Figure 54:
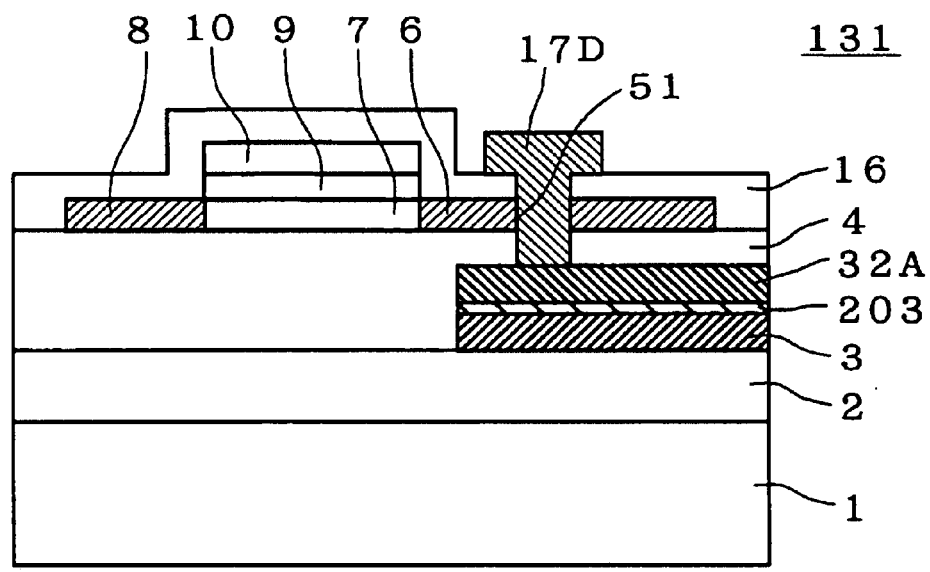
FIG. 54 is a sectional view for illustrating the structure of still another modification of the semiconductor device according to the embodiment 14 of the present invention.

As in a TFT 131 shown in FIG. 54, a pad layer 32A (second tungsten silicide layer) of boron-added WSi may be formed on an upper portion of an SiN film 203 to be connected with a plug 17D (first tungsten silicide layer) of boron-added WSi.

Boron is added to WSi, in order to prevent WSi from absorbing boron contained in a drain 6 and reducing the boron concentration of the drain 6.

Boron-added WSi can be prepared by adding $B_2H_6$ gas into CVD gas in deposition of a WSi film by CVD.

<14-5. Modification 4>

While each of the aforementioned TFTs 128 to 131 includes the SiN film 203 as an infiltration inhibition layer, the infiltration inhibition layer may alternatively be formed by an oxide film (silicon oxide film). In this case, the proper thickness of the oxide film is 0.5 to 5 nm.

Further alternatively, a two-layer film of an oxide film and a nitride film, or an oxy-nitride ($SiO_XN_Y$) film which is a composite film of an oxide film ($SiO_2$) and a nitride film (SiN) may be employed.

<Embodiment 15>

A structure including an infiltration inhibition layer for inhibiting infiltration of phosphorus as an impurity infiltration preventing structure is described.

<15-1. Device Structure>

Figure 55:
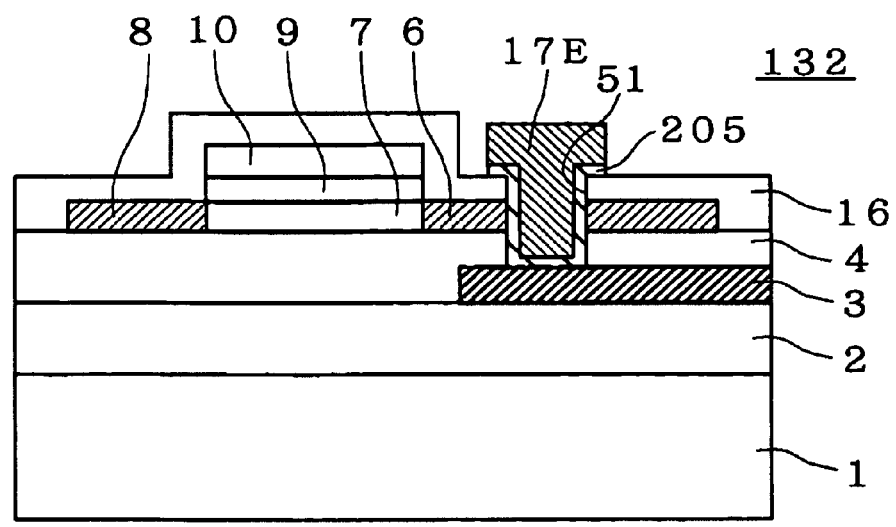
FIG. 55 is a sectional view for illustrating the structure of a semiconductor device according to an embodiment 15 of the present invention.

A TFT 132 shown in FIG. 55 includes a titanium nitride (TiN) film 20 as an infiltration inhibition layer, and electrical connection between a drain 6 and a pad layer 3 is attained by a plug 17E of tungsten.

Referring to FIG. 55, the TiN film 205 is formed over contact surfaces of the pad layer 3 and the plug 17E, a wall surface of a contact hole 51 and a lower surface of a head portion of the plug 17E. Structures identical to those of the TFT 106 described with reference to FIG. 18 are denoted by the same reference numerals, to omit redundant description.

The TiN film 205 of a dense structure has a higher function as compared with a film of another material such as the aforementioned SiN film or an oxide film for serving as a diffusion barrier against impurity atoms of phosphorus or the like, and can more reliably prevent infiltration of phosphorus from the pad layer 3.

Further, the TiN film 205 also has a function for serving as a barrier metal for preventing tungsten forming the plug 17E from being diffused in the pad layer 3 or a drain 6 of polysilicon.

<15-2. Fabrication Method>

Figure 56:
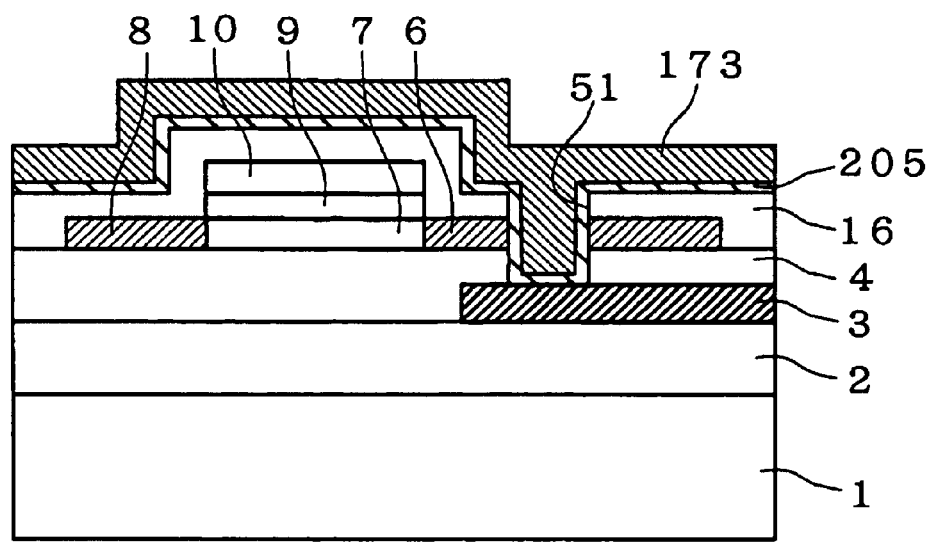
FIG. 56 illustrates a step of fabricating the semiconductor device according to the embodiment 15 of the present invention.

A method of fabricating the TFT 132 is now described with reference to FIG. 56. Referring to FIG. 56, steps up to formation of the contact hole 51 are identical to those of the fabrication steps for the TFT 106 described with reference to FIG. 19, and hence redundant description is omitted.

As shown in FIG. 56, a TiN film 205 is formed by CVD over an upper portion of a third oxide film 16 and in the contact hole 51. The TiN film 205, which can be relatively increased in thickness due to lower electric resistance than an SiN film or an oxide film, is formed in a thickness of 10 to 100 nm. Then, a tungsten film 173 is formed on the overall upper surface of the TiN film 205 by CVD.

The tungsten film 173 and the TiN film 205 are worked into prescribed patterns by lithography, thereby obtaining the TFT 132 shown in FIG. 55.

<15-3. Modification 1>

While the TiN film 205 is interposed in two portions between contact surfaces of the pad layer 3 and the plug 17E and between those of the plug 17E and a drain 6 in the contact hole 51 in the TFT 132 described with reference to FIG. 55, the TiN film 205 may alternatively be interposed between the contact surfaces of the pad layer 3 and the plug 17E.

Figure 57:
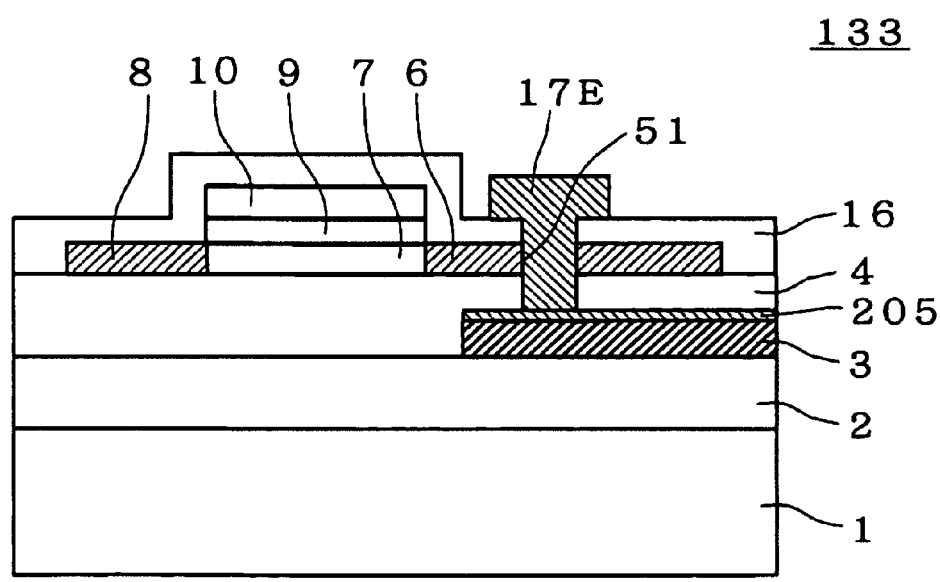
FIG. 57 is a sectional view for illustrating the structure of a modification of the semiconductor device according to the embodiment 15 of the present invention.

As in a TFT 133 shown in FIG. 57, for example, a TiN film 205 may be formed only on an upper portion of a pad layer 3 so that a contact hole 51 is formed to reach a surface of the TiN film 205 and a plug 17E is in contact with the TiN film 205.

Also in this structure, phosphorus from the pad layer 3 is prevented from infiltrating into the plug 17E, whereby a drain 6 can be prevented from N-type conversion.

In this structure, further, the pad layer 3 of N-type polysilicon and the drain 6 of P-type polysilicon are connected with each other through the TiN film 205 and the plug 17E of metals, whereby no portion defines P-N junction but excellent ohmic connection is attained so that contact resistance can be reduced.

<15-4. Modification 2>

While the plug 17E is a T-shaped plug having head and leg portions of tungsten in each of the aforementioned TFTs 132 and 133, the head portion may alternatively be made of another material.

Figure 58:
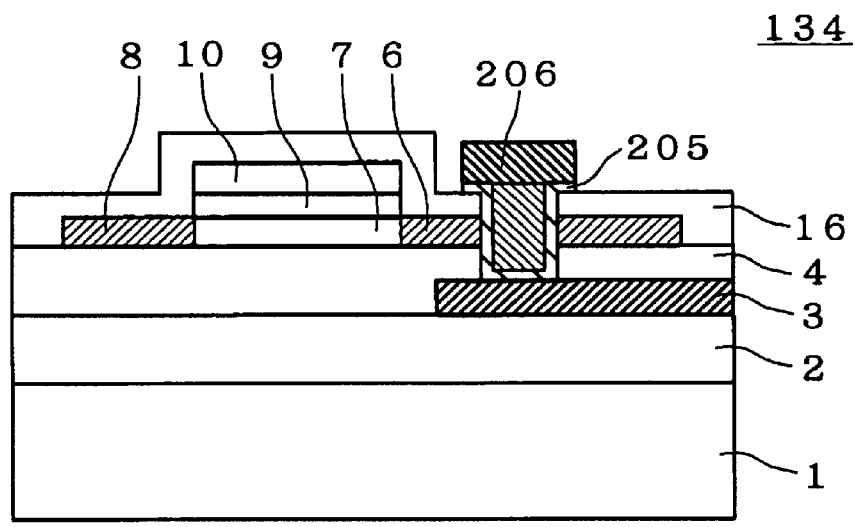
FIG. 58 is a sectional view for illustrating the structure of another modification of the semiconductor device according to the embodiment 15 of the present invention.

As in a TFT 134 shown in FIG. 58, a portion upwardly projecting beyond a third oxide film 16 may be formed by an aluminum silicon film (AlSi film) 206, for example.

In a method of fabricating this TFT 134, a portion corresponding to the head portion of the plug 17E may also be removed in the step of working the TiN film 205 and the tungsten film 173 into prescribed patterns by lithography in the steps of fabricating the TFT 132 described with reference to FIG. 56 so that the AlSi film 206 is deposited by sputtering in place and worked into a prescribed pattern by lithography. In this case, not only the head portion of the plug 17E but the TiN film 205 provided on the lower portion thereof may simultaneously be removed.

In such a structure, the plug 17E can be connected with a contact part (metal contact part) of another element through the AlSi film 206, and the fabrication steps can be simplified.

The aforementioned AlSi film 205 may be replaced with an AlCu film or a Cu film.

<15-5. Modification 3>

While the plug 17E is adapted to electrically connect the drain 6 and the pad layer 3 with each other in each of the aforementioned TFTs 132 to 134, the fabrication steps can be simplified by forming a contact part (metal contact part) for connecting another element (e.g., a MOS transistor) which is formed on a silicon substrate 1 with a wiring layer in the same step as the plug 17E.

Figure 59:
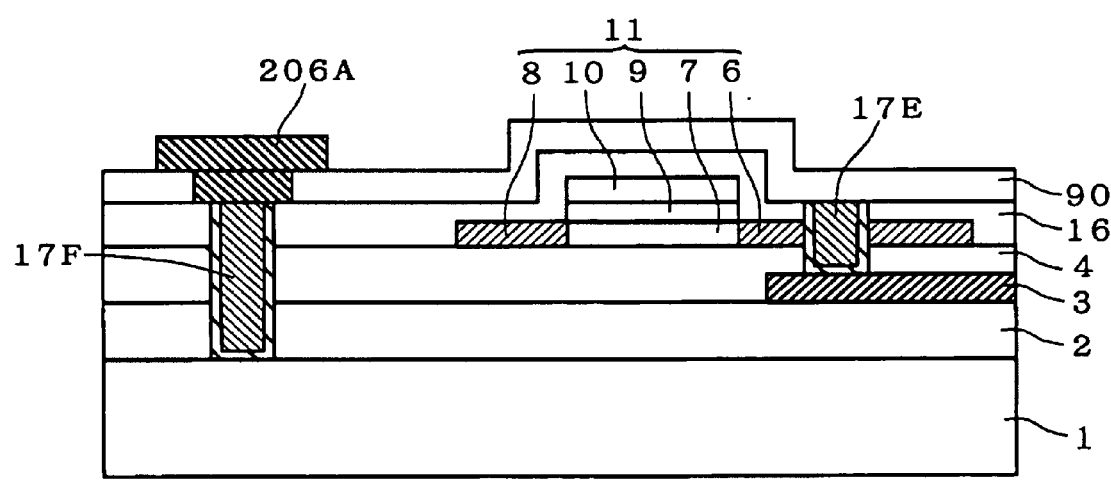
FIG. 59 is a sectional view for illustrating the structure of still another modification of the semiconductor device according to the embodiment 15 of the present invention.

FIG. 59 shows such an example. Referring to FIG. 59, a fourth oxide film 90 is formed on a plug 17E from which a head portion is removed and a third oxide film 16. A plug 17F is formed on a position separating from a TFT main part 11, to reach a silicon substrate 1 through third, second and first oxide films 16, 4 and 2. An AlSi film 206A which is formed through the fourth oxide film 90 is connected to an upper portion of the plug 17F. The plug 17F is similar in structure to the plug 17E, and can be formed by a similar step.

<Embodiment 16>

A structure including an infiltration inhibition layer for inhibiting infiltration of phosphorus as an impurity infiltration preventing structure is described.

<16-1. Device Structure>

Figure 60:
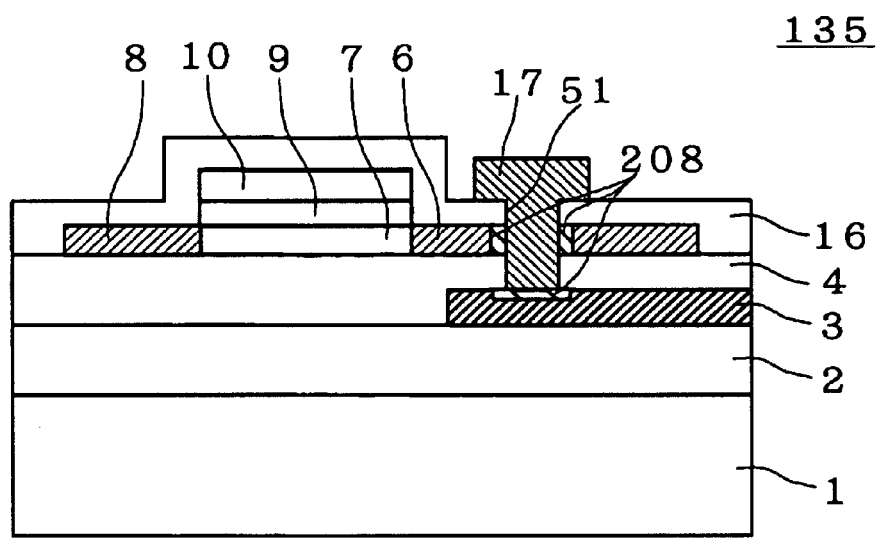
FIG. 60 is a sectional view for illustrating the structure of a semiconductor device according to an embodiment 16 of the present invention.

A TFT 135 shown in FIG. 60 includes a TiSi film 208 having a surface of a TiSiN alloy layer as an infiltration inhibition layer. The TiSi film 208 is formed to be interposed only between contact surfaces of a pad layer 3 and a plug 17 and between those of a plug 17 and a drain 6 in a contact hole 51. Structures identical to those of the TFT 106 described with reference to FIG. 18 are denoted by the same reference numerals, to omit redundant description.

The TiSiN alloy layer is a conductor having a property of transmitting no impurity such as boron or phosphorus. When the TiSi film 208 is formed on the position shown in FIG. 60, therefore, phosphorus from the pad layer 3 can be reliably prevented from infiltrating into the drain 6.

Further, the TiSi film 208 is interposed between the contact surfaces of the pad layer 3 and the plug 17 and between those of the plug 17 and the drain 6 in the contact hole 51, whereby the plug 17 may be made not if P-type polysilicon but of N-type polysilicon.

<16-2. Fabrication Method>

Figure 61:
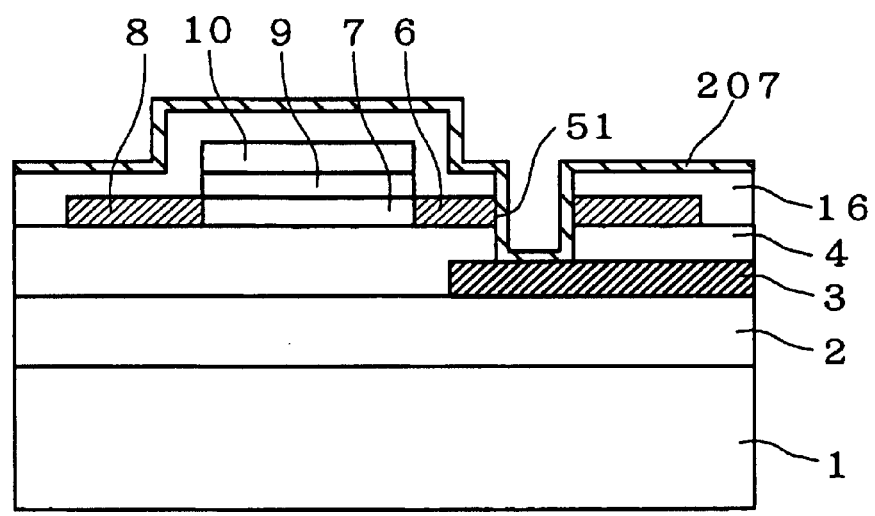
FIG. 61 illustrates a step of fabricating the semiconductor device according to the embodiment 16 of the present invention.

A method of fabricating the TFT 135 is now described with reference to FIG. 61. Referring to FIG. 61, steps up to formation of the contact hole 51 are identical to those of the fabrication steps for the TFT 106 described with reference to FIG. 19, and hence redundant description is omitted.

As shown in FIG. 61, a Ti film 207 is deposited over an upper portion of the third oxide film 16 and in the contact hole 51 by sputtering in a thickness of 50 nm.

Then, heat treatment is performed at 700° C. by lamp annealing for silicifying the contact surfaces of the drain 6 exposed in the contact hole 51 and the Ti film 207 and those of the pad layer 3 and the Ti film 207, and a non-silicified part of the Ti film 207 is removed by aqueous ammonia.

Then, annealing is performed in an ammonia atmosphere for altering the silicified surface of the Ti film 207 to a TiSiN alloy layer, thereby forming the TiSi film 208 (see FIG. 60) having the surface of a TiSiN alloy layer.

A boron-added polysilicon film is formed over an upper portion of the third oxide film 16 and in the contact hole 51 and thereafter worked into a prescribed pattern by lithography, thereby obtaining the TFT 135 shown in FIG. 60.

<16-3. Modification>

While the TiSi film 208 having the surface of a TiSiN alloy layer is interposed between the contact surfaces of the pad layer 3 and the plug 17 and between those of the plug 17 and the drain 6 in the contact hole 51 in the TFT 135 described with reference to FIG. 60, the TiSi film 208 having the surface of a TiSiN alloy layer may alternatively be interposed only between the contact surfaces of the pad layer 3 and the plug 17.

Figure 62:
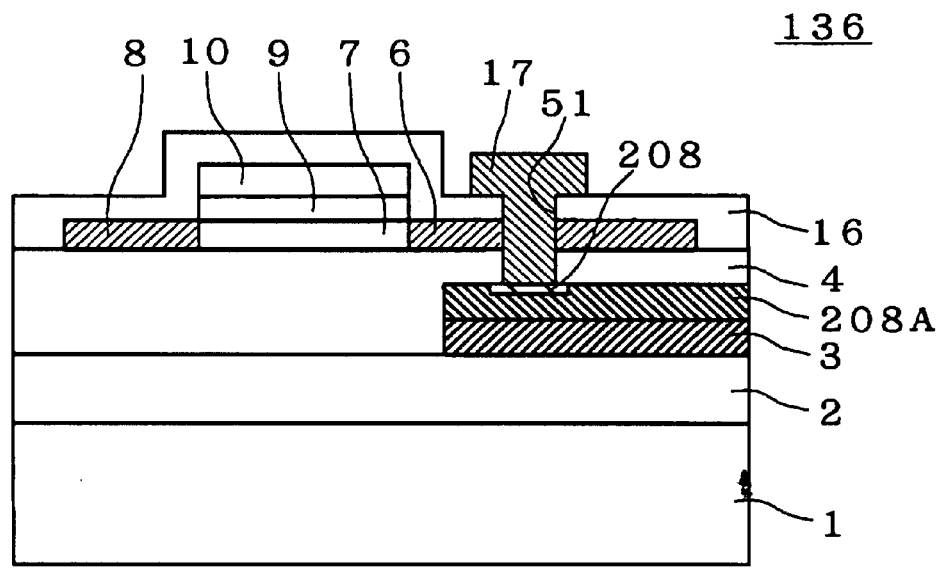
FIG. 62 illustrates the structure of a modification of the semiconductor device according to the embodiment 16 of the present invention.

As in a TFT 136 shown in FIG. 62, for example, a TiSi film 208A may be provided on an upper portion of a pad layer 3 so that a TiSi film 208 having a surface of a TiSiN alloy layer is formed only between contact surfaces of the TiSi film 208A and a plug 17 and the plug 17 is in contact with the TiSi film 208.

Also in such a structure, phosphorus from the pad layer 3 can be prevented from infiltrating into the plug 17, and N-type conversion of a drain 6 can be prevented while the steps can be simplified as compared with fabrication of the TFT 135.

Namely, the TiSi film 208A is formed on the upper portion of the pad layer 3, and thereafter a contact hole 51 reaching the surface of the TiSi film 208A is formed through the same step as that for the TFT 106 described with reference to FIG. 19. Then, annealing is performed in an ammonia atmosphere, thereby altering the exposed surface of the TiSi film 208A to a TiSiN alloy layer.

Thus, it is not necessary to form a TiSi film in the contact hole 51, whereby the steps can be simplified.

<Embodiment 17>

A structure including an infiltration inhibition layer inhibiting infiltration of phosphorus as an impurity infiltration preventing structure is described.

<17-1. Device Structure>

Figure 63:
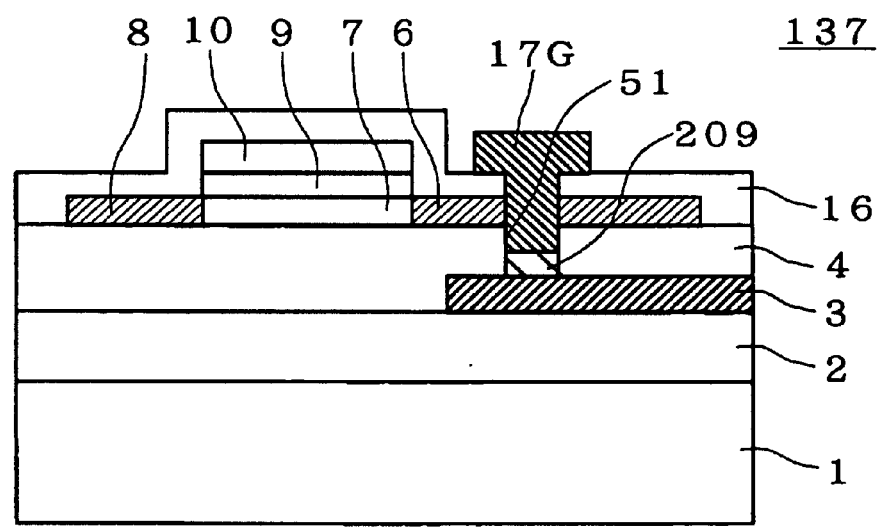
FIG. 63 is a sectional view for illustrating the structure of an embodiment 17 of the present invention.

A TFT 137 shown in FIG. 63 includes a titanium nitride (TiN) film 209 as an infiltration inhibition layer, and electrical connection between a drain 6 and a pad layer 3 is attained by a plug 17G of TiSi.

Referring to FIG. 63, the TiN film 209 is formed on contact surfaces of the pad layer 3 and the plug 17G. Structures identical to those of the TFT 106 described with reference to FIG. 18 are denoted by the same reference numerals, to omit redundant description.

The TiN film 209 of a dense structure has a higher function as compared with a film of another material such as the aforementioned SiN film or an oxide film for serving as a diffusion barrier against impurity atoms of phosphorus or the like, and can more reliably prevent infiltration of phosphorus from the pad layer 3.

As to the fabrication method, a contact hole is formed, thereafter a TiN film is deposited on the overall surface for filling up the contact hole, thereafter etching is performed to leave the TiN film only on the bottom portion of the contact hole, a TiSi film is deposited on the overall surface, and thereafter worked into a prescribed pattern by lithography, for obtaining the TFT 137 shown in FIG. 63.

<17-2. Modification>

Also in a direct contact system TFT, a similar effect can be attained by applying a similar structure.

Figure 64:
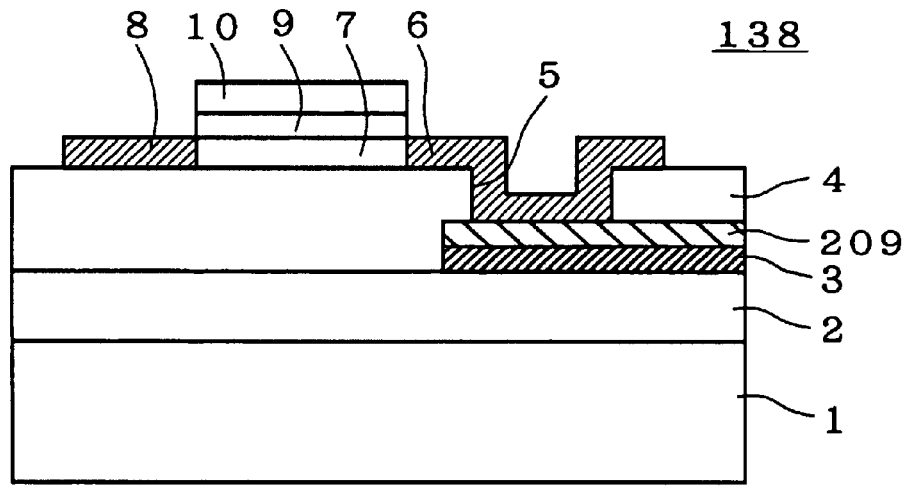
FIG. 64 is a sectional view for illustrating the structure of a modification of the embodiment 17 of the present invention.

In a TFT 138 shown in FIG. 64, for example, a TiN film 209 is formed on an upper portion of a pad layer 3, so that a drain 6 is connected with the TiN film 209.

<Embodiment 18>

In order to prevent N-type conversion of a drain caused by diffusion of phosphorus from an N-type pad layer, the plug may be so formed that its phosphorus concentration is not beyond a prescribed value.

In case of bringing a drain of a TFT into contact with a plug of N-type polysilicon, for example, N-type conversion of the drain can be prevented if the phosphorus concentration in the plug is set to be not more than $2\times10^{20}$ cm$^{-3}$ when the contact distance (the distance between the boundary between a channel and the drain and the plug in this example) is 0.1 µm.

Figure 65:
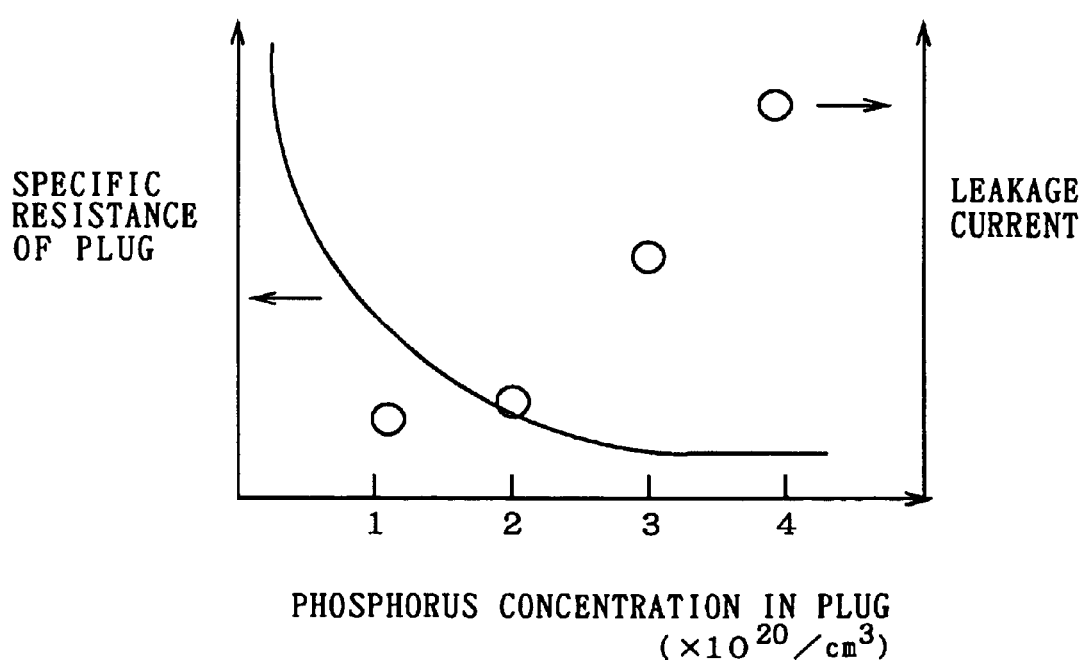
FIG. 65 illustrates a leakage current of a TFT and plug phosphorus concentration dependency of specific resistance of a plug.

The ground for this is described with reference to FIG. 65. Referring to FIG. 65, a leakage current of a TFT current is increased when the phosphorus concentration in a plug is in excess of $3\times10^{20}$ cm$^{-3}$, as plotted with white circles. Therefore, increase of the leakage current can be prevented by setting the phosphorus concentration in the plug not to exceed $3\times10^{20}$ cm$^{-3}$. Namely, N-type conversion of a drain can be prevented.

However, electric resistance of polysilicon is increased if the phosphorus concentration in the plug is reduced, as shown by a solid line in FIG. 65. In consideration of this, therefore, the plug may be formed so that the phosphorus concentration is within the range of $0.1\times10^{20}$ cm$^{-3}$ to $2\times10^{20}$ cm$^{-3}$.

This means that an impurity infiltration preventing structure or the like may be provided to suppress the phosphorus concentration in the plug within the aforementioned range also when the plug is made of P-type polysilicon and phosphorus diffused from a pad layer of N-type polysilicon infiltrates into the plug.

In case of a direct contact system TFT directly connecting its P-type drain to a pad layer of N-type polysilicon, on the other hand, the impurity concentration of the pad layer may be set to be not more than $2 \times 10^{20}$ cm$^{-3}$.

<Embodiment 19>

While the structure of introducing nitrogen into the drain for suppressing diffusion of phosphorus is described in relation to the above embodiment 3 of the present invention, diffusion of phosphorus may alternatively be suppressed by introducing nitrogen into a plug. Such a structure is now described with reference to FIGS. 66 and 67 illustrating fabrication steps.

Figure 66:
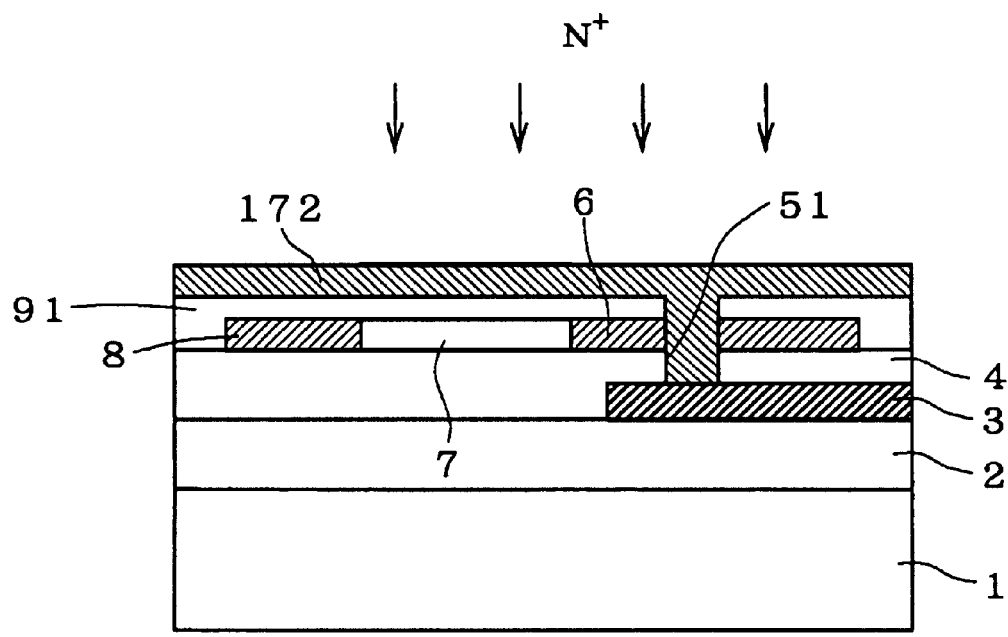
FIG. 66 illustrates a step of fabricating a semiconductor device according to an embodiment 19 of the present invention.
Figure 67:
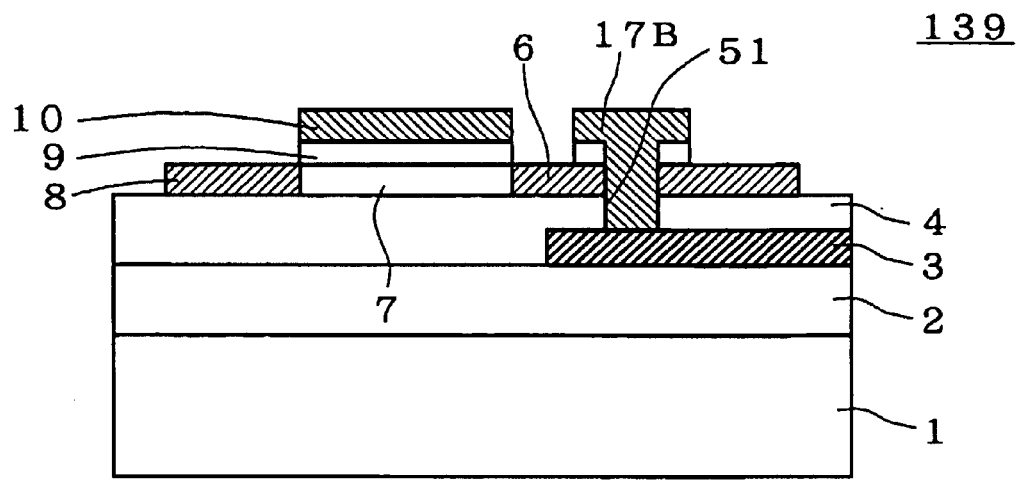
FIG. 67 illustrates a step of fabricating the semiconductor device according to the embodiment 19 of the present invention.
Figure 68:
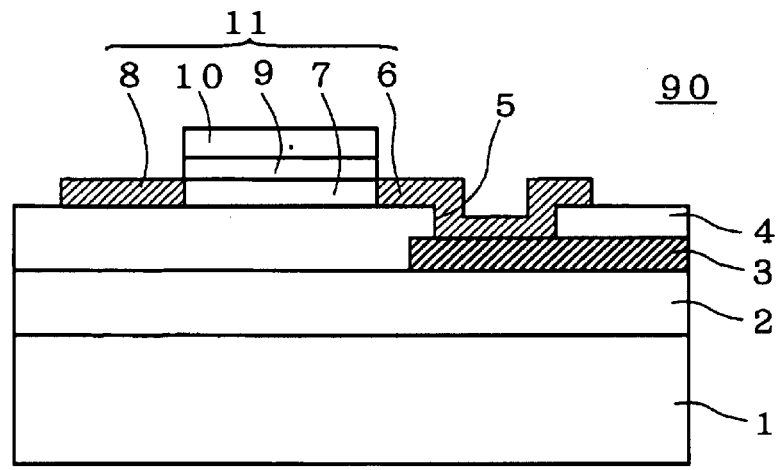
FIG. 68 illustrates a step of fabricating a conventional semiconductor device.
Figure 69:
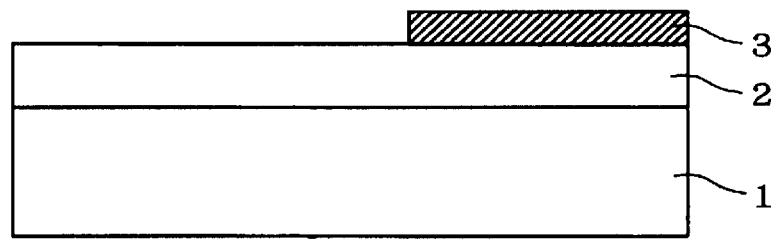
FIG. 69 illustrates a step of fabricating the conventional semiconductor device.
Figure 70:
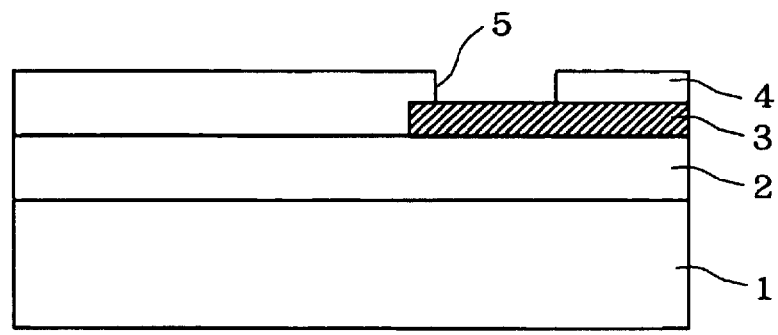
FIG. 70 illustrates a step of fabricating the conventional semiconductor device.
Figure 71:
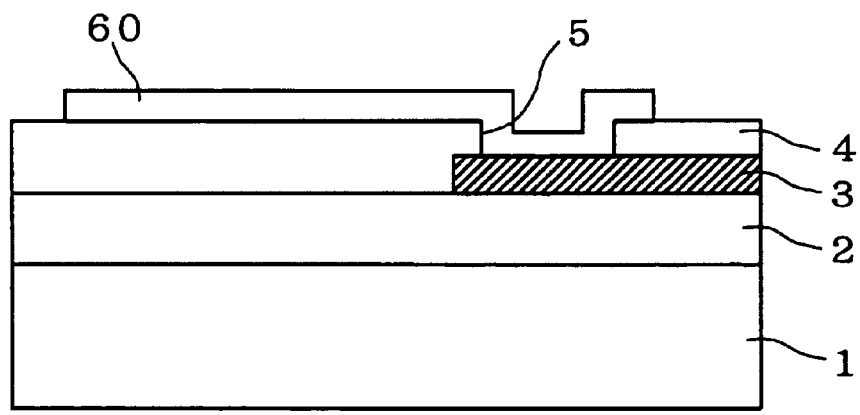
FIG. 71 illustrates a step of fabricating the conventional semiconductor device.
Figure 72:
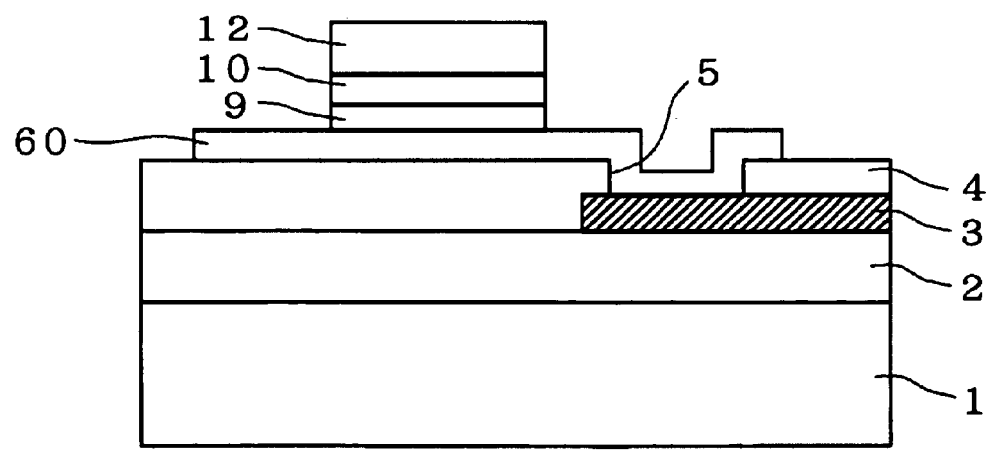
FIG. 72 illustrates a step of fabricating the conventional semiconductor device.
Figure 73:
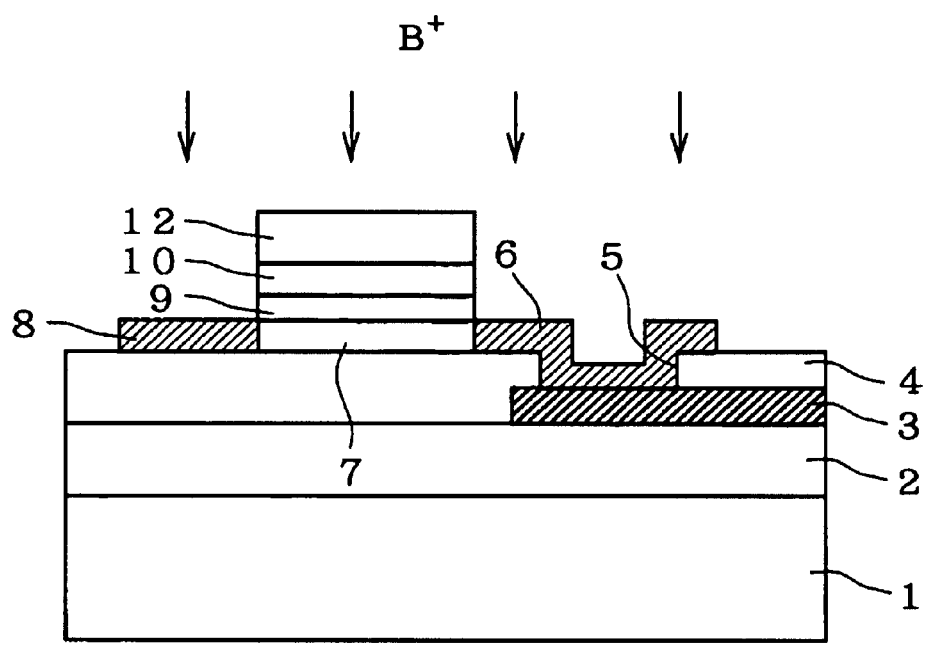
FIG. 73 illustrates a step of fabricating the conventional semiconductor device.
Figure 74:
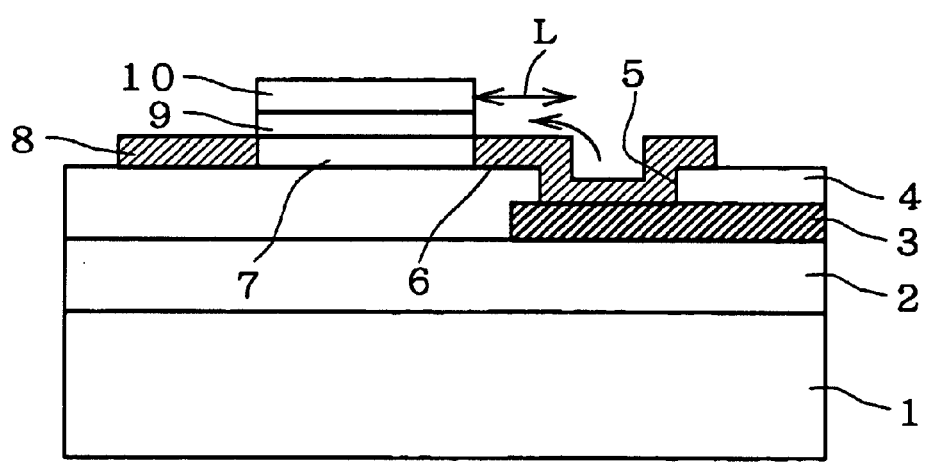
FIG. 74 illustrates an operation of phosphorus in the conventional semiconductor device.
Figure 75:
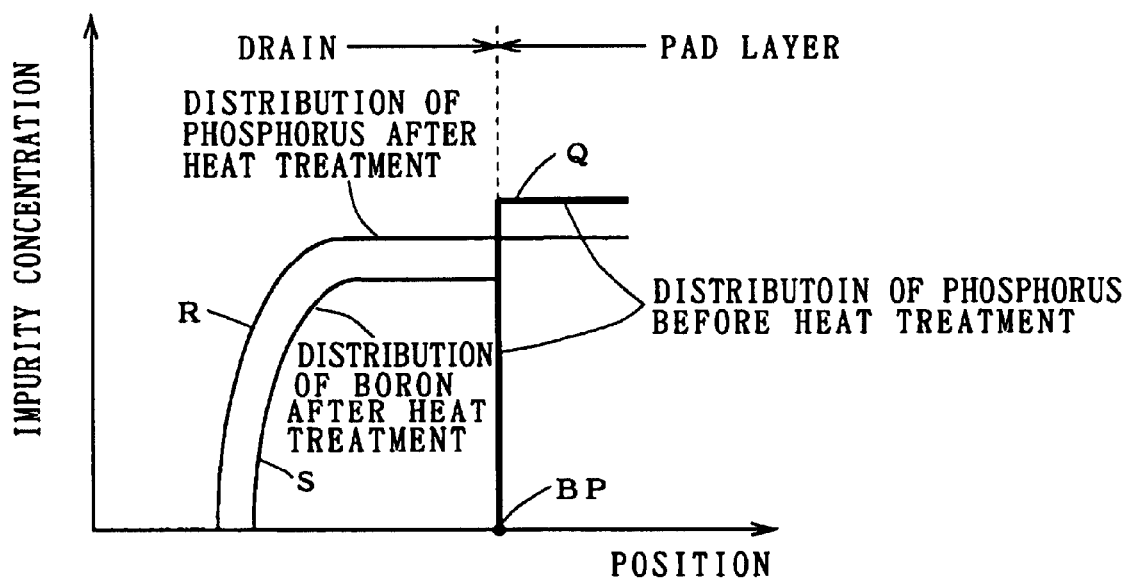
FIG. 75 illustrates impurity diffusion states by heat treatment.
Figure 76:
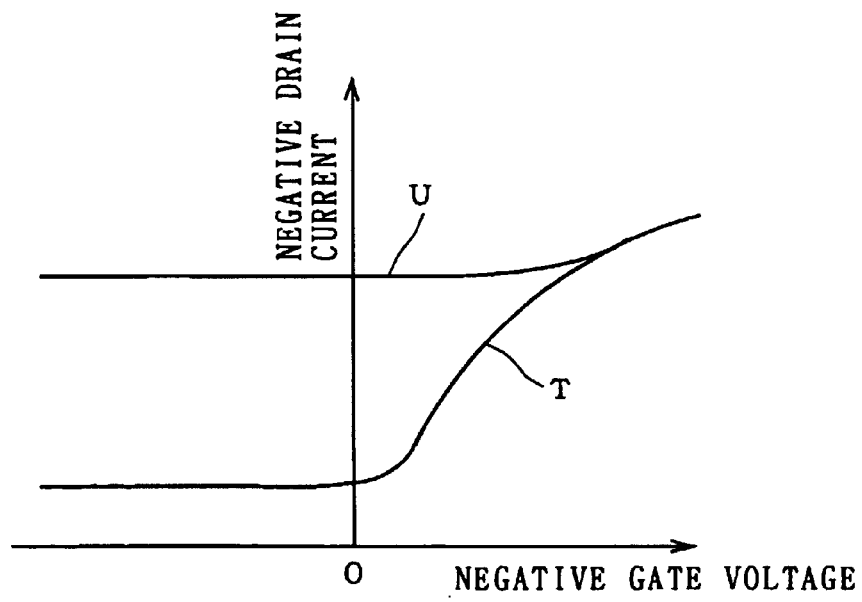
FIG. 76 illustrates leakage current characteristics of a TFT by diffusion of phosphorus.

Referring to FIG. 66, steps up to formation of a contact hole 51 reaching an upper surface of a pad layer 3 through a prescribed position of a second oxide film 4 are identical to those of the fabrication steps for the TFT 107 described with reference to FIG. 21.

In a step shown in FIG. 66, a phosphorus-added polysilicon film (N-type polysilicon film) 172 containing phosphorus is deposited on the overall surface of an oxide film 91 and in the contact hole 51 by CVD in a thickness of 100 nm, for example.

Then, nitrogen ions are implanted into the overall surface of the phosphorus-added polysilicon film 172 by ion implantation. This implantation is so performed that the nitrogen concentration in the phosphorus-added polysilicon film 172 is about $1 \times 10^{20}$ to $10 \times 10^{20}$ cm$^{-3}$. After the implantation, heat treatment is performed at a temperature of at least 700° C., for activating nitrogen.

Then, the phosphorus-added polysilicon film 172 and the oxide film 91 are worked into prescribed patterns by lithography, thereby forming a TFF 139 having a plug 17B of N-type polysilicon similarly to a gate 10, as shown in FIG. 67.

While the plug 17B is made of N-type polysilicon, impurity infiltration from the plug 17B to the exterior or vice versa is prevented due to the implantation of nitrogen, whereby N-type conversion of a drain 6 caused by diffusion of phosphorus from the N-type pad layer 3 can be prevented.

Further, the gate 10 and the plug 17B can be made of the same N-type polysilicon, whereby the number of steps of forming polysilicon films can be reduced and the steps can be simplified.

While impurity diffusion in polysilicon is performed through unbonded silicon in grain boundaries, it is conceivable that introduced nitrogen is bonded with such unbonded silicon for inactivating the same thereby suppressing the impurity diffusion.

The introduction of nitrogen into the phosphorus-added polysilicon film 172 is not restricted to the aforementioned ion implantation, but ammonia (NH$_3$) gas or the like may be added in formation of the phosphorus-added polysilicon film 172.

<Embodiment 20>

While the structure of preventing N-type conversion of the drain caused by diffusion of phosphorus from the pad layer is described in relation to each of the above embodiments 1 to 19 according to the present invention, such N-type conversion can also be prevented by employing indium in place of boron as an impurity forming the drain.

The mechanism of N-type conversion of the drain is closely related to infiltration of phosphorus from the pad layer and reduction of concentration caused by diffusion of the P-type impurity in the drain. Namely, compensation by phosphorus can be prevented even in infiltration of phosphorus, if the concentration of a P-type impurity is sufficiently high. Indium has a diffusion coefficient of about $\frac{1}{10}$ as compared with boron in silicon, and hence indium is inhibited from being diffused by heat treatment in a later step and reducing the impurity concentration, thereby preventing N-type conversion resulting from compensation by phosphorus.

Since the aforementioned N-type conversion is caused by diffusion of phosphorus from the pad layer, such diffusion can be suppressed by employing As(arsenic) or Sb(antimony) having a smaller diffusion coefficient than phosphorus as the impurity for forming the pad layer, whereby N-type conversion of the drain can be prevented.

While the TFT having a top-gate structure forming the gate on the channel has been described with reference to each of the above embodiments 1 to 19 of the present invention, similar effects can be attained in a bottom gate type TFT having a gate which is formed under a channel, a double gate type TFT having gates which are formed on and under a channel respectively, and a gate all-around type TFT having a gate which is formed to enclose a channel.

Further, a similar effect can also be attained when not only diffusion of phosphorus from a pad layer but that from an impurity diffusion layer on a silicon substrate comes into question.

While the invention has been shown and described in detail, the foregoing description is in all aspects illustrative and not restrictive. It is therefore understood that numerous modifications and variations can be devised without departing from the scope of the invention.

We claim:

1. A thin-film transistor comprising:
   a first polycrystalline semiconductor layer having one of source and drain regions of a first conductivity type being formed on an insulating film and defining a channel region;
   a second conductivity type second polycrystalline semiconductor layer being formed in said insulating film to be electrically connected with said first polycrystalline semiconductor layer; and
   a conductivity type alteration preventing structure formed within said second polycrystalline semiconductor layer for preventing alteration of said conductivity type from said second polycrystalline semiconductor layer into said first polycrystalline semiconductor layer resulting from infiltration of a second conductivity type impurity.

2. The thin-film transistor in accordance with claim 1, wherein
   said first and second polycrystalline semiconductor layers are directly connected with each other through an opening being formed in said insulating film, and
   said conductivity type alteration preventing structure is:
   a first conductivity type semiconductor region being formed by implanting ions of a first conductivity type impurity into a portion of said second polycrystalline semiconductor layer being connected with said first polycrystalline semiconductor layer through said opening in advance of formation of said first polycrystalline semiconductor layer.

3. The thin-film transistor of claim 1, wherein said one of source and drain of said first polycrystalline semiconductor layer define an intrinsic channel region.

4. A thin-film transistor including:
   a first polycrystalline semiconductor layer having one of source and drain regions of a first conductivity type being formed on an insulating film and defining a channel region;

a second conductivity type second polycrystalline semiconductor layer being formed in said insulating film to be electrically connected with said first polycrystalline semiconductor layer; and an impurity infiltration preventing structure formed within said second polycrystalline semiconductor layer for preventing infiltration of a second conductivity type impurity from said second polycrystalline semiconductor layer into said first polycrystalline semiconductor layer, wherein said impurity infiltration preventing structure is a sink layer for absorbing said second conductivity type impurity, and said sink layer is a tungsten silicide layer formed on said second polycrystalline semiconductor layer.

5. The thin-film transistor in accordance with claim 4, further comprising a second conductivity type third polycrystalline semiconductor layer being formed on said tungsten silicide layer.

6. The thin-film transistor in accordance with claim 4, further comprising a first conductivity type third polycrystalline semiconductor layer being formed on said tungsten silicide layer.

7. The thin-film transistor of claim 4, wherein said one of source and drain of said first polycrystalline semiconductor layer define an intrinsic channel region.

8. A semiconductor device, comprising:

a semiconductor layer;

an element formed on an upper portion of said semiconductor layer;

a first insulating film covering said element;

a first plug being provided in a first contact hole formed in said first insulating film, and being electrically connected to said element;

a second insulating film covering said first insulating film and said first plug;

a second plug being provided in a second contact hole formed in said second insulating film, and having only a portion thereof connected to only a portion of said first plug; and a conductive layer connected to said second plug, wherein said element, includes, a pair of source/drain regions, and a gate electrode being opposed to a region placed between said pair of source/drain regions with a gate insulating film interposed between said gate electrode and said region, wherein said first plug is connected to either one of said pair of source/drain regions and said first plug includes polysilicon having an impurity of a same conductivity as that of said pair of source/drain regions.

* * * * *